(12) United States Patent
Kurokawa

(10) Patent No.: US 9,716,852 B2
(45) Date of Patent: Jul. 25, 2017

(54) BROADCAST SYSTEM

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/083,716

(22) Filed: Mar. 29, 2016

(65) Prior Publication Data

US 2016/0295152 A1    Oct. 6, 2016

(30) Foreign Application Priority Data

Apr. 3, 2015   (JP) ................................ 2015-076627

(51) Int. Cl.
*H04N 5/38*   (2006.01)
*H04N 5/44*   (2011.01)
(Continued)

(52) U.S. Cl.
CPC ............... *H04N 5/38* (2013.01); *H01L 21/00* (2013.01); *H01L 27/1464* (2013.01);
(Continued)

(58) Field of Classification Search
CPC .. H04N 5/38; H04N 5/44; H04N 3/20; H04N 9/64; H01L 27/148; H01L 21/26506; H01L 21/76254
(Continued)

(56) References Cited

U.S. PATENT DOCUMENTS 4,562,435 A * 12/1985 McDonough ............ G09G 5/39
                                                345/545
5,093,722 A *  3/1992 Miyaguchi ............. H04N 5/144
                                                348/441
(Continued)

FOREIGN PATENT DOCUMENTS

EP    1737044 A    12/2006
EP    2226847 A     9/2010
(Continued)

OTHER PUBLICATIONS

Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.
(Continued)

*Primary Examiner* — Trang U Tran
(74) *Attorney, Agent, or Firm* — Eric J. Robinson; Robinson Intellectual Property Law Office, P.C.

(57) ABSTRACT

A transmitter device is provided. The transmitter device includes first to m-th memory cells (m is an integer of 2 or more), first to m-th word lines, a first bit line, and an analog circuit. The i-th word line (i is an integer greater than or equal to 1 and less than or equal to m) is electrically connected to the i-th memory cell. The first to m-th memory cells are electrically connected to the analog circuit through the first bit line. The first to m-th memory cells are capable of retaining a potential corresponding to first data. The first to m-th word lines are supplied with a potential corresponding to second data. The analog circuit is capable of performing a multiply-accumulate operation on the first data and the second data, and the first data or the second data includes image data.

7 Claims, 36 Drawing Sheets

(51) Int. Cl.
*H01L 21/00* (2006.01)
*H04N 21/426* (2011.01)
*H01L 27/146* (2006.01)

(52) U.S. Cl.
CPC ......... *H01L 27/14621* (2013.01); *H04N 5/44* (2013.01); *H04N 21/426* (2013.01)

(58) Field of Classification Search
USPC ..... 348/723, 725, 726, 79; 257/773, 74, 300
See application file for complete search history.

(56) References Cited

U.S. PATENT DOCUMENTS

| | | | |
|---|---|---|---|
| 5,101,255 A | 3/1992 | Ishioka et al. | |
| 5,115,413 A * | 5/1992 | Sato | G11C 7/1075 365/189.04 |
| 5,438,376 A * | 8/1995 | Watanabe | H04N 5/44 345/537 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,154,778 B2 * | 12/2006 | Forbes | B82Y 10/00 257/300 |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,294,159 B2 * | 10/2012 | Or-Bach | H01L 21/76254 257/74 |
| 8,378,391 B2 | 2/2013 | Koyama et al. | |
| 8,378,494 B2 * | 2/2013 | Or-Bach | H01L 21/26506 257/773 |
| 8,916,869 B2 | 12/2014 | Koyama et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0091191 A1 | 4/2007 | Oike | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0280028 A1 * | 12/2007 | Kurokawa | G11C 5/02 365/230.03 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0290071 A1 * | 11/2009 | Feng | G09G 5/006 348/725 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101351 A1 | 5/2011 | Yamazaki | |
| 2011/0198484 A1 | 8/2011 | Kurokawa | |
| 2012/0001286 A1 | 1/2012 | Yoon | |
| 2012/0120293 A1 | 5/2012 | Mabuchi | |
| 2013/0056619 A1 | 3/2013 | Shinohara | |
| 2013/0088646 A1 * | 4/2013 | Anandakumar | H04L 65/607 348/726 |
| 2015/0048366 A1 | 2/2015 | Koyama et al. | |
| 2016/0172410 A1 | 6/2016 | Kurokawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| JP | 2003-086000 A | 3/2003 |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-171702 A | 9/2011 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,$YbFe_2O_4$, and $Yb_2Fe_3O_7$ Types of Structures for Compounds in the $In_2O_3$ and $Sc_2O_3$-$A_2O_3$-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)m$ (m <4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Kotera,N et al., "Constant-Current Circuit-Biasing Technology for GaAs FET ICs", IEEE Journal of Solid-State Circuits, 1995, vol. 30, No. 1, pp. 61-64.

* cited by examiner

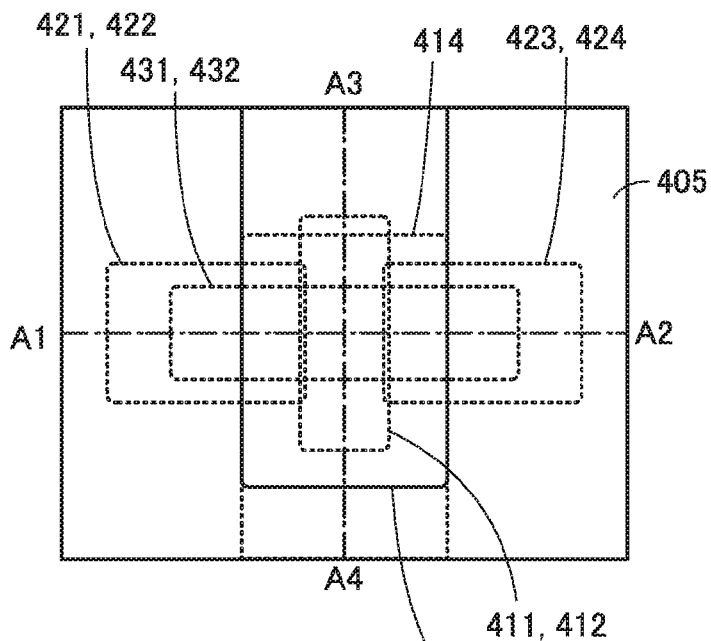
FIG. 14A
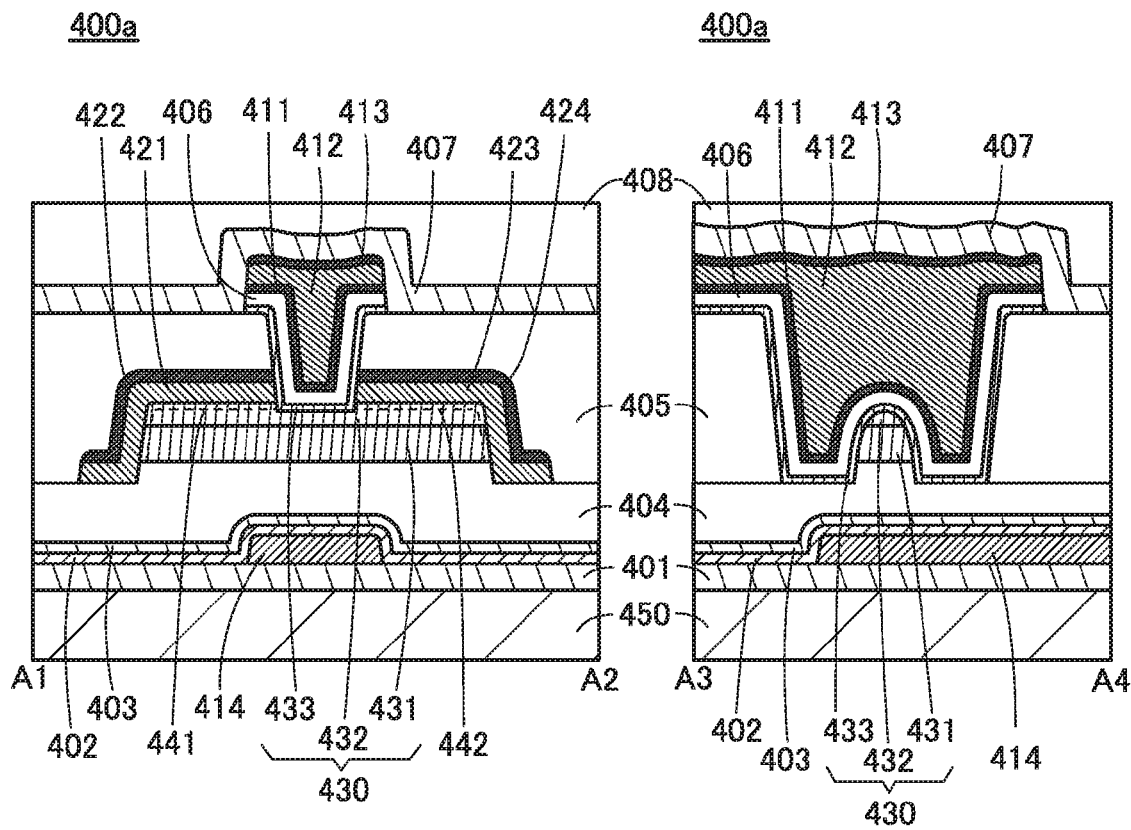
FIG. 14B
FIG. 14C

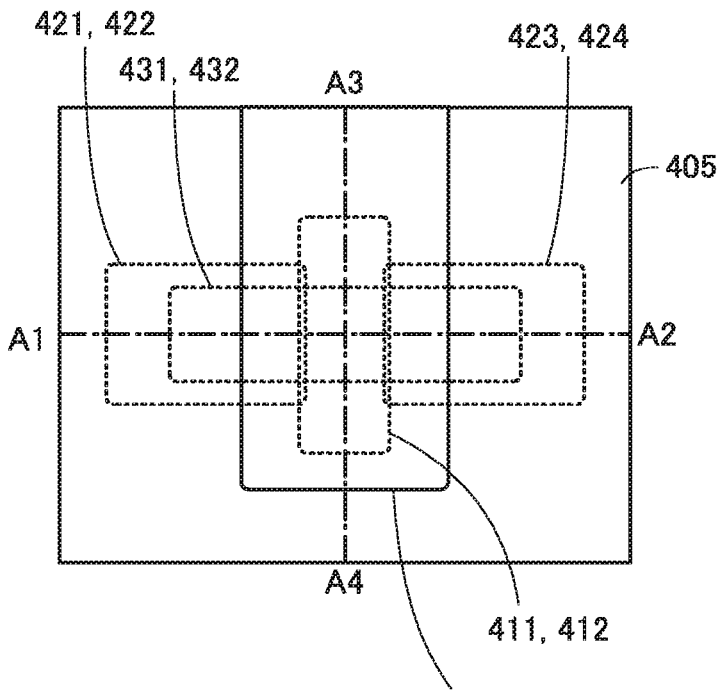
FIG. 17A
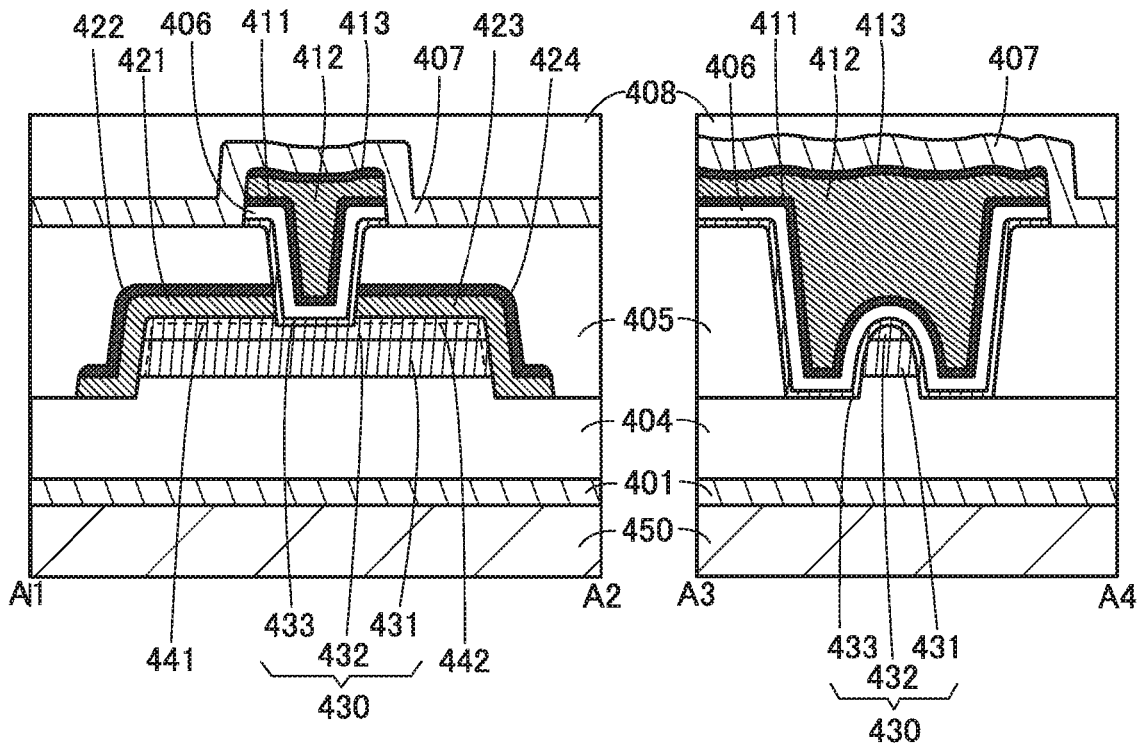
FIG. 17B
FIG. 17C

480

480

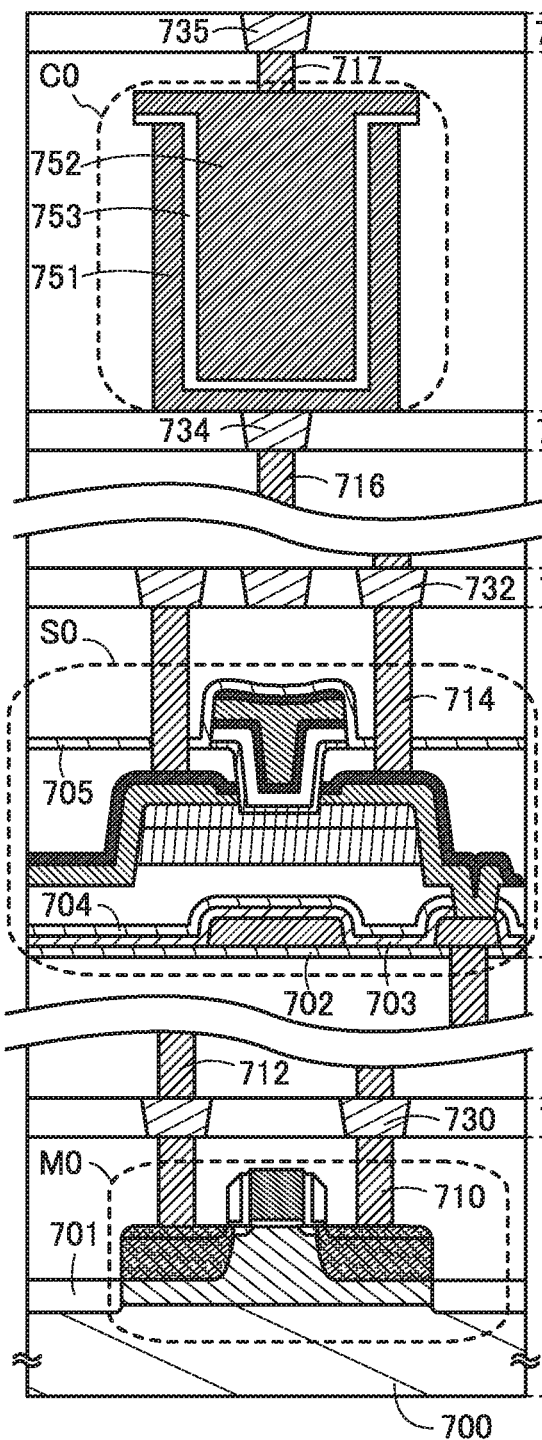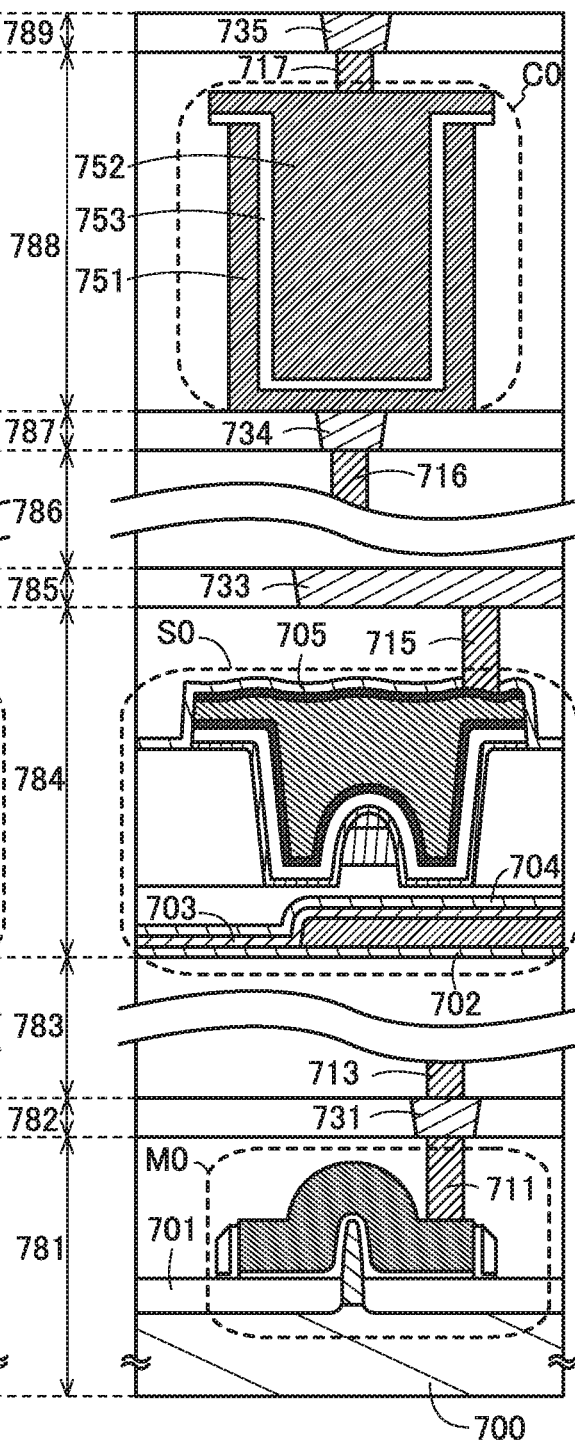

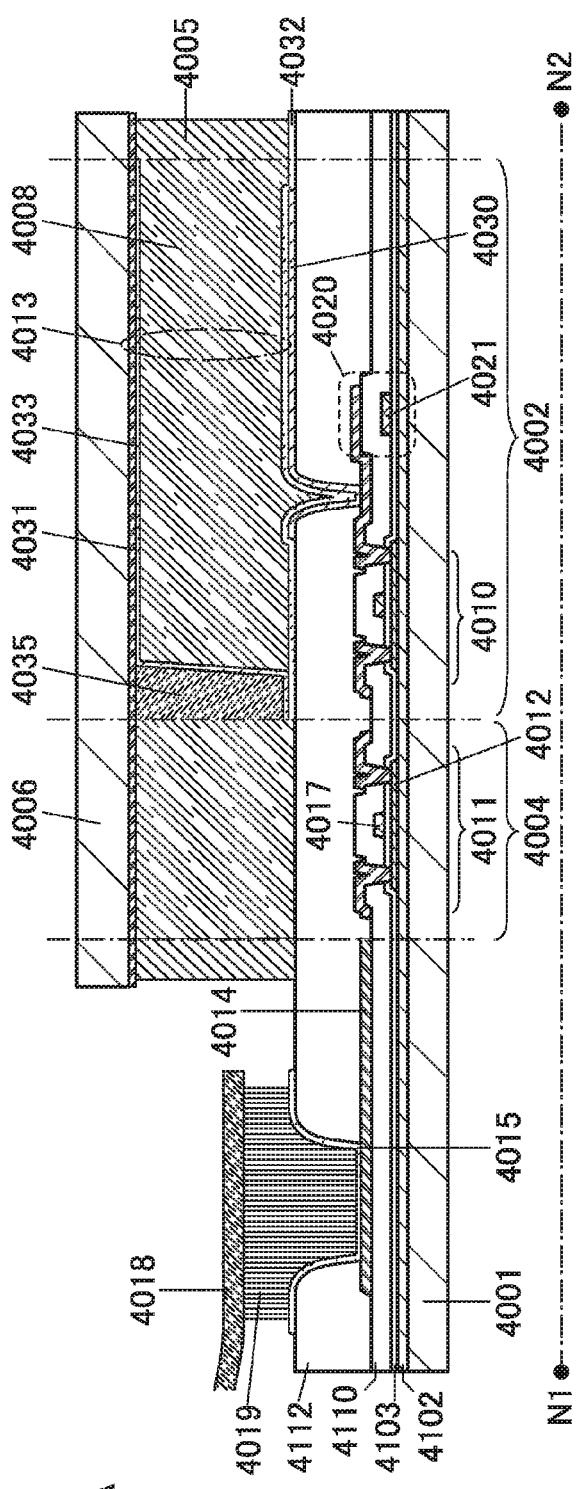
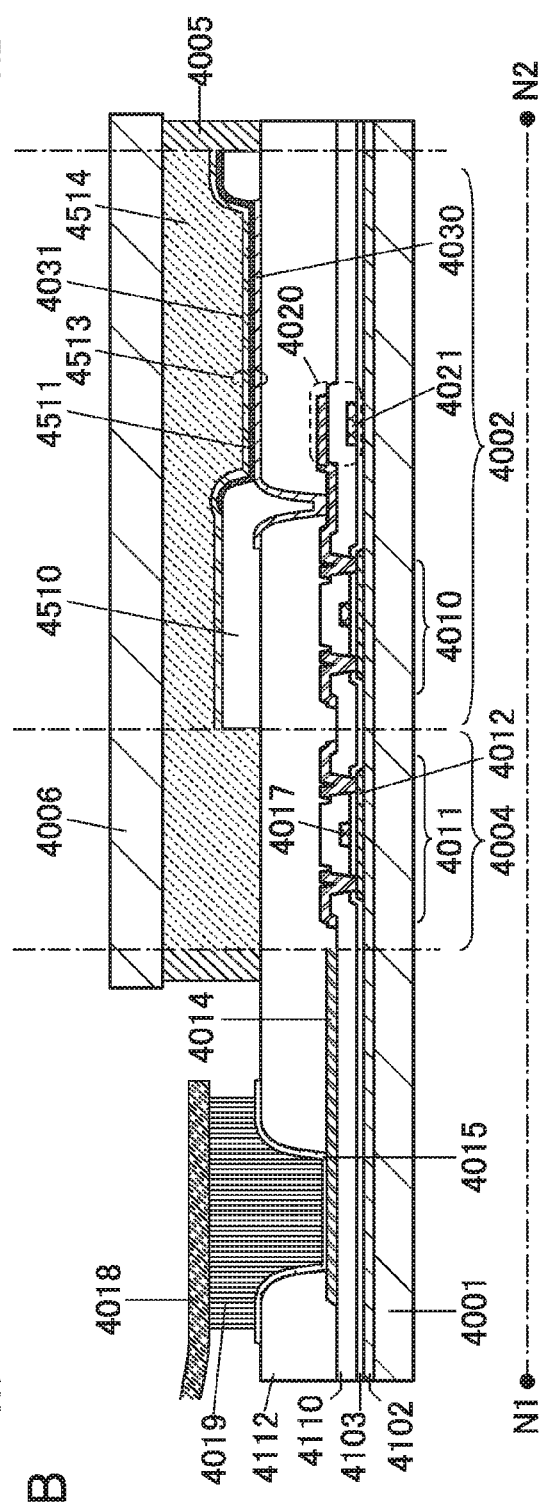
FIG. 34A
FIG. 34B

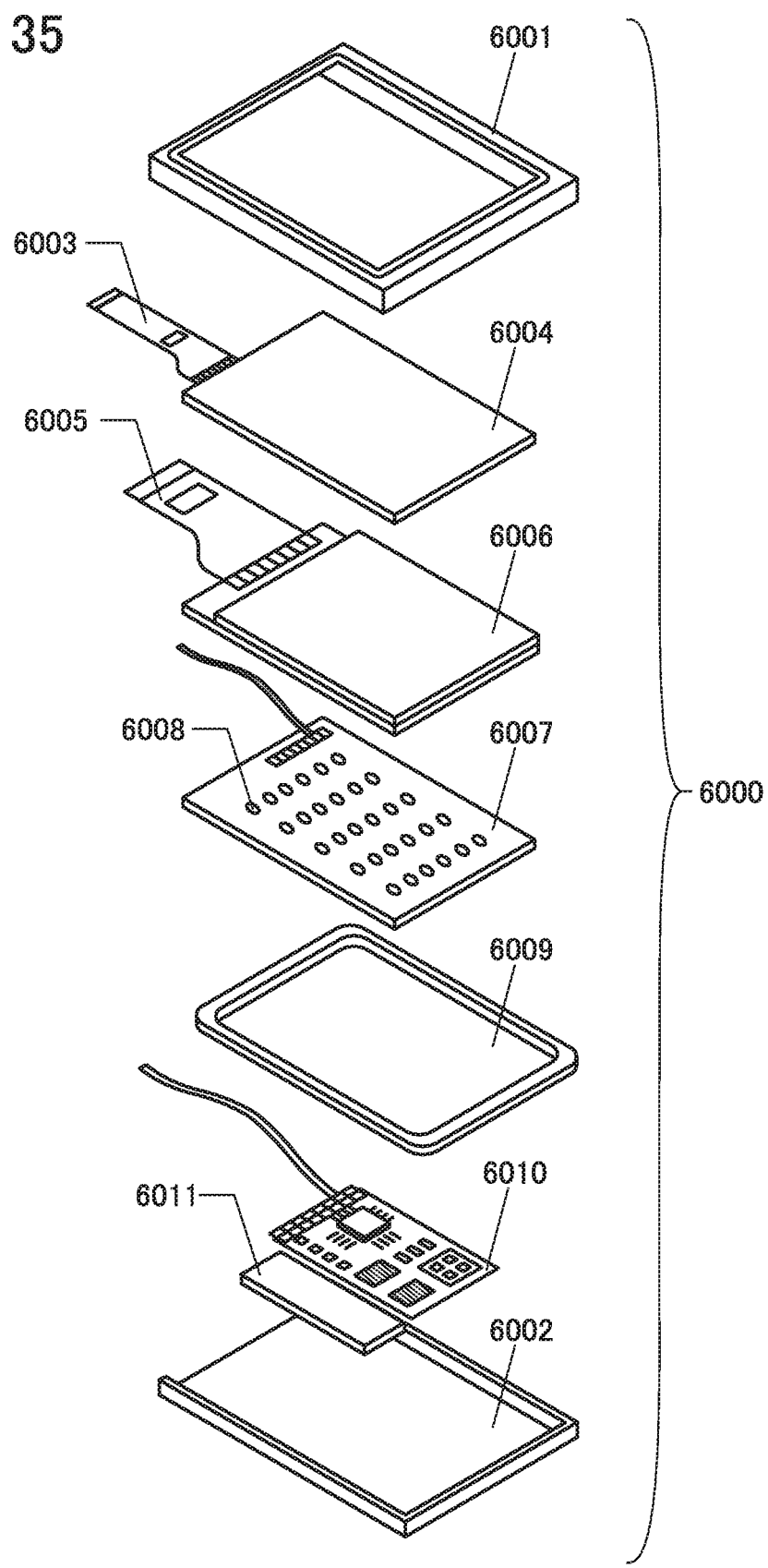

BROADCAST SYSTEM

BACKGROUND OF THE INVENTION

1. Field of the Invention

One embodiment of the present invention relates to a transmitter device, a receiver device, or a broadcast system.

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

Increases in the resolution and the number of pixels of a display device have been demanded; for example, an 8K ultra high definition television (UHD TV) with 7680 horizontal pixels by 4320 vertical pixels has been suggested. As the number of pixels of a display device increases, the amount of display image data increases; this requires a significant increase in data transmission speed for broadcast communication.

A technique by which a transistor is formed using a semiconductor thin film formed over a substrate having an insulating surface has been attracting attention. The transistor is used in a wide range of electronic devices such as an integrated circuit (IC) or a display device. A silicon-based semiconductor is widely known as a semiconductor material that can be applied to the transistor, but an oxide semiconductor (OS) has been attracting attention as an alternative material.

For example, a technique for manufacturing a transistor using zinc oxide or an In—Ga—Zn-based oxide semiconductor as an oxide semiconductor is disclosed (see Patent Documents 1 and 2).

It is known that a transistor including an oxide semiconductor film (such a transistor is hereinafter referred to as an OS transistor) has an extremely low off-state current. Patent Document 3 discloses a technique in which a memory device is formed by using such off-state current characteristics.

REFERENCES

[Patent Document 1] Japanese Published Patent Application No. 2007-123861
[Patent Document 2] Japanese Published Patent Application No. 2007-96055
[Patent Document 3] Japanese Published Patent Application No. 2011-171702

SUMMARY OF THE INVENTION

Image data transmission and reception need image data compressing and decompressing processes to reduce the amount of data communication. With an increase in volume of image data, a transmitter device and a receiver device which perform these processes are demanded to perform very large-scale arithmetic processing in a short time.

An object of one embodiment of the present invention is to provide a transmitter device or a receiver device capable of performing high-speed arithmetic processing. An object of one embodiment of the present invention is to provide a transmitter device or a receiver device capable of operating with low power consumption.

An object of one embodiment of the present invention is to provide a broadcast system capable of performing high-speed arithmetic processing. An object of one embodiment of the present invention is to provide a broadcast system capable of operating with low power consumption.

Another object of one embodiment of the present invention is to provide a novel semiconductor device. Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects could be an object of one embodiment of the present invention.

One embodiment of the present invention is a transmitter device which includes first to m-th memory cells (m is an integer of 2 or more), first to m-th word lines, a first bit line, and an analog circuit. The i-th word line (i is an integer greater than or equal to 1 and less than or equal to m) is electrically connected to the i-th memory cell. The first to m-th memory cells are electrically connected to the analog circuit through the first bit line. The first to m-th memory cells have a function of retaining a potential corresponding to first data. The first to m-th word lines are supplied with a potential corresponding to second data. The analog circuit has a function of performing a multiply-accumulate operation on the first data and the second data. The first data or the second data includes image data.

The transmitter device may further include (m+1)-th to (m+m)-th memory cells and a second bit line. The analog circuit may further include a first circuit and a second circuit. The (m+i)-th memory cell is electrically connected to the i-th word line. The first circuit is electrically connected to the first bit line. The second circuit is electrically connected to the (m+1)-th to (m+m)-th memory cells through the second bit line. The first circuit is electrically connected to the second circuit through a current mirror circuit.

The transmitter device may further include a third bit line. The i-th memory cell may include a capacitor, a first transistor, and a second transistor. A first terminal of the capacitor is electrically connected to a gate of the first transistor. A second terminal of the capacitor is electrically connected to the i-th word line. The third bit line is electrically connected to the gate of the first transistor through the second transistor. One of a source and a drain of the first transistor is electrically connected to the first bit line. The second transistor includes an oxide semiconductor in a channel formation region.

One embodiment of the present invention is a receiver device which includes first to m-th memory cells (m is an integer of 2 or more), first to m-th word lines, a first bit line, and an analog circuit. The i-th word line (i is an integer greater than or equal to 1 and less than or equal to m) is electrically connected to the i-th memory cell. The first to m-th memory cells are electrically connected to the analog circuit through the first bit line. The first to m-th memory cells have a function of retaining a potential corresponding to first data. The first to m-th word lines are supplied with a potential corresponding to second data. The analog circuit has a function of performing a multiply-accumulate operation on the first data and the second data. The first data or the second data includes image data.

The receiver device may further include (m+1)-th to (m+m)-th memory cells and a second bit line. The analog circuit may include a first circuit and a second circuit. The (m+i)-th memory cell is electrically connected to the i-th word line. The first circuit is electrically connected to the first bit line. The second circuit is electrically connected to the (m+1)-th to (m+m)-th memory cells through the second bit line. The first circuit is electrically connected to the second circuit through a current mirror circuit.

The receiver device may further include a third write bit line. The i-th memory cell may include a capacitor, a first transistor, and a second transistor. A first terminal of the capacitor is electrically connected to a gate of the first transistor. A second terminal of the capacitor is electrically connected to the i-th word line. The third bit line is electrically connected to the gate of the first transistor through the second transistor. One of a source and a drain of the first transistor is electrically connected to the first bit line. The second transistor includes an oxide semiconductor in a channel formation region.

One embodiment of the present invention is an electronic device which includes the receiver device described in the above embodiment and at least one of a microphone, a speaker, a display portion, and an operation key.

One embodiment of the present invention is a broadcast system which includes a camera, the transmitter device described in the above embodiment, the receiver device described in the above embodiment, and a display device. The camera generates imaging data. The transmitter device generates transmission data by compressing the imaging data. The receiver device generates video data by decompressing the transmission data. The display device displays the video data.

One embodiment of the present invention provides a transmitter device or a receiver device capable of performing high-speed arithmetic processing. One embodiment of the present invention provides a transmitter device or a receiver device capable of operating with low power consumption.

One embodiment of the present invention provides a broadcast system capable of performing high-speed arithmetic processing. One embodiment of the present invention provides a broadcast system capable of operating with low power consumption.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIGS. 14A to 14C are a top view and cross-sectional views illustrating a structural example of a transistor.
FIGS. 17A to 17C are a top view and cross-sectional views illustrating a structural example of a transistor.
FIGS. 22A and 22B are cross-sectional views illustrating a structural example of a semiconductor device.
FIGS. 34A and 34B are cross-sectional views each illustrating an example of a display device.
FIG. 35 illustrates an example of a display module.

DETAILED DESCRIPTION OF THE INVENTION

Figure 1:
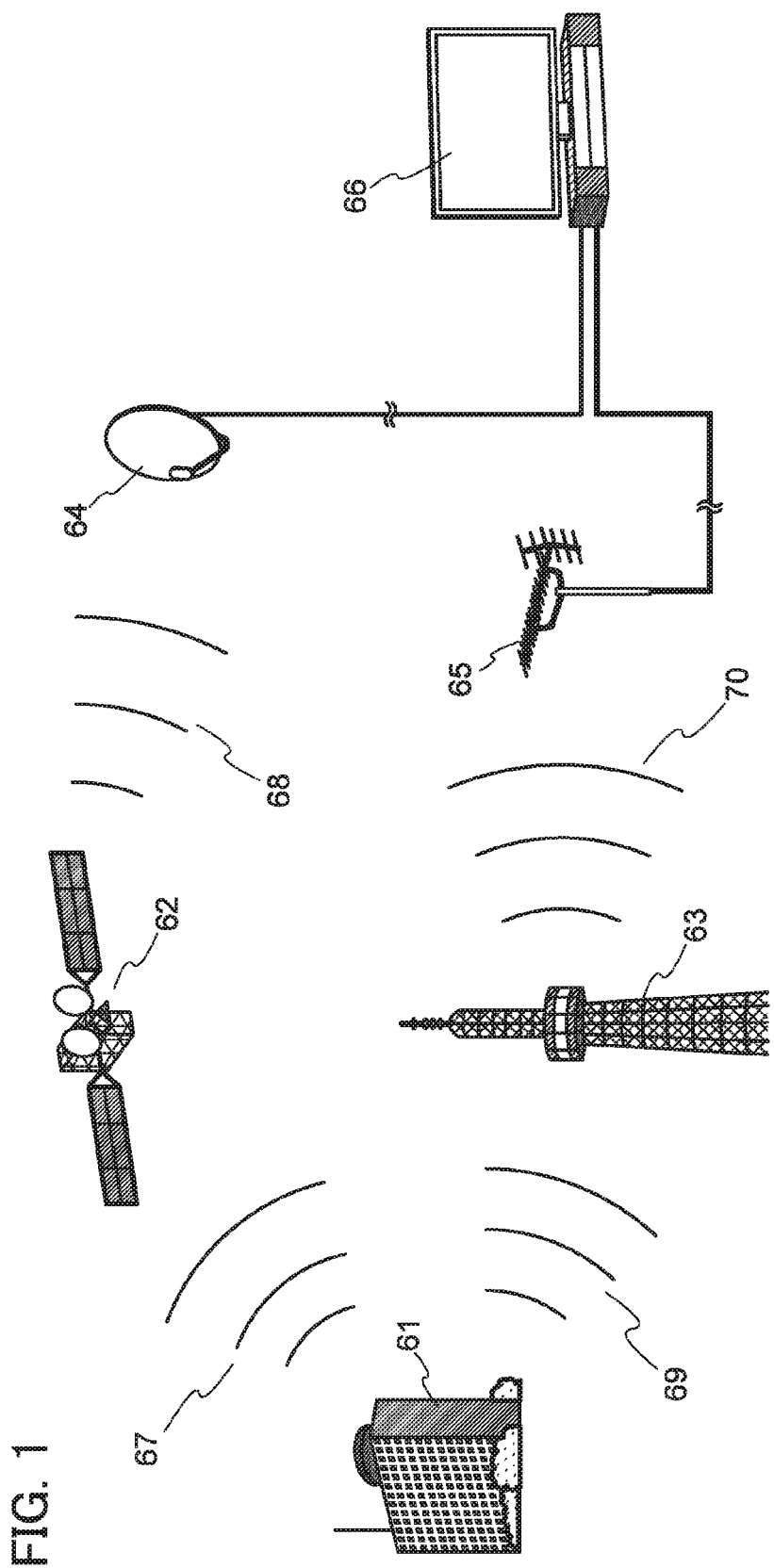
FIG. 1 illustrates an example of a broadcast system.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.

Furthermore, in the present specification, any of the embodiments and the examples below can be combined as appropriate. In the case where some structural examples are given in one embodiment or example, any of the structure examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Unless otherwise specified, an on-state current in this specification refers to a drain current of a transistor in the on state. Unless otherwise specified, the on state of an n-channel transistor means that the voltage difference between its gate and source ($V_{gs}$) is higher than or equal to the threshold voltage ($V_{th}$), and the on state of a p-channel transistor means that $V_{gs}$ is lower than or equal to $V_{th}$. For example, the on-state current of an n-channel transistor sometimes refers to a drain current that flows when $V_{gs}$ is higher than or equal to $V_{th}$. The on-state current of a transistor depends on voltage ($V_{ds}$) between its drain and source in some cases.

Unless otherwise specified, the off-state current in this specification refers to a drain current of a transistor in the off state. Unless otherwise specified, the off state of an n-channel transistor means that $V_{gs}$ is lower than $V_{th}$, and the off state of a p-channel transistor means that $V_{gs}$ is higher than $V_{th}$. For example, the off-state current of an n-channel transistor sometimes refers to a drain current that flows when $V_{gs}$ is lower than $V_{th}$. The off-state current of a transistor depends on $V_{gs}$ in some cases. Thus, "the off-state current of a transistor is lower than $10^{-21}$ A" may mean there is $V_{gs}$ at which the off-state current of the transistor is lower than $10^{-21}$ A.

The off-state current of a transistor depends on $V_{ds}$ in some cases. Unless otherwise specified, the off-state current in this specification may be an off-state current at $V_{ds}$ whose absolute value is 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ used in a semiconductor device or the like including the transistor. In this specification, a high power supply voltage is referred to as an H level (or $V_{DD}$), and a low power supply voltage is referred to as an L level (or GND), in some cases.

(Embodiment 1)
<<Broadcast System>>

FIG. 1 illustrates a schematic diagram of a broadcast system which is one embodiment of the present invention. FIG. 1 illustrates paths through which electric waves transmitted from a broadcasting station 61 are delivered to a television set 66 at home. Electric waves 67 and 68 represent electric waves for satellite broadcasting, which are delivered to the television set 66 through an artificial satellite 62 and an antenna 64. Electric waves 69 and 70 represent electric waves for terrestrial broadcasting, which are delivered to the television set 66 through a radio tower 63 and an antenna 65.

Examples of the artificial satellite 62 include a communications satellite (CS) and a broadcasting satellite (BS). Examples of the antenna 64 include a BS/110-degree CS antenna and a CS antenna. Examples of the antenna 65 include an ultra-high frequency (UHF) antenna.

Figure 2A:
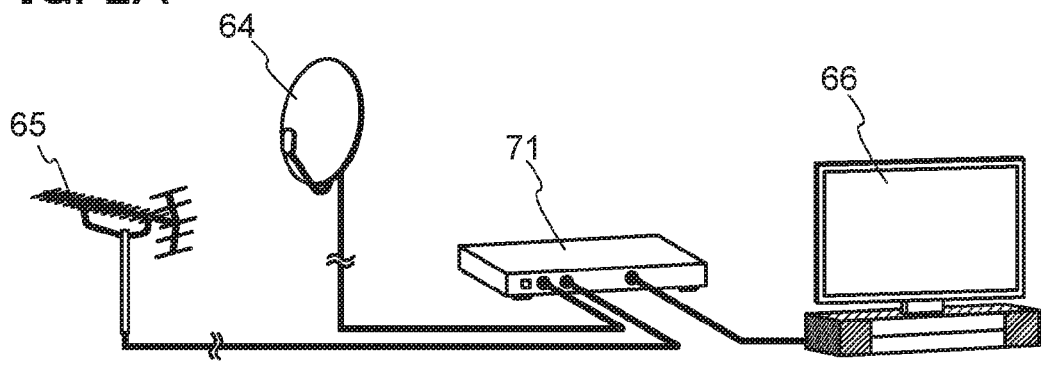
FIGS. 2A to 2D each illustrate an example of a receiver device.
Figure 2B:
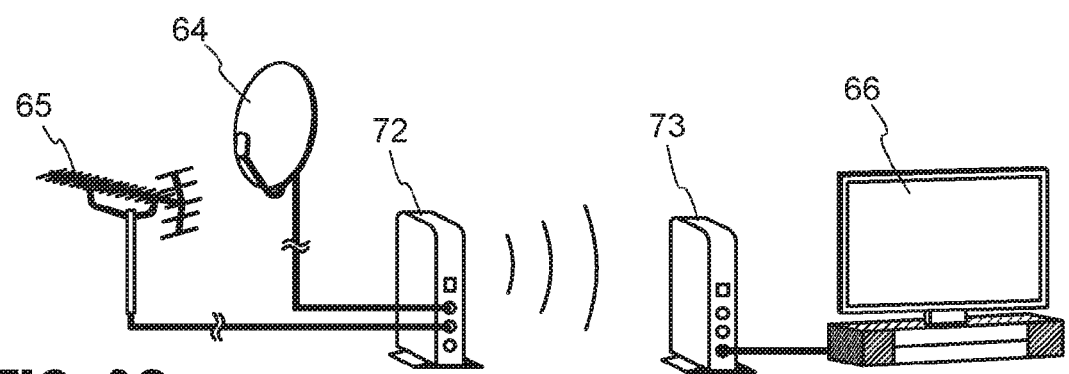
Figure 2C:
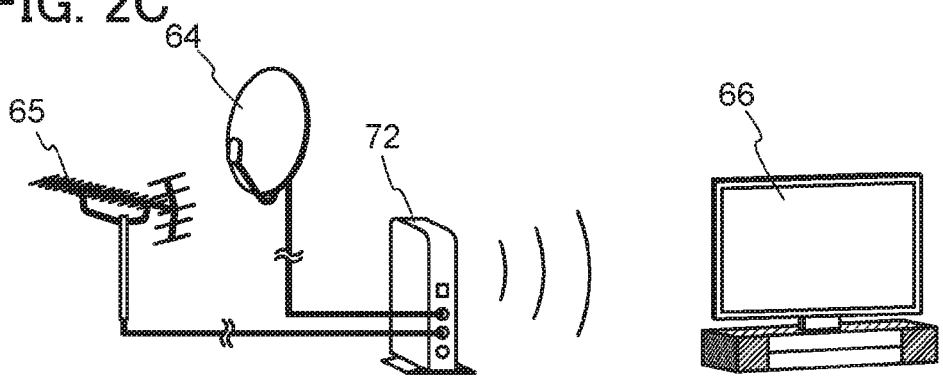

A receiver device (a tuner) for demodulating electric waves is preferably provided between the television set 66 and the antennas 64 and 65. FIG. 1 illustrates an example in which the television set 66 incorporates a receiver device. Alternatively, a receiver device 71 may be provided outside the television set 66 as illustrated in FIG. 2A. Further alternatively, the antennas 64 and 65 and the television set 66 may exchange data via wireless communication devices 72 and 73 as illustrated in FIG. 2B. In that case, the wireless communication device 72 or 73 also functions as a receiver device. Still further alternatively, the television set 66 may incorporate the wireless communication device 73 as illustrated in FIG. 2C.

Figure 2D:
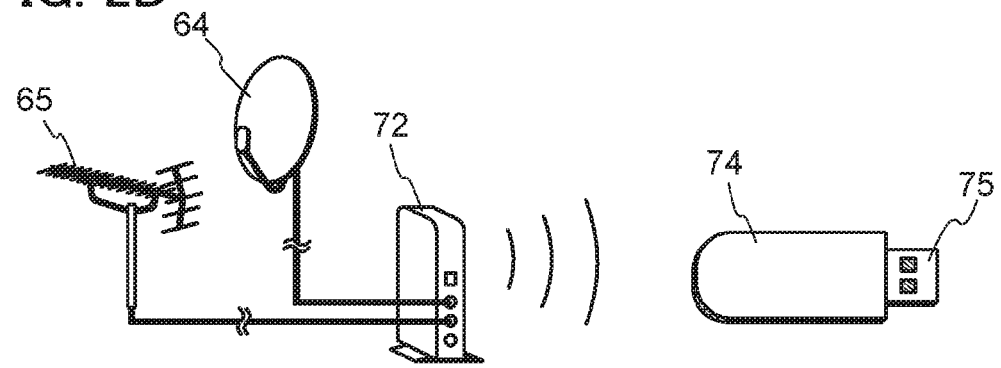

The receiver device may be in the form of a stick, like a receiver device 74 illustrated in FIG. 2D. The receiver device 74 has a connector portion 75. The receiver device 74 is preferable for its high portability. By inserting the connector portion 75 into a device including a display portion (such as a personal computer, a cellular phone, or a tablet terminal), the device can be made to be capable of receiving satellite broadcasting or terrestrial broadcasting.

Figure 3:
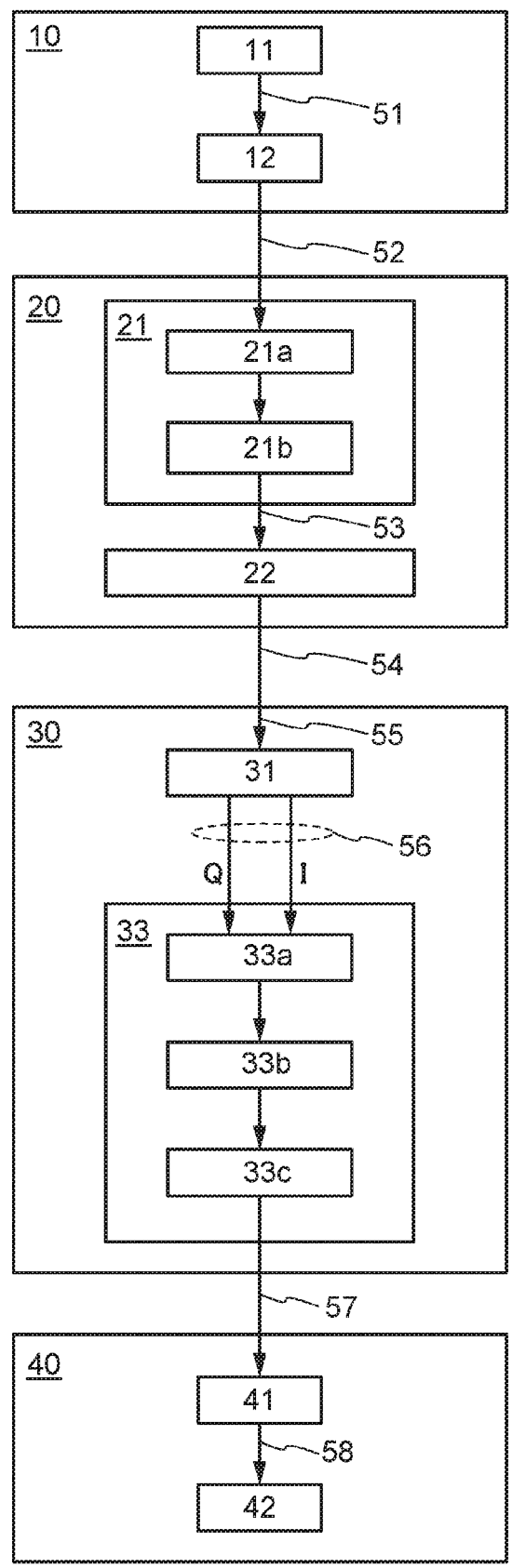
FIG. 3 is a flow chart illustrating a concept of a broadcast system.

Next, the flow of data in a broadcast system which is one embodiment of the present invention will be described with reference to FIG. 3. FIG. 3 illustrates a camera 10 including an imaging element 11 and an image processing device 12, a transmitter device 20 including an encoder 21 and a modulator 22, a receiver device 30 including a demodulator 31 and a decoder 33, and a display device 40 including an image processing device 41 and a display element 42. The flow of data will be described below step by step.

First, in the camera 10, the imaging element 11 such as an image sensor generates raw (unprocessed) data 51, and the image processing device 12 outputs imaging data 52 after performing image processing (e.g., noise removal or interpolation).

Next, in the transmitter device 20, the encoder 21 serves to compress (encode) and convert the imaging data 52 into encoded data 53 in order to reduce the amount of data to be transmitted. Note that this conversion process by the encoder 21 is referred to as encoding in some cases. A variety of data compression algorisms have been provided; for example, a standard called MPEG-H HEVC is employed for 8K UHD broadcasting.

Note that the encoder 21 includes a circuit 21a and a circuit 21b. The circuit 21a in the encoder 21 serves to compress the imaging data 52. The circuit 21b has a function of generating the encoded data 53 by performing a process such as addition of control data necessary for broadcasting (such as authentication data), encryption, or scrambling (data rearrangement for spread spectrum) on the compressed data.

The encoded data 53 is superimposed on a carrier wave through the modulator 22 and sent out as transmission data 54. The functions described so far are performed by a broadcasting station.

Next, the receiver device 30 included in a television set or the like at home receives the transmission data 54 as reception data 55. The reception data 55 is changed into demodulated data 56 through the demodulator 31. The decoder 33 has a function of decompressing and converting the demodulated data 56 into video data 57. Note that this conversion process by the decoder 33 is referred to as decoding in some cases.

Note that the demodulated data 56 preferably includes two carrier waves, an in-phase carrier wave (I) and a quadrature carrier wave (Q).

Figure 4:
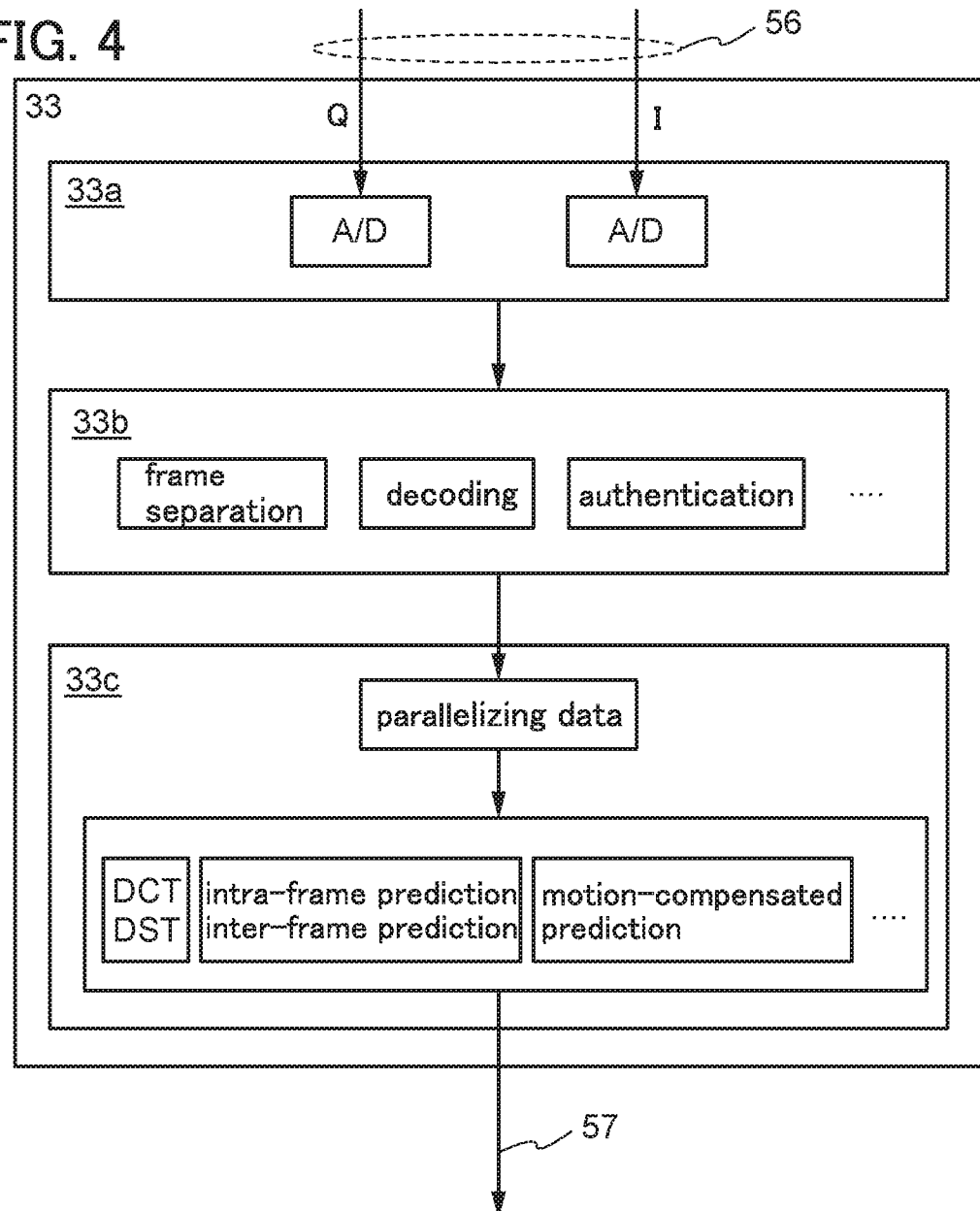
FIG. 4 is a flow chart illustrating a function of a decoder.

The decoder 33 includes a circuit 33a, a circuit 33b, and a circuit 33c. The circuit 33a functions as an analog/digital converter (A/D converter) (FIG. 4). The circuit 33b has a function of performing a process such as separation of control data necessary for broadcasting (such as authentication data), frame separation, decoding, authentication, or descrambling (restoring original data from scrambled data) on the A/D-converted data, depending on the process performed by the encoder 21 (FIG. 4). The circuit 33c in the decoder 33 serves to decompress the compressed data and generate the video data 57. The circuit 33c preferably has a function of parallelizing data. The parallelized data are subjected to processes such as orthogonal transform (discrete cosine transform (DCT) and discrete sine transform (DST)), intra-frame prediction, inter-frame prediction, and motion-compensated prediction (FIG. 4). Note that a circuit for performing parallelization may be provided outside the circuit 33c.

Note that the discrete cosine transform and inverse discrete cosine transform simply show an inverse relationship between data to be converted and converted data, and can be achieved by equivalent operations. Therefore, the discrete cosine transform and inverse discrete cosine transform are collectively referred to as discrete cosine transform in some cases. Similarly, the discrete sine transform and inverse discrete sine transform are collectively referred to as discrete sine transform in some cases.

The encoder 21 and the decoder 33 are preferably formed using an integrated circuit (IC), a large-scale integrated (LSI) circuit, or the like. The encoder 21 and the decoder 33 may be formed using a field programmable gate array (FPGA) or the like.

Next, the video data 57 is changed into display data 58 through image processing (such as gamma processing) by the image processing device 41 in the display device 40, and the display data 58 is displayed by the display element 42 (such as a liquid crystal display).

Examples of specific methods for data compression by the encoder 21 and data decompression by the decoder 33 include intra-picture (intra-frame) prediction, inter-picture (inter-frame) prediction, orthogonal transform (discrete cosine transform (DCT) and discrete sine transform (DST)), and variable-length coding. Among these examples, orthogonal transform (DCT and DST) will be described below in detail.

DCT (the same applies to DST) converts image data (a spatial coordinates domain representation) f(k, l) into a spatial frequency domain representation F(u, v). In most image data, the contribution of a high spatial frequency component is generally small; thus, the total amount of data can be reduced by variable-length coding of converted data. A specific 8×8 DCT formula can be represented by Formula (1).

$$F(u, v) = \frac{1}{4}C(u)C(v)\sum_{k}\sum_{l} f(k, l)\cos\left(\frac{(2k+1)u\pi}{16}\right)\cos\left(\frac{(2l+1)v\pi}{16}\right) \quad (1)$$

Here, Formula (1) is modified into two formulae, Formula (2) and Formula (3). Using Formula (3), A(v, k) can be calculated, and using Formula (2), F(u, v) can be calculated. That is, DCT (or DST) can be achieved by a two-stage operation.

$$F(u, v) = \frac{1}{4}C(u)\sum_{k} A(v, k)\cos\left(\frac{(2k+1)u\pi}{16}\right) \quad (2)$$

$$A(v, k) = \sum_{l} f(k, l)C(v)\cos\left(\frac{(2l+1)v\pi}{16}\right) \quad (3)$$

For example, in part of the data compression algorithm for the standard MPEG-H HEVC, discrete cosine transform is used. In particular, discrete cosine transform with a different block size (4×4, 8×8, 16×16, or 32×32) depending on data is used.

Formula (2) and Formula (3) can be represented by a multiply-accumulate operation. In addition, Formula (2) and Formula (3) can be represented by a matrix operation.

That is, an encoder capable of performing the above multiply-accumulate operation at high speed can perform the above DCT (or DST) at high speed and can therefore perform encoding in a short time.

A decoder capable of performing the above multiply-accumulate operation at high speed can perform the above DCT (or DST) at high speed and can therefore perform decoding in a short time.

<<Semiconductor Device>>

Next, a circuit configuration of a semiconductor device capable of performing the above multiply-accumulate operation will be described with reference to FIGS. 5 to 12 and FIGS. 13A to 13C.

<Block Diagram>

Figure 5:
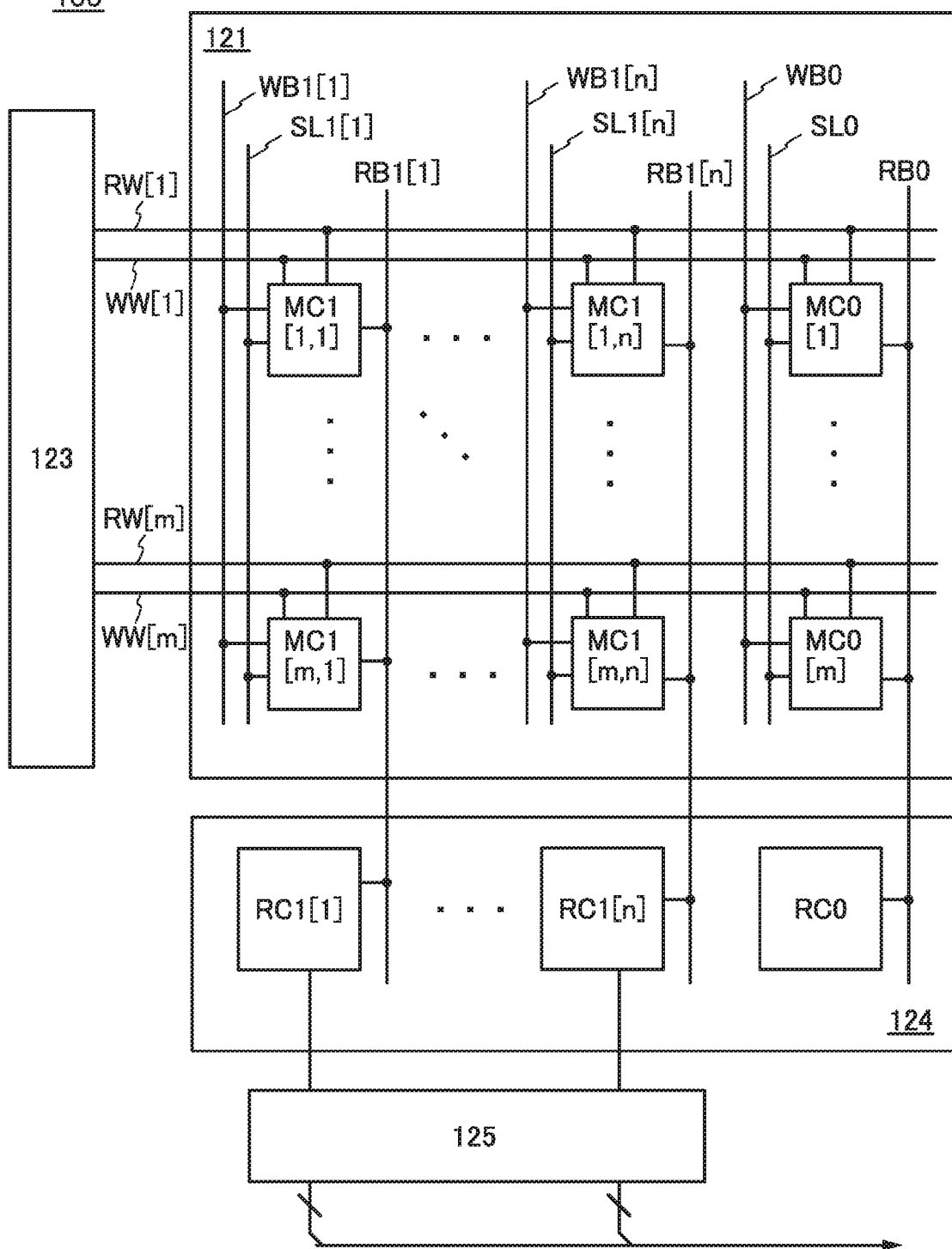
FIG. 5 is a block diagram illustrating a configuration example of a semiconductor device.

FIG. 5 is a block diagram illustrating a configuration example of a semiconductor device 100 which can be applied to the encoder or decoder in FIG. 3. The semiconductor device 100 includes a memory cell array 121, a row decoder 123, an analog circuit 124, an A/D converter circuit 125, wirings RW, wirings WW, wirings WB1, wirings SL1, wirings RB1, a wiring WB0, a wiring SL0, and a wiring RB0.

The wirings WW function as word lines for writing data to memory cells MC1 and MC0.

The wirings RW function as word lines for reading data written to the memory cells MC1 and MC0.

The wirings WB1 function as bit lines supplied with data to be written to the memory cells MC1. Similarly, the wiring WB0 functions as a bit line supplied with data to be written to the memory cells MC0.

The wirings RB1 function as bit lines for reading data written to the memory cells MC1. Similarly, the wiring RB0 functions as a bit line for reading data written to the memory cells MC0.

The wirings SL0 and SL1 function as power supply lines, to each of which a certain potential is applied.

The memory cell array 121 includes the memory cells MC1 arranged in a matrix with m rows and n columns (m and n are each an integer of 2 or more) and the memory cells MC0 arranged in the m rows and one column. In FIG. 5, the memory cell MC0[i] (i is an integer of 1 or more and m or less) is electrically connected to the memory cells MC1[i, 1] to MC1[i, n] through the wiring RW[i] or the wiring WW[i].

The row decoder 123 has a function of supplying write signals for the memory cells MC1 and MC0 to the wirings WW. Similarly, the row decoder 123 has a function of supplying read signals for the memory cells MC1 and MC0 to the wirings RW. Examples of signals input to the row decoder 123 include address signals for specifying the rows of the memory cells MC1 and MC0, the above read signals, and the like.

The analog circuit 124 includes circuits RC1 arranged in one row and the n columns and a circuit RC0. The circuit RC1[j] (j is an integer of 1 or more and n or less) is electrically connected to the memory cells MC1[l, j] to MC1[m, j] through the wiring RB1[j]. Similarly, the circuit RC0 is electrically connected to the memory cells MC0[1] to MC0[m] through the wiring RB0. As described later, the analog circuit 124 has a function of performing a multiply-accumulate operation on data written to the memory cell MC1 and data supplied to the wiring RW as the read signal and outputting the result.

The A/D converter circuit 125 has a function of converting output data of the analog circuit 124 into digital data. Note that the A/D converter circuit 125 may be omitted in some cases.

<Circuit Configuration>

Figure 6:
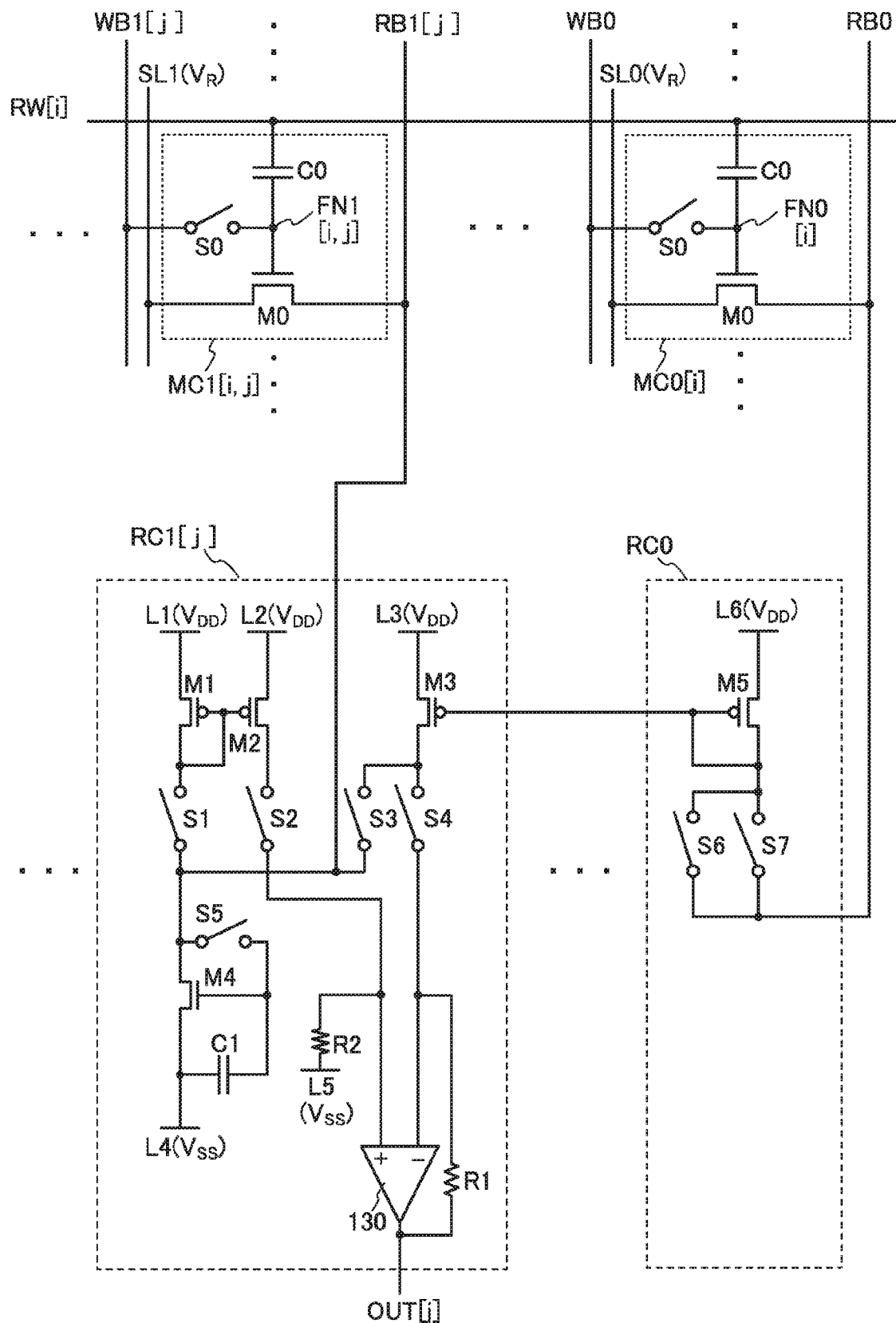
FIG. 6 is a circuit diagram illustrating a configuration example of a semiconductor device.

FIG. 6 illustrates a circuit configuration example of the memory cell MC1, the memory cell MC0, the circuit RC1, and the circuit RC0 in the semiconductor device 100.

The memory cell MC1 includes a switch S0, a transistor M0, a capacitor C0, and a node FN1. The memory cell MC1 is electrically connected to the wiring RW, the wiring WB1, the wiring SL1, and the wiring RB1.

In the memory cell MC1, a first terminal of the capacitor C0 is electrically connected to the wiring RW, and a second terminal of the capacitor C0 is electrically connected to the node FN1. A gate of the transistor M0 is electrically connected to the node FN1. A source or a drain of the transistor M0 is electrically connected to the wiring RB1. The other of the source and the drain of the transistor M0 is electrically connected to the wiring SL1. The switch S0 has a function of controlling electrical connection between the node FN1 and the wiring WB1.

The memory cell MC0 includes a switch S0, a transistor M0, a capacitor C0, and a node FN0. The memory cell MC0 is electrically connected to the wiring RW, the wiring WB0, the wiring SL0, and the wiring RB0.

In the memory cell MC0, a first terminal of the capacitor C0 is electrically connected to the wiring RW, and a second terminal of the capacitor C0 is electrically connected to the node FN0. A gate of the transistor M0 is electrically connected to the node FN0. A source or a drain of the transistor M0 is electrically connected to the wiring RB0. The other of the source and the drain of the transistor M0 is electrically connected to the wiring SL0. The switch S0 has a function of controlling electrical connection between the node FN0 and the wiring WB0.

The memory cell MC1 has a function of writing data supplied to the wiring WB1 to the node FN1 by turning on the switch S0, and has a function of retaining data written to the node FN1 by turning off the switch S0.

Similarly, the memory cell MC0 has a function of writing data supplied to the wiring WB0 to the node FN0 by turning on the switch S0, and has a function of retaining data written to the node FN0 by turning off the switch S0.

A transistor with a low off-state current is preferably used as the switch S0. Examples of the transistor with a low off-state current include an OS transistor including an oxide semiconductor in a channel formation region and a transistor using a wide band gap semiconductor (with a band gap of 2.2 eV or more, such as silicon carbide, gallium nitride, or diamond) in a channel formation region. It is particularly preferable to use an OS transistor. With the use of the OS transistor, the normalized off-state current of the switch S0 per micrometer of channel width (at a source-drain voltage of 3 V and room temperature) can be lower than or equal to $10 \times 10^{-21}$ A.

The use of a transistor with a low off-state current as the switch S0 enables data to be written to the memory cells MC1 and MC0 with low power. It also enables the memory cells MC1 and MC0 to retain data for a long period even in a state where the semiconductor device 100 is powered off. In addition, the capacitance of the capacitor C0 can be decreased; accordingly, the area occupied by the memory cells MC1 and MC0 can be reduced.

When a transistor with a high on-state current, such as an OS transistor or a transistor with a wide band gap semiconductor, is used as the switch S0, data can be written to the memory cells MC1 and MC0 at high speed.

The circuit RC1 includes switches S1 to S5, transistors M1 to M4, a capacitor C1, an operational amplifier 130, a resistor R1, a resistor R2, and wirings L1 to L5. The circuit RC1[j] is electrically connected to the memory cells MC1[1, j] to MC1[m, j] through the wiring RB1[j].

In the circuit RC1, the wiring RB1 is electrically connected to the wiring L1 through the transistor M1, electrically connected to the wiring L3 through the transistor M3, and electrically connected to the wiring L4 through the transistor M4.

A non-inverting input terminal (+) of the operational amplifier 130 is electrically connected to the wiring L2 through the transistor M2, and an inverting input terminal (−) of the operational amplifier 130 is electrically connected to the wiring L3 through the transistor M3. The inverting input terminal of the operational amplifier 130 is electrically connected to an output terminal of the operational amplifier 130 through the resistor R1, and the non-inverting input terminal of the operational amplifier 130 is electrically connected to the wiring L5 through the resistor R2.

A first terminal of the capacitor C1 is electrically connected to a gate of the transistor M4, and a second terminal of the capacitor C1 is electrically connected to one of a source and a drain of the transistor M4 and the wiring L4.

The switch S1 has a function of controlling electrical connection and disconnection between the wiring RB1 and the transistor M1. The switch S2 has a function of controlling electrical connection and disconnection between the non-inverting input terminal of the operational amplifier 130 and the transistor M2. The switch S3 has a function of controlling electrical connection and disconnection between the wiring RB1 and the transistor M3. The switch S4 has a function of controlling electrical connection and disconnection between the inverting input terminal of the operational amplifier 130 and the transistor M3. The switch S5 has a function of controlling electrical connection and disconnection between the other of the source and the drain of the transistor M4 and the gate of the transistor M4.

The circuit RC0 includes switches S6 and S7, a transistor M5, and a wiring L6. The circuit RC0 is electrically connected to the memory cells MC0[1] to MC0[m] through the wiring RB0.

In the circuit RC0, the wiring RB0 is electrically connected to the wiring L6 through the transistor M5. The switches S6 and S7 have a function of controlling electrical connection and disconnection between the wiring RB0 and the transistor M5.

The transistors M1 and M2 form a current mirror circuit. Similarly, the transistors M3 and M5 form a current mirror circuit.

The wirings L1 to L3 and L6 are preferably supplied with a high potential (a potential $V_{DD}$). The wirings L4 and L5 are preferably supplied with a low potential (a potential $V_{SS}$). The wirings SL0 and SL1 are preferably supplied with a low potential (a potential $V_R$).

For example, transistors with a low off-state current, such as OS transistors or transistors with a wide band gap semiconductor, may be used as the switches S1 to S7. The use of transistors with a low off-state current as the switches S1 to S7 makes it possible to reduce the power consumption of the circuits RC1 and RC0.

For example, transistors with a high on-state current, such as OS transistors or transistors with a wide band gap semiconductor, may be used as the switches S1 to S7. The use of transistors with a high on-state current as the switches S1 to S7 makes it possible to increase the operation speed of the circuits RC1 and RC0.

In the following description, the transistors M1 to M3 and M5 are p-channel transistors, and the transistor M0 and M4 are n-channel transistors.

The transistors M0 to M5 preferably operate in a saturation region. The potentials of the wirings can be adjusted as appropriate so that the transistors M0 to M5 can operate in a saturation region.

<Operation>

Figure 7:
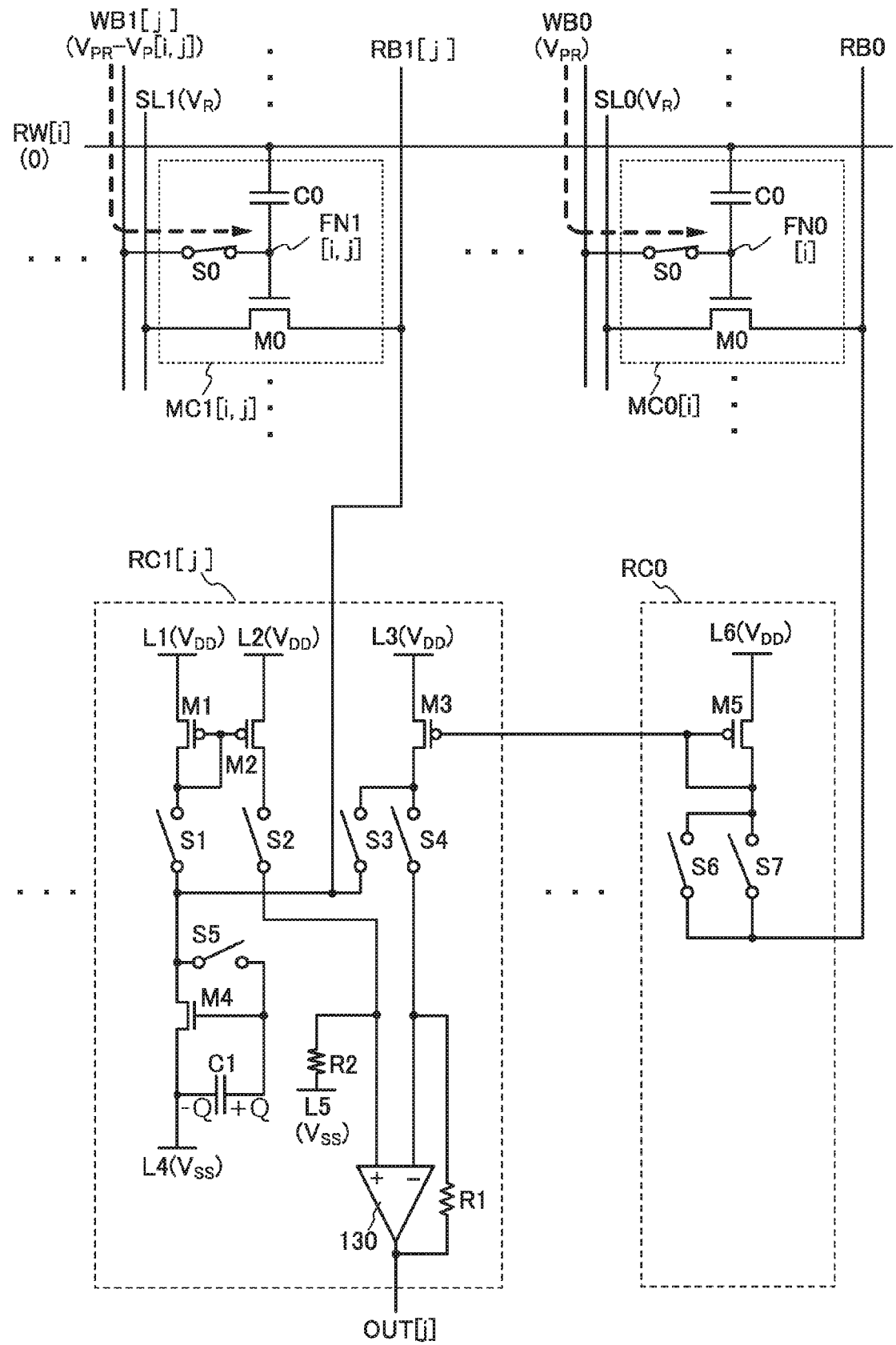
FIG. 7 is a circuit diagram illustrating an operation example of a semiconductor device.

Next, a method for operating the semiconductor device 100 illustrated in FIG. 6 will be described with reference to FIGS. 7 to 9.

First, a potential ($V_{PR}$-$V_P$[i, j]) is supplied to the wiring WB1[j], and a potential $V_{PR}$ is supplied to the wiring WB0. The switches S0 of the memory cells MC1[i, j] and MC0[i] are turned on, whereby the potential ($V_{PR}$-$V_P$[i, j]) is supplied to the node FN1[i, j] and the potential $V_{PR}$ is supplied to the node FN0[i] (see FIG. 7).

Figure 8:
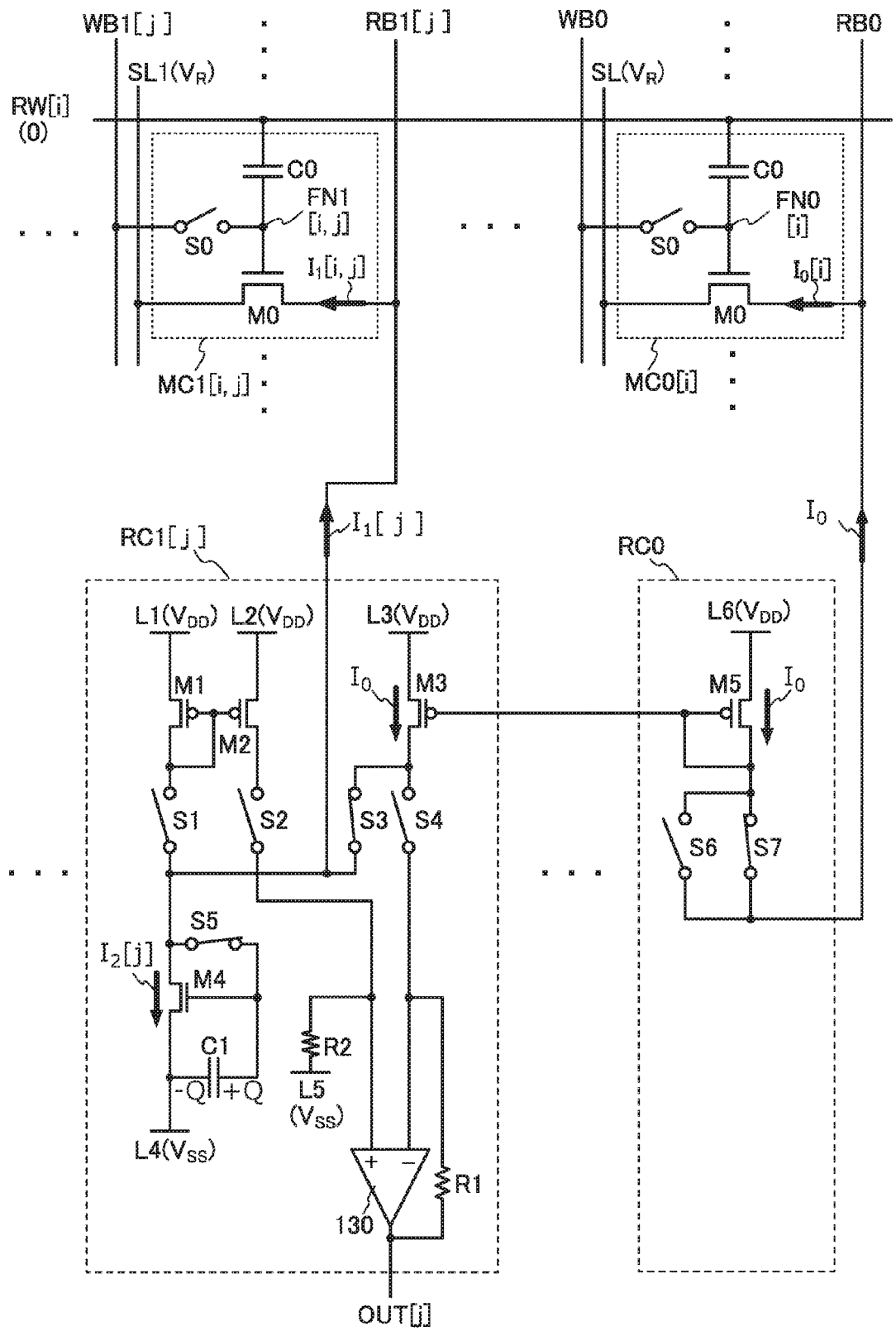
FIG. 8 is a circuit diagram illustrating an operation example of a semiconductor device.

After the potentials are written to the node FN1[i, j] and the node FN0[i], the respective switches S0 are turned off (see FIG. 8). The potentials written to the node FN1[i, j] and the node FN0[i] are retained. Note that the potential of the wiring RW[i] is preferably set to a given reference potential. In the following description, the reference potential is 0, and the other potentials are expressed as differences from the reference potential.

The above operation is performed on the memory cells MC1[1, j] to MC1[m, j] and the memory cells MC0[1, j] to MC0[m, j].

A current $I_1$[i, j] which flows to the transistor M0 of the memory cell MC1[i, j] and a current $I_0$[i] which flows to the transistor M0 of the memory cell MC0[i] when the potential 0 is supplied to the wiring RW[i] are represented by Formula (4) and Formula (5) below.

$$I_1[i, j] = \beta(V_{PR} - V_P[i, j] - V_{th})^2 \quad (4)$$

$$I_0[i] = \beta(V_{PR} - V_{th})^2 \quad (5)$$

In Formula (4) and Formula (5), $\beta$ is a coefficient, and $V_{th}$ is the threshold voltage of the transistor M0.

Next, the current $I_1$[j] which flows through the wiring RB1[j] and the current $I_0$ which flows through the wiring RB0 are described. The current $I_1$[j] is the sum of currents $I_1$[1, j] to $I_1$[m, j], and the current $I_0$ is the sum of currents $I_0$[1] to $I_0$[m] (see FIG. 8). Thus, a difference $\Delta I$[j] obtained by subtracting the current $I_1$[j] from the current $I_0$ can be represented by Formula (6) below.

$$\Delta I[j] = I_0 - I_1[j] = \sum_{i=1}^{m} I_0[i] - \sum_{i=1}^{m} I_1[i, j] = \\ -2\beta \sum_{i=1}^{m} (V_{th} - V_{PR})V_P[i, j] - \beta \sum_{i=1}^{m} V_P[i, j]^2 \quad (6)$$

When a current $I_3$[j] is defined by Formula (7), Formula (6) can be represented by Formula (8).

$$I_3[j] = -2\beta \sum_{i=1}^{m} (V_{th} - V_{PR})V_P[i, j] - \beta \sum_{i=1}^{m} V_P[i, j]^2 \quad (7)$$

$$I_3[j] = I_0 - I_1[j] \quad (8)$$

The description of the operation of the semiconductor device 100 will be continued below. As illustrated in FIG. 8, the switches S3, S5, and S7 are turned on and the switches S0, S1, S2, S4, and S6 are turned off in a state where all the potentials of the wirings RW[1] to RW[m] are set to 0. At that time, the current $I_1$[j] flows through the wiring RB1[j], the current $I_0$ flows through the wiring RB0 and the transistor M5, and a current $I_2$[j] flows through the transistor M4.

Since the transistor M3 and the transistor M5 form a current mirror circuit, the current $I_0$ flowing through the transistor M5 flows also through the transistor M3. Accordingly, the sum of the current $I_1$[j] and the current $I_2$[j] is found to be equal to the current $I_0$ (Formula (9)).

$$I_0 = I_1[j] + I_2[j] \quad (9)$$

From Formula (8) and Formula (9), the current $I_2$[j] and the current $I_3$[f] are found to be equal to each other (Formula (10)).

$$I_3[j] = I_2[j] \quad (10)$$

The capacitor C1 is charged with a gate potential of the transistor M4 so that the transistor M4 can supply the current $I_2$[j]. That is, according to Formula (10), when the capacitor C1 retains that potential, the transistor M4 functions as a current source for supplying the current $I_3$[j].

Figure 9:
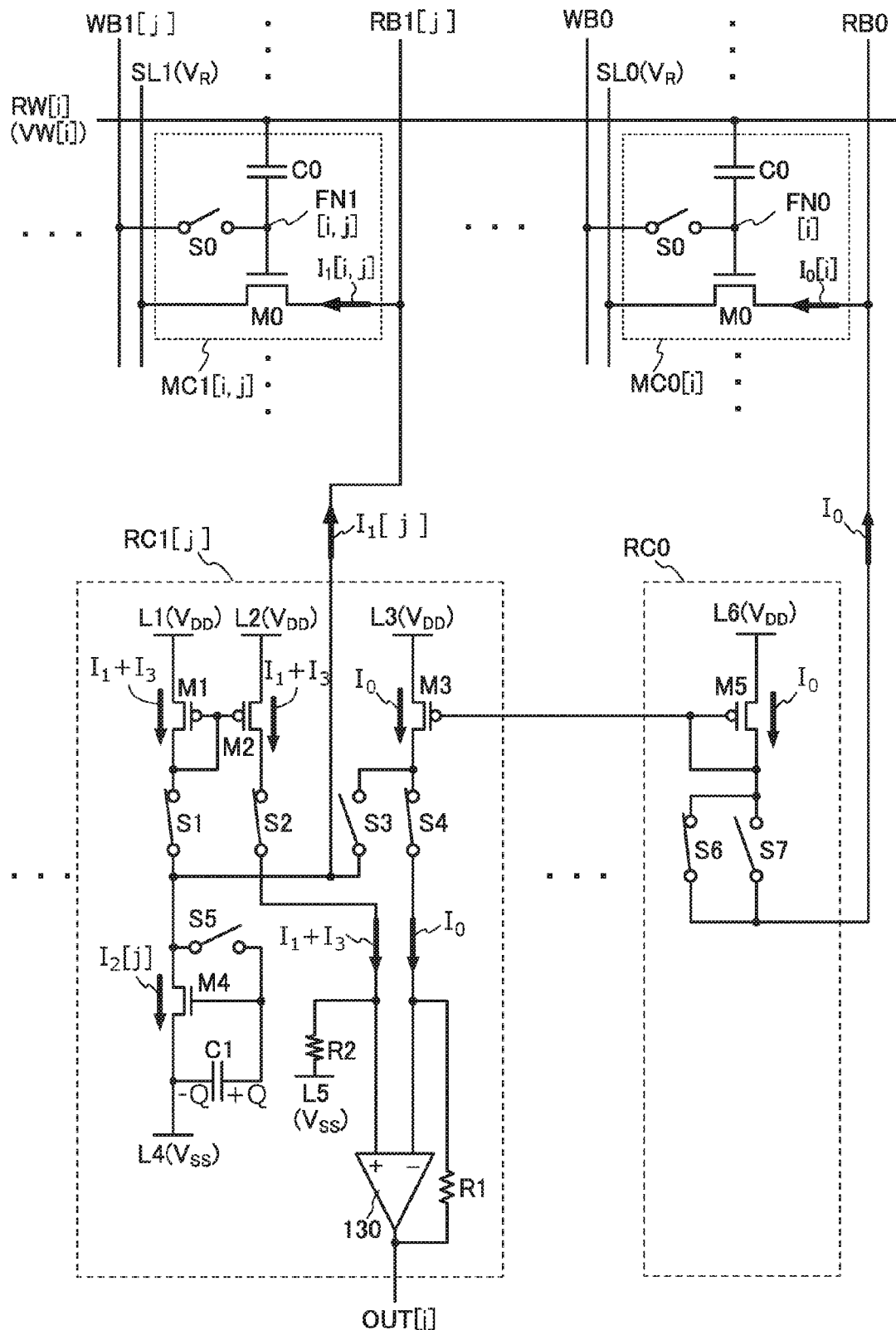
FIG. 9 is a circuit diagram illustrating an operation example of a semiconductor device.

Next, as illustrated in FIG. 9, the switches S1, S2, S4, and S6 are turned on and the switches S0, S3, S5, and S7 are turned off in a state where a potential $V_W$[i] is supplied to the wiring RW[i]. The current $I_r$[i, j] which flows to the transistor M0 of the memory cell MC1[i, j] and the current $I_0$[i] which flows to the transistor M0 of the memory cell MC0[i] at that time are represented by Formula (11) and Formula (12) below.

$$I_1[i, j] = \beta(V_w[i] + V_{PR} - V_P[i, j] - V_{th})^2 \quad (11)$$

$$I_0[i] = \beta(V_w[i] + V_{PR} - V_{th})^2 \quad (12)$$

Note that the potential of the wiring RW[i] is superimposed on the gate potential of the transistor M0 through the capacitor C0; thus, the change in the potential of the wiring RW[i] does not correspond to an increase in the gate potential of the transistor M0. Specifically, a potential change obtained by multiplication of a capacitive coupling coefficient that can be calculated from the capacitance of the capacitor C0, the gate capacitance of the transistor M0, and parasitic capacitance by the potential change of the wiring RW[i] corresponds to the increase in the gate potential of the transistor M0. Here, for simplicity, a potential obtained by multiplication of the capacitive coupling coefficient is $V_w$[i]; however, actually, a potential supplied to the wiring RW[i] may be converted as appropriate using the capacitive coupling coefficient.

The difference $\Delta I$[j] obtained by subtracting the current $I_1$[j] from the current $I_0$ can be represented by Formula (13) below.

$$\Delta I[j] = I_0 = I_1[j] = \sum_{i=1}^{m} I_0[i] - \sum_{i=1}^{m} I_1[i, j] = 2\beta \sum_{i=1}^{m} (V_W[i]V_P[i, j]) - \qquad (13)$$

$$2\beta \sum_{i=1}^{m} (V_{th} - V_{PR})V_P[i, j] - \beta \sum_{i=1}^{m} V_P[i, j]^2$$

Formula (7) and Formula (13) give Formula (14).

$$I_1[j] + I_3[j] - I_0 = -2\beta \sum_{i=1}^{m} (V_W[i]V_P[i, j]) \qquad (14)$$

In FIG. 9, a current equal to the sum of the current $I_1[j]$ and the current $I_3[j]$ (i.e., the sum of the current $I_1[j]$ and the current $I_2[j]$) flows through the transistor M1 and the switch S1 and flows also through the transistor M2 which forms a current mirror circuit with the transistor M1. In addition, the current $I_0$ flows through the transistor M5 and flows also through the transistor M3 which forms a current mirror circuit with the transistor M5.

As a result, the current $I_0$ flows to the resistor R1, and the current $(I_1[j]+I_3[j])$ flows to the resistor R2. When the resistance of the resistor R1 and the resistance of the resistor R2 are equal to each other, a potential of an output terminal OUT[j] of the operational amplifier 130 is proportional to $I_1[j]+I_3[j]-I_0$. That is, according to Formula (14), a potential proportional to $\Sigma(V_W[i] \times V_P[i, j])$ is output from the output terminal OUT[j].

As represented by Formula (15) below, this corresponds to a multiply-accumulate operation on the potentials $V_P[1, j]$ to $V_P[m, j]$ and the potentials $V_W[1]$ to $V_W[m]$.

$$\sum_{i=1}^{m} (V_W[i]V_P[i, j]) = V_W[1]V_P[1, j] + \ldots + V_W[m]V_P[m, j] = \qquad (15)$$

$$(V_P[1, j] \ldots V_P[m, j]) \begin{pmatrix} V_W[1] \\ \vdots \\ V_W[m] \end{pmatrix}$$

That is, the semiconductor device 100 can perform a multiply-accumulate operation on data $(V_P)$ stored in the memory cell MC1 and the potential $(V_W)$ supplied to the wiring RW.

It can be found from Formula (15) that data proportional to a j-th component obtained by vector-matrix multiplication is output from the output terminal OUT[j] when $V_P$ corresponds to a matrix element and $V_W$ corresponds to a vector element. The results of vector-matrix multiplication can be obtained (Formula (16)) by performing the above operation on the output terminals OUT[1] to OUT[n] and normalizing the obtained data as appropriate.

$$\begin{pmatrix} V_P[1, 1] & \ldots & V_P[m, 1] \\ \vdots & \ddots & \vdots \\ V_P[1, n] & \ldots & V_P[m, n] \end{pmatrix} \begin{pmatrix} V_W[1] \\ \vdots \\ V_W[m] \end{pmatrix} \qquad (16)$$

$$\begin{pmatrix} V_W[1]V_P[1, 1] + \ldots + V_W[m]V_P[m, 1] \\ \vdots \\ V_W[1]V_P[1, n] + \ldots + V_W[m]V_P[m, n] \end{pmatrix}$$

The semiconductor device 100 can perform DCT (or DST) by substituting $V_P$ or $V_W$ in the above description with image data such as A(v, k) in Formula (2) or f(k, l) in Formula (3).

Note that in the semiconductor device 100 illustrated in FIGS. 6 to 9, the transistors M1, M2, M3, and M5 may be n-channel transistors and the transistor M4 may be a p-channel transistor. In that case, it is preferable that the potential $V_{SS}$ be supplied to the wirings L1, L2, L3, and L6 and the potential $V_{DD}$ be supplied to the wirings L4 and L5.

<Specific Configuration Example of Semiconductor Device>

Figure 10:
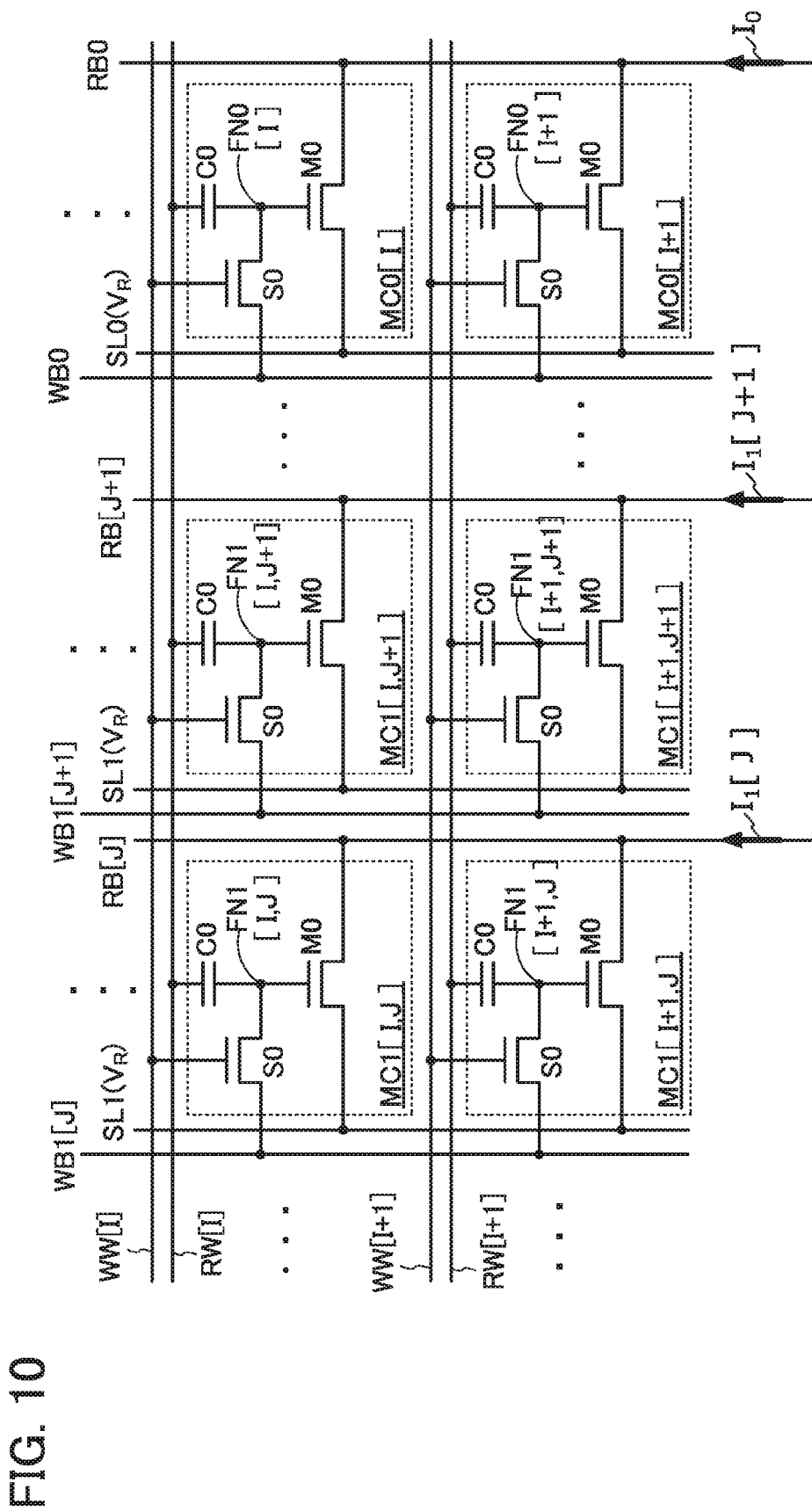
FIG. 10 is a circuit diagram illustrating a configuration example of a semiconductor device.
Figure 11:
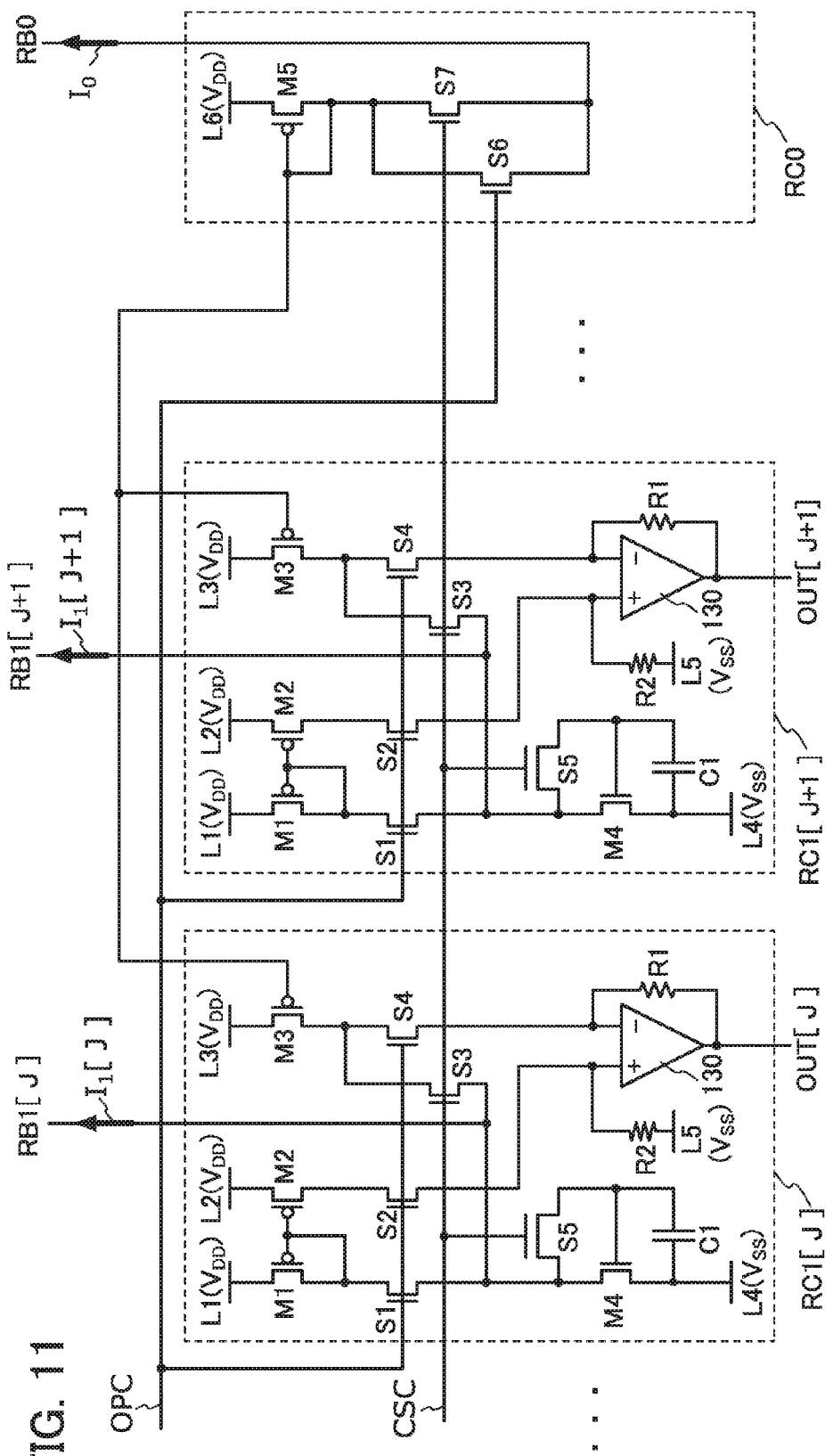
FIG. 11 is a circuit diagram illustrating a configuration example of a semiconductor device.
Figure 12:
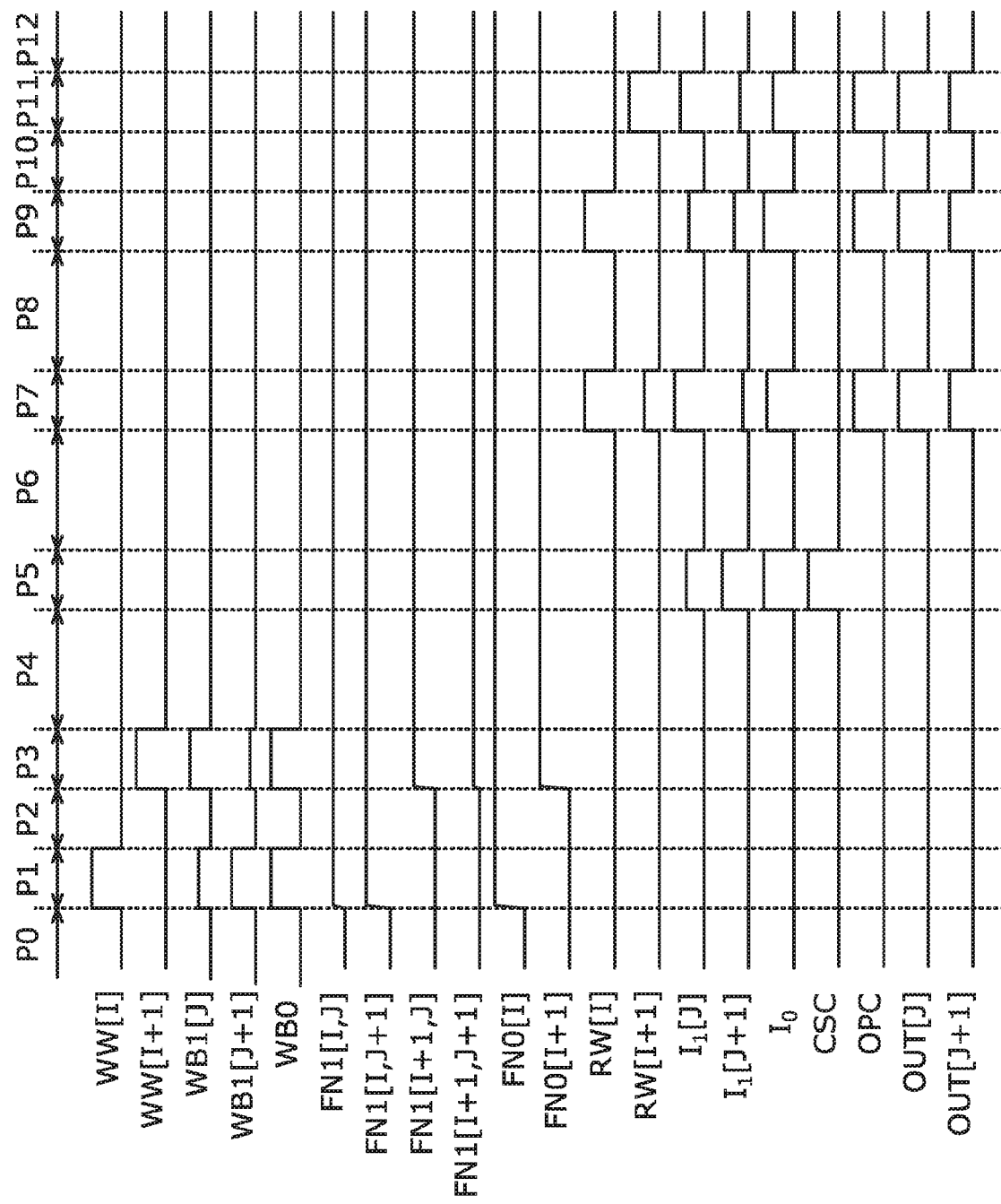
FIG. 12 is a timing chart illustrating an operation example of a semiconductor device.

A more specific configuration example of the semiconductor device 100 will be described with reference to FIGS. 10 to 12. FIG. 10 illustrates a more specific configuration example of the memory cells MC1 and MC0. FIG. 11 illustrates a more specific configuration example of the circuits RC1 and RC0. FIG. 12 is a timing chart illustrating an example of operation of the semiconductor device 100 illustrated in FIGS. 10 and 11.

Note that in FIGS. 10 to 12, l represents an integer of 1 or more and (m−1) or less, and J represents an integer of 1 or more and (n−1) or less.

FIG. 10 is a circuit diagram in which n-channel transistors are used as the switches S0 in FIG. 6 and the wirings WW are provided. The wirings WW function as word lines for writing data to the memory cells MC1 and MC0. The wiring WW[I] is electrically connected to the memory cells MC1[I, 1] to MC1[I, n] and MC0[I]. The wiring WW[J+1] is electrically connected to the memory cells MC1[I+1, 1] to MC1[I+1, n] and MC0[I+1]. The wirings WW have a function of controlling whether the switches S0 are turned on or off. When a high-level (H-level) potential is supplied to the wirings WW, the switches S0 are turned on and data are written to the nodes FN1 and FN0.

FIG. 11 is a circuit diagram in which n-channel transistors are used as the switches S1 to S7 in FIG. 6 and a wiring OPC and a wiring CSC are provided. The wiring OPC has a function of controlling whether the switches S1, S2, S4, and S6 are turned on or off. The wiring CSC has a function of controlling whether the switches S3, S5, and S7 are turned on or off. When an H-level potential is supplied to the wiring OPC, the switches S1, S2, S4, and S6 are turned on. When an H-level potential is supplied to the wiring CSC, the switches S3, S5, and S7 are turned on.

Note that the switches S1 to S7 may be p-channel transistors. Alternatively, the switches S1 to S7 may be complementary MOS switches (CMOS switches or analog switches). When the switches S1 to S7 are n-channel transistors, the switches can operate at high speed and can be provided in a small area. When the switches S1 to S7 are p-channel transistors, the switches can be provided in a small area. When the switches S1 to S7 are CMOS switches, input signals over a wide voltage range can be used.

<Timing Chart>

Next, an example of operation of the semiconductor device 100 illustrated in FIGS. 10 and 11 will be described with reference to FIG. 12. FIG. 12 illustrates periods P0 to P12. The periods P1 to P3 correspond to operation periods for storing data in the memory cells MC1 and MC0. The period P5 corresponds to an operation period for setting correction voltages for the analog circuits (the circuits RC1 and RC0). The period P7 corresponds to an operation period for obtaining the results of multiply-accumulate operations on data stored in the memory cells MC1 and data supplied to the wirings RW. The periods P9 to P11 correspond to operation periods for obtaining data corresponding to data of the memory cells MC1 in each row.

In the period P1, an H-level potential, a low-level (L-level) potential, a potential $V_{PR}-V_P[I,J]$, a potential $V_{PR}-V_P[I, J+1]$ and a potential $V_{PR}$ are supplied to the wiring WW[I], the wiring WW[I+1], the wiring WB1[J], the wiring WB1[J+1], and the wiring WB0, respectively. At this time, the potential of the node FN1[I, J], the potential of the node FN1[I, J+1] and the potential of the node FN0[I] are set to $V_{PR}-V_P[I, J]$, $V_{PR}-V_P[I, J+1]$, and $V_{PR}$, respectively.

Similarly, in the period P3, an L-level potential, an H-level potential, a potential $V_{PR}-V_P[I+1, J]$, a potential $V_{PR}-V_P[I+1, J+1]$, and the potential $V_{PR}$ are supplied to the wiring WW[I], the wiring WW[I+1], the wiring WB1[J], the wiring WB1[J+1], and the wiring WB0, respectively. At this time, the potential of the node FN1[I+1, J], the potential of the node FN1[I+1, J+1], and the potential of the node FN0[I+1] are set to $V_{PR}-V_P[I+1, J]$, $V_{PR}-V_P[I+1, J+1]$, and $V_{PR}$, respectively.

In the period P5, an H-level potential is supplied to the wiring CSC, whereby the switches S3, S5, and S7 are turned on and the capacitor C1 is charged with the current $I_2[J]$.

In the period P7, the potential $V_W[I]$ is supplied to the wiring RW[I], and the potential $V_W[I+1]$ is supplied to the wiring RW[I+1]. In addition, an H-level potential is supplied to the wiring OPC, whereby the switches S1, S2, S4, and S6 are turned on. As a result, a potential proportional to $\Sigma_i(V_W[I] \times V_P[I, J])$ is output from the output terminal OUT[J]. The results of the vector-matrix multiplication represented by Formula (16) can be obtained by performing the above operation on the output terminals OUT[1] to OUT[n].

The semiconductor device 100 illustrated in FIGS. 10 and 11 can obtain data of the memory cells MC1 in the I-th row by supplying the potential $V_W[I]$ to the wiring RW[I] among the wirings RW[1] to RW[m] and supplying the potential 0 to all the other wirings RW. The operation in that case is shown in the period P9.

In the period P9, the potential $V_W[I]$ is supplied to the wiring RW[I], and the potential 0 is supplied to all the other wirings RW. In addition, the H-level potential is supplied to the wiring OPC, whereby the switches S1, S2, S4, and S6 are turned on. As a result, a potential proportional to $V_W[I] \times V_P[I, J]$ is output from the output terminal OUT[J], and a potential proportional to $V_W[I] \times V_P[I, J+1]$ is output from the output terminal OUT[J+1]. It can be found that data of the memory cells MC1 in the I-th row can be obtained (Formula (17)) by performing the above operation on the output terminals OUT[1] to OUT[n].

$$\begin{pmatrix} V_W[I]V_P[I, 1] \\ \vdots \\ V_W[I]V_P[I, j] \\ \vdots \\ V_W[I]V_P[I, n] \end{pmatrix} = V_W[I] \begin{pmatrix} V_P[I, 1] \\ \vdots \\ V_P[I, j] \\ \vdots \\ V_P[I, n] \end{pmatrix} \quad (17)$$

Similarly, the semiconductor device 100 illustrated in FIGS. 10 and 11 can obtain data of the memory cells MC1 in the (I+1)-th row by supplying the potential $V_W[I+1]$ to the wiring RW[I+1] among the wirings RW[1] to RW[m] and supplying the potential 0 to all the other wirings RW. The operation in that case is shown in the period P11.

In the period P11, the potential $V_W[I+1]$ is supplied to the wiring RW[I+1], and the potential 0 is supplied to all the other wirings RW. In addition, the H-level potential is supplied to the wiring OPC, whereby the switches S1, S2, S4, and S6 are turned on. As a result, a potential proportional to $V_W[I+1] \times V_P[I+1, J]$ is output from the output terminal OUT[J], and a potential proportional to $V_W[I+1] \times V_P[I+1, J+1]$ is output from the output terminal OUT[J+1]. Data of the memory cells MC1 in the (I+1)-th row can be obtained as represented by Formula (17) by performing the above operation on the output terminals OUT[1] to OUT[n].

<Configuration Example of Memory Cell>

Other configuration examples of the memory cells MC1 or the memory cells MC0 will be described with reference to FIGS. 13A to 13C.

Figure 13A:
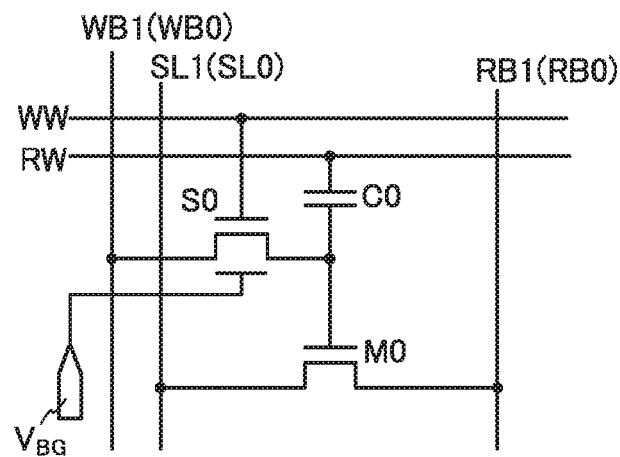
FIGS. 13A to 13C are circuit diagrams each illustrating a configuration example of a memory cell.

FIG. 13A is a circuit diagram in which a transistor used as the switch S0 includes a second gate. A first gate and the second gate of the switch S0 preferably have a region where they overlap with each other with a semiconductor layer positioned therebetween. A potential VBG is supplied to the second gate. With the second gate of the switch S0, the threshold voltage of the transistor can be controlled.

Figure 13B:
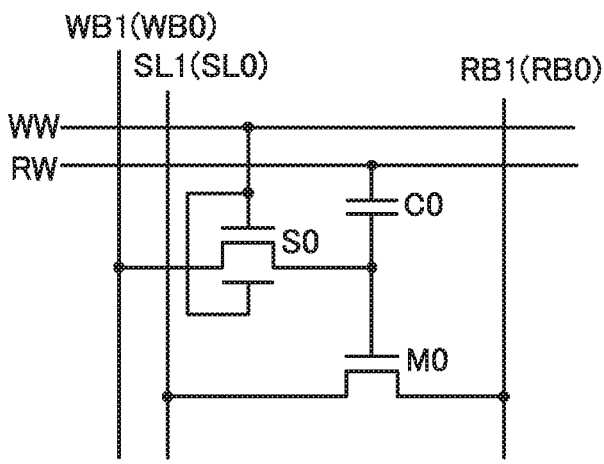

FIG. 13B is a circuit diagram in which a transistor used as the switch S0 includes a first gate and a second gate which are electrically connected to each other. With the switch S0 having the configuration in FIG. 13B, the on-state current of the transistor can be increased.

Figure 13C:
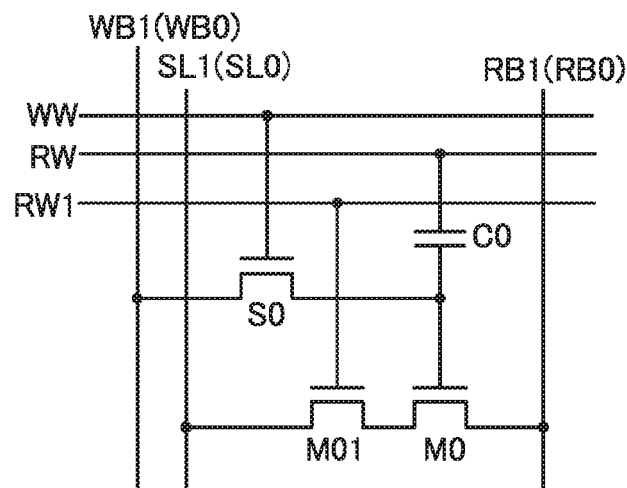

FIG. 13C is a circuit diagram in which a transistor M01 is provided between the transistor M0 and the wiring SL1 (or between the transistor M0 and the wiring SL0). A gate of the transistor M01 is electrically connected to an additionally provided wiring RW1. With the configuration in FIG. 13C, a current between the wiring SL1 and the wiring RB1 (or a current between the wiring SL0 and the wiring RB0) can be controlled. Note that the transistor M01 may be provided between the transistor M0 and the wiring RB1 (or between the transistor M0 and the wiring RB0).

When including the semiconductor device 100 described above, the encoder 21 in FIG. 3 can perform discrete cosine transform (or discrete sine transform) with a small circuit scale. The encoder 21 can perform discrete cosine transform (or discrete sine transform) at high speed. The encoder 21 can perform discrete cosine transform (or discrete sine transform) with low power consumption.

With the use of the above-described encoder, a transmitter device capable of high-speed encoding can be provided. A transmitter device with low power consumption can be provided.

When including the semiconductor device 100 having the above-described configuration, the decoder 33 in FIG. 3 can perform discrete cosine transform (or discrete sine transform) with a small circuit scale. The decoder 33 can perform discrete cosine transform (or discrete sine transform) at high speed. The decoder 33 can perform discrete cosine transform (or discrete sine transform) with low power consumption.

With the use of the above-described decoder, a receiver device capable of high-speed decoding can be provided. A receiver device with low power consumption can be provided.

With the use of the above-described encoder or decoder, a high-speed broadcast system can be provided. A broadcast system with low power consumption can be provided.

(Embodiment 2)

Described in this embodiment are structures of an OS transistor that can be used as the switch S0 described in the above embodiment.

<<Structural Example 1 of Transistor>>

FIGS. 14A to 14C are a top view and cross-sectional views of a transistor 400a. FIG. 14A is a top view. FIG. 14B is a cross-sectional view taken along dashed-dotted line A1-A2 in FIG. 14A, and FIG. 14C is a cross-sectional view taken along dashed-dotted line A3-A4 in FIG. 14A. Note that for simplification of the drawing, some components are not illustrated in the top view in FIG. 14A. Note that the dashed-dotted line A1-A2 and the dashed-dotted line A3-A4 are sometimes referred to as a channel length direction of the transistor 400a and a channel width direction of the transistor 400a, respectively. The channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate.

The transistor 400a includes a substrate 450, an insulating film 401 over the substrate 450, a conductive film 414 over the insulating film 401, an insulating film 402 covering the conductive film 414, an insulating film 403 over the insulating film 402, an insulating film 404 over the insulating film 403, a metal oxide 431 and a metal oxide 432 which are stacked in this order over the insulating film 404, a conductive film 421 in contact with top and side surfaces of the metal oxide 432, a conductive film 423 also in contact with the top and side surfaces of the metal oxide 432, a conductive film 422 over the conductive film 421, a conductive film 424 over the conductive film 423, an insulating film 405 over the conductive films 422 and 424, a metal oxide 433 in contact with the metal oxides 431 and 432, the conductive films 421 to 424, and the insulating film 405, an insulating film 406 over the metal oxide 433, a conductive film 411 over the insulating film 406, a conductive film 412 over the conductive film 411, a conductive film 413 over the conductive film 412, an insulating film 407 covering the conductive film 413, and an insulating film 408 over the insulating film 407. Note that the metal oxides 431 to 433 are collectively referred to as a metal oxide 430.

The metal oxide 432 is a semiconductor and serves as a channel of the transistor 400a.

Furthermore, the metal oxides 431 and 432 include a region 441 and a region 442. The region 441 is formed in the vicinity of a region where the conductive film 421 is in contact with the metal oxides 431 and 432. The region 442 is formed in the vicinity of a region where the conductive film 423 is in contact with the metal oxides 431 and 432.

The regions 441 and 442 serve as low-resistance regions. The region 441 contributes to a decrease in the contact resistance between the conductive film 421 and the metal oxides 431 and 432. The region 442 also contributes to a decrease in the contact resistance between the conductive film 423 and the metal oxides 431 and 432.

The conductive films 421 and 422 serve as one of source and drain electrodes of the transistor 400a. The conductive films 423 and 424 serve as the other of the source and drain electrodes of the transistor 400a.

The conductive film 422 is configured to allow less oxygen to pass therethrough than the conductive film 421. It is thus possible to prevent a decrease in the conductivity of the conductive film 421 due to oxidation.

The conductive film 424 is also configured to allow less oxygen to pass therethrough than the conductive film 423. It is thus possible to prevent a decrease in the conductivity of the conductive film 423 due to oxidation.

The conductive films 411 to 413 serve as a first gate electrode of the transistor 400a.

The conductive films 411 and 413 are configured to allow less oxygen to pass therethrough than the conductive film 412. It is thus possible to prevent a decrease in the conductivity of the conductive film 412 due to oxidation.

The insulating film 406 serves as a first gate insulating film of the transistor 400a.

The conductive film 414 serves as a second gate electrode of the transistor 400a.

The potential applied to the conductive films 411 to 413 may the same as or different from that applied to the conductive film 414. The conductive film 414 may be omitted in some cases.

The insulating films 401 to 404 serve as a base insulating film of the transistor 400a. The insulating films 402 to 404 also serve as a second gate insulating film of the transistor 400a.

The insulating films 405, 407, and 408 serve as a protective insulating film or an interlayer insulating film of the transistor 400a.

As illustrated in FIG. 14C, the side surface of the metal oxide 432 is surrounded by the conductive film 411. With this structure, the metal oxide 432 can be electrically surrounded by an electric field of the conductive film 411. Such a structure of a transistor in which a semiconductor is electrically surrounded by an electric field of a gate electrode is referred to as a surrounded channel (s-channel) structure. Since a channel is formed in the entire metal oxide 432 (bulk) in the s-channel structure, a large amount of current can flow between a source and a drain of a transistor, increasing the on-state current of the transistor.

The s-channel structure, because of its high on-state current, is suitable for a semiconductor device which requires a miniaturized transistor, such as a large-scale integrated (LSI) circuit. A semiconductor device including the miniaturized transistor can have a high integration degree and high density.

In the transistor 400a, a region serving as a gate electrode is formed so as to fill an opening formed in the insulating film 405 or the like, that is, in a self-aligned manner.

As illustrated in FIG. 14B, the conductive films 411 and 422 have a region where they overlap with each other with the insulating film positioned therebetween. The conductive films 411 and 424 also have a region where they overlap with each other with the insulating film positioned therebetween. These regions serve as the parasitic capacitance caused between the gate electrode and the source or drain electrode and might decrease the operation speed of the transistor 400a. This parasitic capacitance can be reduced by providing the insulating film 405 in the transistor 400a. The insulating film 405 preferably contains a material with a low relative dielectric constant.

Figure 15A:
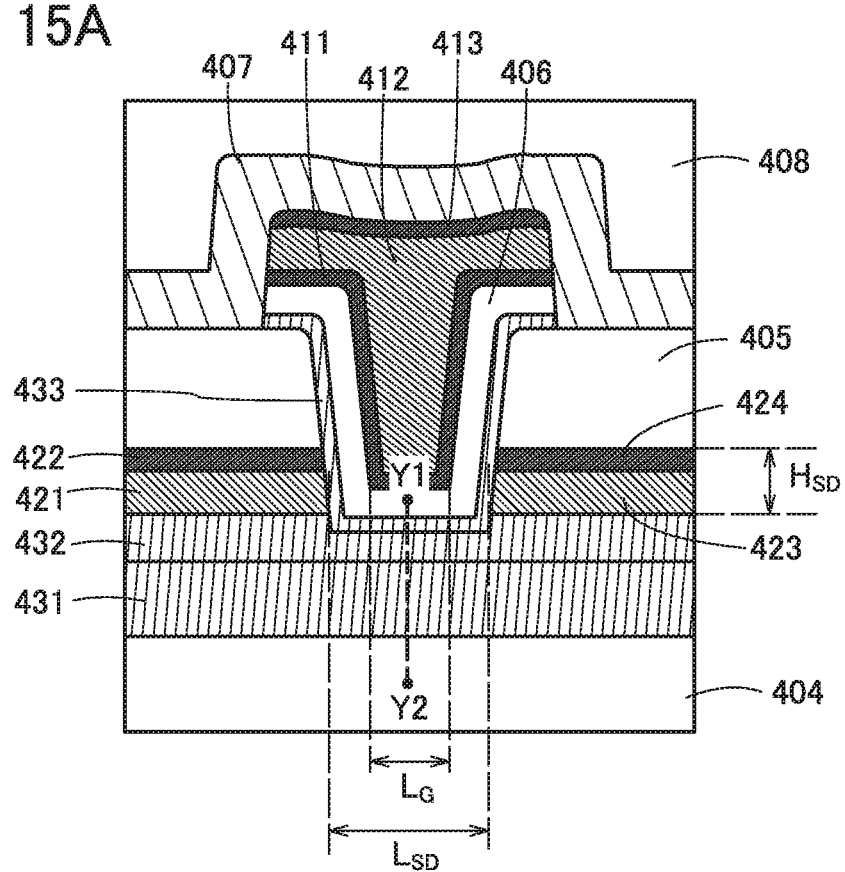
FIG. 15A is a cross-sectional view illustrating a structural example of a transistor.

FIG. 15A is an enlarged view of the center of the transistor 400a. In FIG. 15A, a width $L_G$ denotes the length of the bottom surface of the conductive film 411, which faces and lies parallel to the top surface of the metal oxide 432 with the insulating film 406 and the metal oxide 433 positioned therebetween. The width $L_G$ is the line width of the gate electrode. In FIG. 15A, a width $L_{SD}$ denotes the length between the conductive films 421 and 423, i.e., the length between the source electrode and the drain electrode.

The width $L_{SD}$ is generally determined by the minimum feature size. As illustrated in FIG. 15A, the width $L_G$ is narrower than the width $L_{SD}$. This means that in the transistor 400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 15A, a height HSD denotes the total thickness of the conductive films 421 and 422, or the total thickness of the conductive films 423 and 424.

The thickness of the insulating film 406 is preferably less than or equal to the height $H_{SD}$, in which case the electric field of the gate electrode can be applied to the entire channel formation region. The thickness of the insulating film 406 is less than or equal to 30 nm, preferably less than or equal to 10 nm.

The parasitic capacitance between the conductive films 422 and 411 and the parasitic capacitance between the conductive films 424 and 411 are inversely proportional to the thickness of the insulating film 405. For example, the thickness of the insulating film 405 is preferably three or more times, and further preferably five or more times the thickness of the insulating film 406, in which case the parasitic capacitance is negligibly small. As a result, the transistor 400a can operate at high frequencies.

Components of the transistor 400a will be described below.

<Metal Oxide Layer>

First, a metal oxide that can be used as the metal oxides 431 to 433 will be described.

The metal oxide 432 is an oxide semiconductor containing indium (In), for example. The metal oxide 432 can have high carrier mobility (electron mobility) by containing indium, for example. The metal oxide 432 preferably contains an element M The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 432 preferably contains zinc (Zn). When containing zinc, the metal oxide is easily crystallized in some cases.

Note that the metal oxide 432 is not limited to the oxide semiconductor containing indium. The metal oxide 432 may be an oxide semiconductor that does not contain indium and contains at least one of zinc, gallium, and tin (e.g., a zinc tin oxide or a gallium tin oxide).

For the metal oxide 432, an oxide semiconductor with a wide energy gap is used, for example. The energy gap of the metal oxide 432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 432 is preferably a CAAC-OS film which is described later.

The metal oxides 431 and 433 include, for example, one or more, or two or more, elements other than oxygen included in the metal oxide 432. Since the metal oxides 431 and 433 include one or more, or two or more, elements other than oxygen included in the metal oxide 432, an interface state is less likely to be formed at an interface between the metal oxides 431 and 432 and an interface between the metal oxides 432 and 433.

In the case of using an In—M—Zn oxide as the metal oxide 431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 431 is formed by a sputtering method, a sputtering target with the above composition is preferably used. For example, In:M:Zn is preferably 1:3:2 or 1:3:4.

In the case of using an In—M—Zn oxide as the metal oxide 432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 432 is formed by a sputtering method, a sputtering target with the above composition is preferably used. For example, In:M:Zn is preferably 1:1:1, 1:1:1.2, 2:1:3, 3:1:2, or 4:2:4.1. In particular, when a sputtering target with an atomic ratio of In to Ga and Zn of 4:2:4.1 is used, the atomic ratio of In to Ga and Zn in the metal oxide 432 may be 4:2:3 or in the neighborhood of 4:2:3.

In the case of using an In—M—Zn oxide as the metal oxide 433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 433 may be a metal oxide that is the same type as that of the metal oxide 431.

The metal oxide 431 or the metal oxide 433 does not necessarily contain indium in some cases. For example, the metal oxide 431 or the metal oxide 433 may be gallium oxide.

Figure 15B:
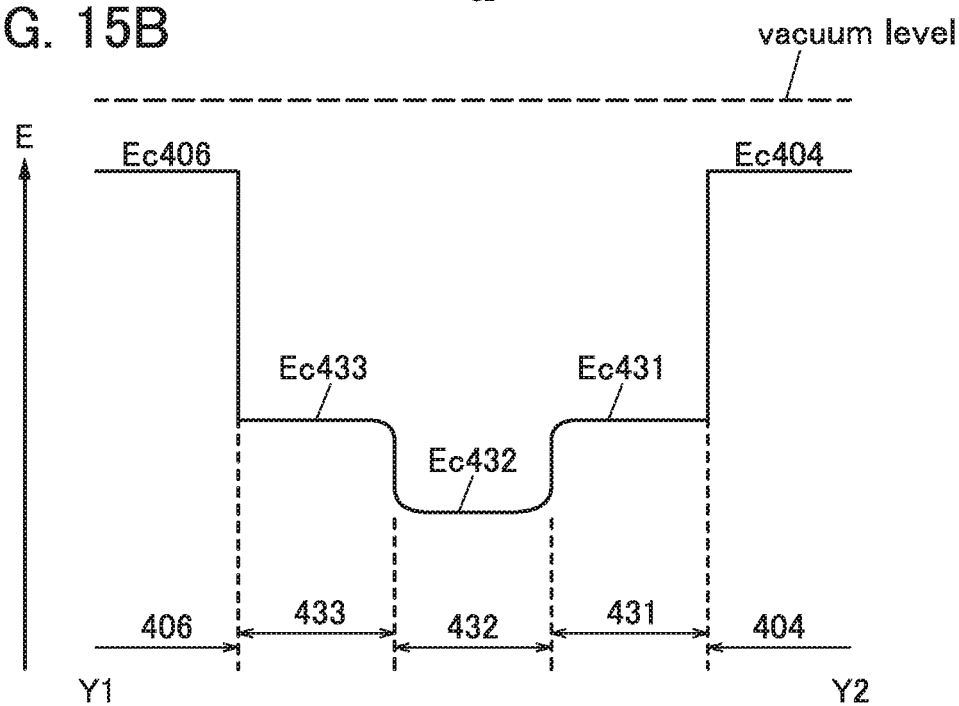
FIG. 15B is an energy band diagram of the transistor.

The function and effect of the metal oxide 430, which includes a stack of the metal oxides 431 to 433, are described with reference to the energy band diagram of FIG. 15B. FIG. 15B shows an energy band structure of a portion taken along dashed line Y1-Y2 in FIG. 15A, that is, the energy band structure of a channel formation region of the transistor 400a and the vicinity thereof.

In FIG. 15B, Ec404, Ec431, Ec432, Ec433, and Ec406 indicate the energies at the bottoms of the conduction bands of the insulating film 404, the metal oxide 431, the metal oxide 432, the metal oxide 433, and the insulating film 406, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 404 and 406 are insulators, Ec406 and Ec404 are closer to the vacuum level (i.e., have a lower electron affinity) than Ec431, Ec432, and Ec433.

The metal oxide 432 is a metal oxide having an electron affinity higher than those of the metal oxides 431 and 433. For example, as the metal oxide 432, a metal oxide having an electron affinity higher than those of the metal oxides 431 and 433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy difference between the vacuum level and the bottom of the conduction band.

At this time, when gate voltage is applied, a channel is formed in the metal oxide 432 having the highest electron affinity among the metal oxides 431 to 433.

At this time, electrons move mainly in the metal oxide 432, not in the metal oxides 431 and 433. Hence, the on-state current of the transistor hardly varies even when the density of interface states, which inhibit electron movement, is high at the interface between the metal oxide 431 and the insulating film 404 or at the interface between the metal oxide 433 and the insulating film 406. The metal oxides 431 and 433 function as an insulating film.

In some cases, there is a mixed region of the metal oxides 431 and 432 between the metal oxides 431 and 432. Furthermore, in some cases, there is a mixed region of the metal oxides 432 and 433 between the metal oxides 432 and 433. Because the mixed region has a low interface state density, a stack of the metal oxides 431 to 433 has a band structure where energy at each interface and in the vicinity of the interface is changed continuously (continuous junction).

As described above, the interface between the metal oxides 431 and 432 or the interface between the metal oxides 432 and 433 has a low interface state density. Hence, electron movement in the metal oxide 432 is less likely to be inhibited and the on-state current of the transistor can be increased.

Electron movement in the transistor is inhibited, for example, in the case where physical surface unevenness in a channel formation region is large. To increase the on-state current of the transistor, for example, the root mean square (RMS) roughness in a measurement area of 1 μm×1 μm of a top surface or a bottom surface of the metal oxide 432 (a formation surface; here, the top surface of the metal oxide 431) is less than 1 nm, preferably less than 0.6 nm, more preferably less than 0.5 nm, still more preferably less than 0.4 nm. The average surface roughness (Ra) in the measurement area of 1 μm×1 μm is less than 1 nm, preferably less than 0.6 nm, more preferably less than 0.5 nm, still more preferably less than 0.4 nm. The maximum peak-to-valley height (P-V) in the measurement area of 1 μm×1 μm is less than 10 nm, preferably less than 9 nm, more preferably less than 8 nm, still more preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 432 contains oxygen vacancies (also denoted by Vo), donor levels are formed by entry of hydrogen into sites of oxygen vacancies in some cases. A state in which hydrogen enters sites of oxygen vacancies is denoted by VoH in the following description in some cases. VoH is a factor of decreasing the on-state current of the transistor because VoH scatters electrons. Note that sites of oxygen vacancies become more stable by entry of oxygen than by entry of hydrogen. Thus, by decreasing oxygen vacancies in the metal oxide 432, the on-state current of the transistor can be increased in some cases.

For example, at a certain depth in the metal oxide 432 or in a certain region of the metal oxide 432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 432, for example, there is a method in which excess oxygen contained in the insulating film 404 is moved to the metal oxide 432 through the metal oxide 431. In that case, the metal oxide 431 is preferably a layer having oxygen permeability (a layer through which oxygen can pass or permeate).

Note that in the case where the transistor has an s-channel structure, a channel is formed in the entire metal oxide 432. Therefore, as the metal oxide 432 has a larger thickness, a channel region becomes larger. In other words, the thicker the metal oxide 432 is, the larger the on-state current of the transistor is.

Moreover, the thickness of the metal oxide 433 is preferably as small as possible to increase the on-state current of the transistor. For example, the metal oxide 433 has a region with a thickness of less than 10 nm, preferably less than or equal to 5 nm, more preferably less than or equal to 3 nm. Meanwhile, the metal oxide 433 has a function of blocking entry of elements other than oxygen (such as hydrogen and silicon) included in the adjacent insulator into the metal oxide 432 where a channel is formed. Thus, the metal oxide 433 preferably has a certain thickness. For example, the metal oxide 433 may have a region with a thickness of greater than or equal to 0.3 nm, preferably greater than or equal to 1 nm, more preferably greater than or equal to 2 nm. The metal oxide 433 preferably has an oxygen blocking property to inhibit outward diffusion of oxygen released from the insulating film 404 and the like.

To improve reliability, preferably, the thickness of the metal oxide 431 is large and the thickness of the metal oxide 433 is small. For example, the metal oxide 431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 431 can increase the distance from the interface between the adjacent insulator and the metal oxide 431 to the metal oxide 432 where a channel is formed. Note that the metal oxide 431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 432 and 431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 432 and 433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 431 and 433 in order to reduce the concentration of hydrogen in the metal oxide 432. The metal oxides 431 and 433 each have a region in which the concentration of hydrogen is higher than or equal to $1\times10^{16}$ atoms/cm$^3$ and lower than or equal to $2\times10^{20}$ atoms/cm$^3$.

The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 431 and 433 in order to reduce the concentration of nitrogen in the metal oxide 432. The metal oxides 431 and 433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 431 to 433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 431 and 432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The crystallinity of the metal oxides 431 and 432 can be increased by the first heat treatment. Furthermore, impurities such as hydrogen and water can be removed by the first heat treatment.

The above three-layer structure is an example. For example, a two-layer structure without the metal oxide 431 or 433 may be employed. Alternatively, the metal oxide given as an example of the metal oxides 431 to 433 may be provided over or under the metal oxide 431 or over or under the metal oxide 433, i.e., a four-layer structure may be employed. Further alternatively, an n-layer structure (n is an integer of 5 or more) in which the metal oxide given as an example of the metal oxides 431 to 433 is provided at two or more of the following positions may be employed: over the metal oxide 431, under the metal oxide 431, over the metal oxide 433, and under the metal oxide 433.

<Substrate>

As the substrate 450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 450. As a method for providing a transistor over a flexible substrate, there is a method in which a transistor is formed over a non-flexible substrate, and then the transistor is separated and transferred to the substrate 450 that is a flexible substrate. In that case, a separation layer is preferably provided between the non-flexible substrate and the transistor. As the substrate 450, a sheet, a film, or foil containing a fiber may be used. The substrate 450 may have elasticity. The substrate 450 may have a property of returning to its original shape when bending or pulling is stopped. Alternatively, the substrate 450 may have a property of not returning to its original shape. The thickness of the substrate 450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 450 has small thickness, the weight of the semiconductor device can be reduced. When the substrate 450 has small thickness, even in the case of using glass or the like, the substrate 450 may have elasticity or a property of returning to its original shape when bending or pulling is stopped. Therefore, an impact applied to the semiconductor device over the substrate 450, which is caused by dropping or the like, can be reduced. That is, a durable semiconductor device can be provided.

For the flexible substrate 450, a metal, an alloy, a resin, glass, or fiber thereof can be used, for example. The flexible substrate 450 preferably has a lower coefficient of linear expansion because deformation due to an environment is suppressed. The flexible substrate 450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 450 because of its low coefficient of linear expansion.

<Base Insulating Film>

The insulating film 401 has a function of electrically isolating the substrate 450 from the conductive film 414.

The insulating film 401 or 402 is formed using an insulating film having a single-layer structure or a layered structure. Examples of the material of the insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 402 may be formed using silicon oxide with high step coverage which is formed by reacting tetraethyl orthosilicate (TEOS), silane, or the like with oxygen, nitrous oxide, or the like.

After the insulating film 402 is formed, the insulating film 402 may be subjected to planarization treatment using a CMP method or the like to improve the planarity of the top surface thereof.

The insulating film 404 preferably contains an oxide. In particular, the insulating film 404 preferably contains an oxide material from which part of oxygen is released by heating. The insulating film 404 preferably contains an oxide containing oxygen more than that in the stoichiometric composition. Part of oxygen is released by heating from an oxide film containing oxygen more than that in the stoichiometric composition. Oxygen released from the insulating film 404 is supplied to the metal oxide 430, so that oxygen vacancies in the metal oxide 430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 404 preferably contains an oxide that can supply oxygen to the metal oxide 430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 404.

To make the insulating film 404 contain excess oxygen, the insulating film 404 is formed in an oxygen atmosphere, for example. Alternatively, a region containing excess oxygen may be formed by introducing oxygen into the insulating film 404 that has been formed. Both the methods may be combined.

For example, oxygen (at least including any of oxygen radicals, oxygen atoms, and oxygen ions) may be introduced into the insulating film 404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 404 is formed, the insulating film 404 may be subjected to planarization treatment using a CMP method or the like to improve the planarity of the top surface thereof.

The insulating film 403 has a passivation function of preventing oxygen contained in the insulating film 404 from decreasing by bonding to metal contained in the conductive film 414.

The insulating film 403 has a function of blocking oxygen, hydrogen, water, alkali metal, alkaline earth metal, and the like. Providing the insulating film 403 can prevent outward diffusion of oxygen from the metal oxide 430 and entry of hydrogen, water, or the like into the metal oxide 430 from the outside.

The insulating film 403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 400a can be controlled by injecting electrons into a charge trap layer. The charge trap layer is preferably provided in the insulating film 402 or the insulating film 403. For example, when the insulating film 403 is formed using hafnium oxide, aluminum oxide, tantalum oxide, aluminum silicate, or the like, the insulating film 403 can function as a charge trap layer.

<Gate Electrode>

The conductive films 411 to 414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

<Source Electrode and Drain Electrode>

The conductive films 421 to 424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu-Mn alloy, in which case manganese oxide formed at the interface with an insulator containing oxygen has a function of preventing Cu diffusion.

<Low-Resistance Region>

The regions 441 and 442 are formed when, for example, the conductive films 421 and 423 extract oxygen from the metal oxides 431 and 432. Oxygen is more likely to be extracted at higher temperatures. Oxygen vacancies are formed in the regions 441 and 442 through several heating steps in the manufacturing process of the transistor. In addition, hydrogen enters sites of the oxygen vacancies by heating, increasing the carrier concentration in the regions 441 and 442. As a result, the resistance of the regions 441 and 442 is reduced.

<Gate Insulating Film>

The insulating film 406 preferably contains an insulator with a high relative dielectric constant. For example, the insulating film 406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 406 preferably has a layered structure containing silicon oxide or silicon oxynitride and an insulator with a high relative dielectric constant. Because silicon oxide and silicon oxynitride have thermal stability, a combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 433, entry of silicon from silicon oxide or silicon oxynitride into the metal oxide 432 can be suppressed.

When silicon oxide or silicon oxynitride is closer to the metal oxide 433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<Interlayer Insulating Film and Protective Insulating Film>

The insulating film 405 preferably contains an insulator with a low relative dielectric constant. For example, the insulating film 405 preferably contains silicon oxide, silicon oxynitride, silicon nitride oxide, silicon nitride, or a resin. Alternatively, the insulating film 405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 407 has a function of blocking oxygen, hydrogen, water, alkali metal, alkaline earth metal, and the like. Providing the insulating film 407 can prevent outward diffusion of oxygen from the metal oxide 430 and entry of hydrogen, water, or the like into the metal oxide 430 from the outside.

The insulating film 407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 407 because it is highly effective in preventing permeation of both oxygen and impurities such as hydrogen and moisture.

When the insulating film 407 is formed by a method using plasma containing oxygen, e.g., by a sputtering method or a CVD method, oxygen can be added to side and top surfaces of the insulating films 405 and 406. It is preferable to perform second heat treatment at any time after the formation of the insulating film 407. Through the second heat treatment, oxygen added to the insulating films 405 and 406 is diffused through the insulating films to reach the metal oxide 430, whereby oxygen vacancies in the metal oxide 430 can be reduced.

Figure 16A:
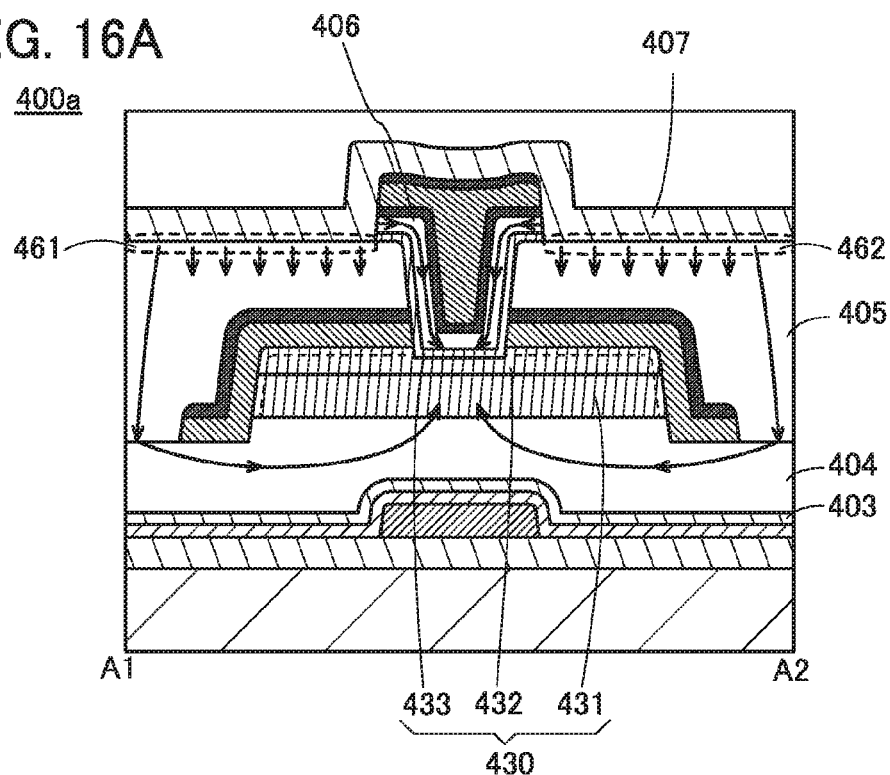
FIGS. 16A and 16B are cross-sectional views illustrating oxygen diffusion paths in a transistor.
Figure 16B:
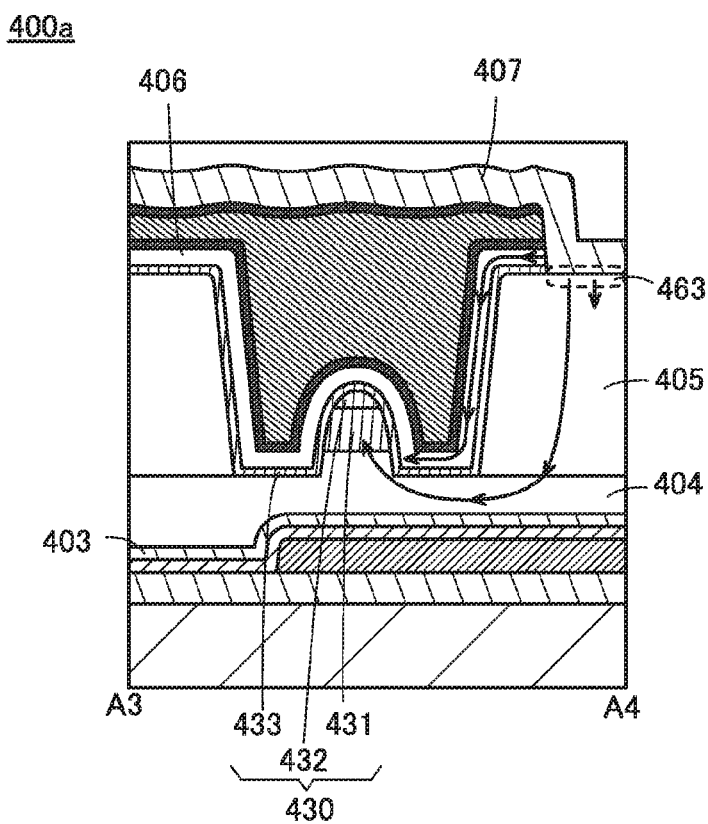

In schematic views of FIGS. 16A and 16B, oxygen added to the insulating films 405 and 406 in the formation of the insulating film 407 is diffused through the insulating films by the second heat treatment and reaches the metal oxide 430. In FIG. 16A, oxygen diffusion in the cross-sectional view of FIG. 14B is indicated by arrows. In FIG. 16B, oxygen diffusion in the cross-sectional view of FIG. 14C is indicated by arrows.

As illustrated in FIGS. 16A and 16B, oxygen added to the side surface of the insulating film 406 is diffused in the insulating film 406 and reaches the metal oxide 430. In addition, a region 461, a region 462, and a region 463 each containing excess oxygen are sometimes formed in the vicinity of the interface between the insulating films 407 and 405. Oxygen contained in the regions 461 to 463 reaches the metal oxide 430 through the insulating films 405 and 404. In the case where the insulating film 405 includes silicon oxide and the insulating film 407 includes aluminum oxide, a mixed layer of silicon, aluminum, and oxygen is formed in the regions 461 to 463 in some cases.

The insulating film 407 has a function of blocking oxygen and prevents oxygen from being diffused upward across the insulating film 407. The insulating film 403 also has a function of blocking oxygen and prevents oxygen from being diffused downward across the insulating film 403.

Note that the second heat treatment may be performed at a temperature that allows oxygen added to the insulating films 405 and 406 to be diffused to the metal oxide 430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 404 can be inhibited. Note that the second heat treatment is not necessarily performed when heating during formation of the films can work as heat treatment comparable to the second heat treatment.

As described above, oxygen can be supplied to the metal oxide 430 from above and below by the formation of the insulating film 407 and the second heat treatment.

Alternatively, oxygen can be added to the insulating films 405 and 406 by forming a film containing indium oxide, e.g., an In—M—Zn oxide, as the insulating film 407.

The insulating film 408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 408, a resin such as a polyimide resin, a polyamide resin, an acrylic resin, a siloxane resin, an epoxy resin, or a phenol resin can be used. The insulating film 408 may be a stack including any of the above materials.

<<Structural Example 2 of Transistor>>

The conductive film 414 and the insulating films 402 and 403 can be omitted in the transistor 400*a* illustrated in FIGS. 14A to 14C. An example of such a structure is illustrated in FIGS. 17A to 17C.

FIGS. 17A to 17C are a top view and cross-sectional views of a transistor 400*b*. FIG. 17A is a top view. FIG. 17B is a cross-sectional view taken along dashed-dotted line A1-A2 in FIG. 17A, and FIG. 17C is a cross-sectional view taken along dashed-dotted line A3-A4 in FIG. 17A. Note that for simplification of the drawing, some components are not illustrated in the top view in FIG. 17A. Note that the dashed-dotted line A1-A2 and the dashed-dotted line A3-A4 are sometimes referred to as a channel length direction of the transistor 400*b* and a channel width direction of the transistor 400*b*, respectively.

<<Structural Example 3 of Transistor>>

In the transistor 400*a* illustrated in FIGS. 14A to 14C, parts of the conductive films 421 and 423 that overlap with the gate electrode (the conductive films 411 to 413) can be reduced in thickness. An example of such a structure is illustrated in FIGS. 18A to 18C.

Figure 18A:
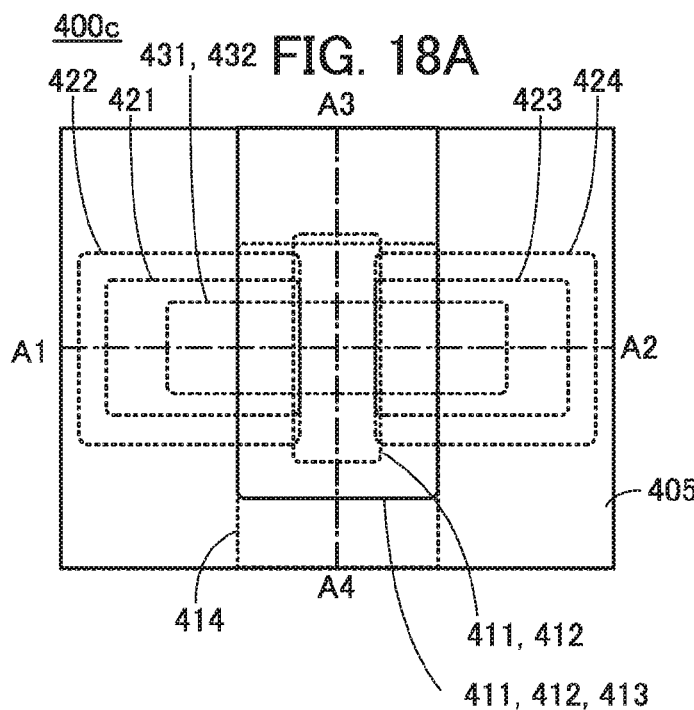
FIGS. 18A to 18C are a top view and cross-sectional views illustrating a structural example of a transistor.
Figure 18B:
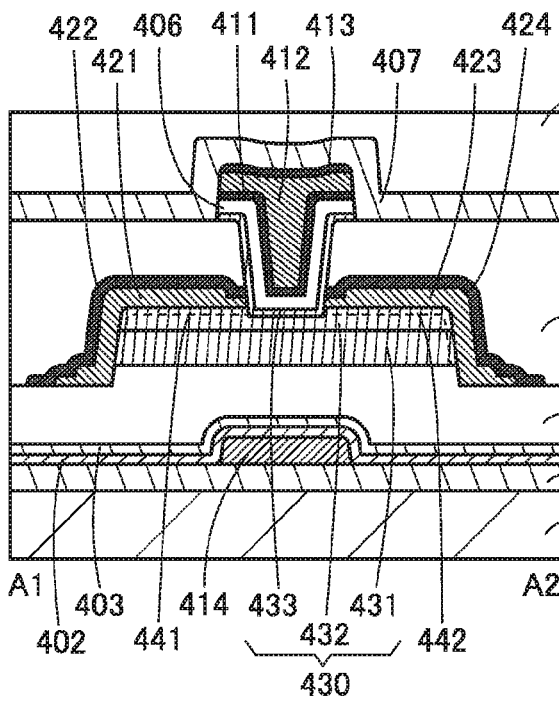
Figure 18C:
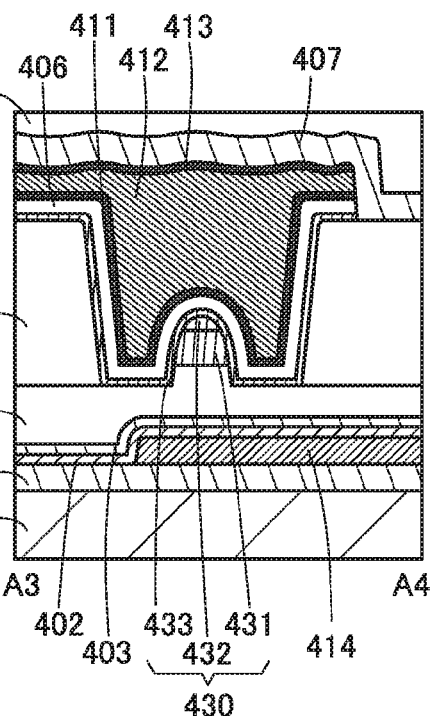

FIGS. 18A to 18C are a top view and cross-sectional views of a transistor 400*c*. FIG. 18A is a top view. FIG. 18B is a cross-sectional view taken along dashed-dotted line A1-A2 in FIG. 18A, and FIG. 18C is a cross-sectional view taken along dashed-dotted line A3-A4 in FIG. 18A. Note that for simplification of the drawing, some components are not illustrated in the top view in FIG. 18A. Note that the dashed-dotted line A1-A2 and the dashed-dotted line A3-A4 are sometimes referred to as a channel length direction of the transistor 400*c* and a channel width direction of the transistor 400*c*, respectively.

In the transistor 400*c* illustrated in FIG. 18B, part of the conductive film 421 that overlaps with the gate electrode is reduced in thickness, and the conductive film 422 covers the conductive film 421. Part of the conductive film 423 that overlaps with the gate electrode is also reduced in thickness, and the conductive film 424 covers the conductive film 423.

The transistor 400*c*, which has the structure illustrated in FIG. 18B, can have an insulating film with an increased thickness between the gate and source electrodes or between the gate and drain electrodes. This results in a reduction in the parasitic capacitance formed between the gate electrode and the source and drain electrodes. As a result, a transistor capable of high-speed operation can be obtained.

<<Structural Example 4 of Transistor>>

Figure 19A:
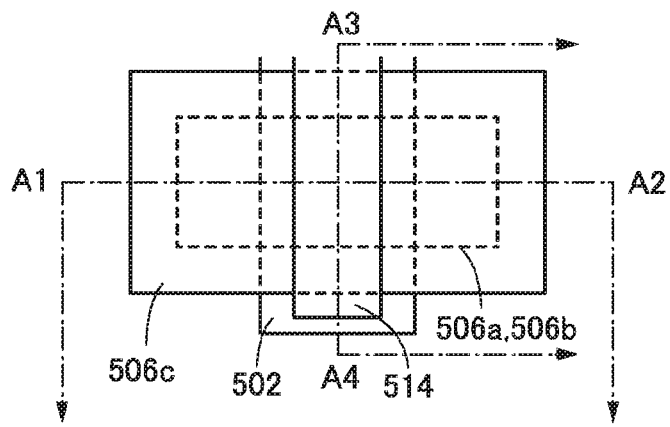
FIGS. 19A to 19D are a top view and cross-sectional views illustrating a structural example of a transistor.
Figure 19B:
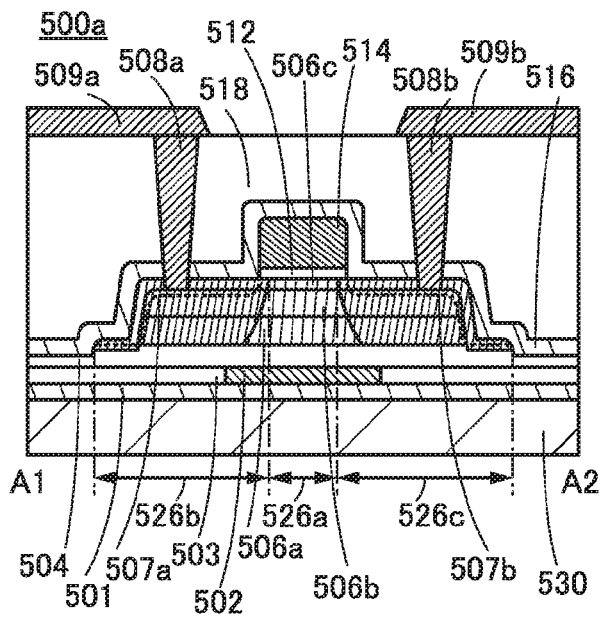
Figure 19C:
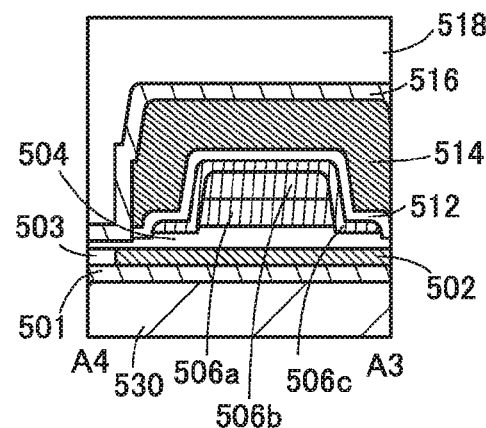

FIG. 19A is a top view of a transistor 500*a*. FIG. 19B is a cross-sectional view taken along dashed-dotted line A1-A2 in FIG. 19A. FIG. 19C is a cross-sectional view taken along dashed-dotted line A3-A4 in FIG. 19A. Note that a region along dashed-dotted line A1-A2 shows a structure of the transistor 500*a* in the channel length direction, and a region along dashed-dotted line A30-A4 shows a structure of the transistor 500*a* in the channel width direction. Note that in FIG. 19A, some components of the transistor 500*a* are not illustrated in order to avoid complexity.

The transistor 500*a* includes a metal oxide 506*a*, a metal oxide 506*b*, a metal oxide 506*c*, a conductive film 514, an insulating film 512, and an insulating film 516. The metal oxide 506*b* is provided over the metal oxide 506*a*. The metal oxide 506*c* is provided over the metal oxide 506*b*. The insulating film 512 is provided over the metal oxide 506*c*. The conductive film 514 is provided over the insulating film 512. The insulating film 516 is provided over the conductive film 514. A region of the insulating film 516 is in contact with a top surface of the metal oxide 506*c*. A region of the metal oxide 506*b* overlaps with the conductive film 514 with the metal oxide 506*c* and the insulating film 512 therebetween. As illustrated in the top view in FIG. 19A, it is preferable that the periphery of the metal oxide 506*a* be substantially aligned with the periphery of the metal oxide 506*b* and that the periphery of the metal oxide 506*c* be positioned outward from the peripheries of the metal oxide 506*a* and the metal oxide 506*b*.

For example, as illustrated in FIGS. 19A to 19C, the transistor 500*a* includes an insulating film 501, a conductive film 502, an insulating film 503, and an insulating film 504 which are formed over a substrate 530; the metal oxide 506*a*, the metal oxide 506*b*, and the metal oxide 506*c* which are formed over the insulating film 504; the insulating film 512 and the conductive film 514 which are formed over the metal oxide 506*c*; and the insulating film 516, an insulating film 518, a plug 508*a*, a plug 508*b*, a conductive film 509*a*, and a conductive film 509*b* which are formed over the conductive film 514.

Although the periphery of the metal oxide 506*c* is positioned outward from the periphery of the metal oxide 506*a* in FIGS. 19B and 19C, the structure of the transistor described in this embodiment is not limited thereto. For example, the periphery of the metal oxide 506*a* may be positioned outward from the periphery of the metal oxide 506*c*, or a side surface of an end portion of the metal oxide 506*a* may be substantially aligned with a side surface of an end portion of the metal oxide 506*c*.

In the metal oxide 506*a*, the metal oxide 506*b*, and the metal oxide 506*c* of the transistor 500*a* described in this embodiment, a region 526*a*, a region 526*b*, and a region 526*c* are formed, and the region 526*b* and the region 526*c* have a higher dopant concentration and a lower resistance than the region 526*a*. The dopant concentration in the region 526*a* is, for example, less than or equal to 5%, less than or equal to 2%, or less than or equal to 1%, of the maximum dopant concentration in the region 526*b* or the region 526*c*. Instead of the term "dopant," the term "donor," "acceptor," "impurity," or "element" may be used.

Figure 19D:
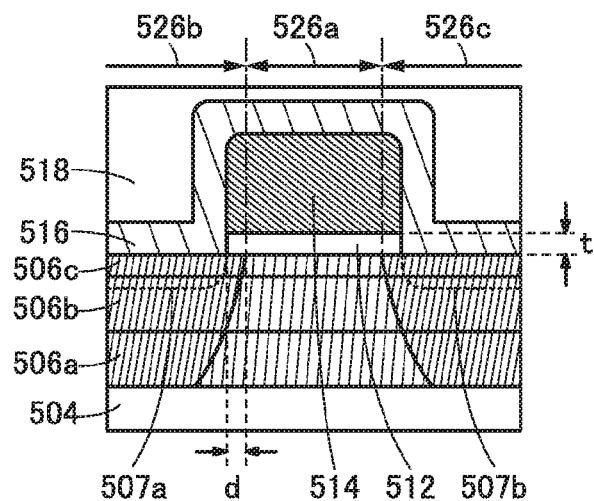

FIG. 19D shows an enlarged view of the conductive film 514 and the vicinity thereof in the transistor 500*a* in FIG. 19B. As illustrated in FIG. 19D, the region 526*a* is a region substantially overlapping with the conductive film 514, and the region 526*b* and the region 526*c* are regions except the region 526*a* in the metal oxide 506*a*, the metal oxide 506*b*, and the metal oxide 506*c*. It is preferable that the region 526*b* and the region 526*c* partly overlap with a region (channel formation region) in which the metal oxide 506*b* overlaps with the conductive film 514. For example, side surfaces of end portions of the region 526*b* and the region 526*c* in the channel length direction are preferably positioned inward from a side surface of an end portion of the conductive film 514 by a distance d. In this case, the distance d preferably satisfies $0.25t<d<t$, where t represents the thickness of the insulating film 512.

As described above, the region 526*b* and the region 526*c* are partly formed in a region in which the metal oxide 506*a*, the metal oxide 506*b*, and the metal oxide 506*c* overlap with the conductive film 514. Accordingly, the channel formation region of the transistor 500*a* is in contact with the regions 526*b* and 526*c* having low resistance, and thus, high-resistance offset regions are not formed between the region 526a and the regions 526b and 526c. As a result, the on-state current of the transistor 500a can be increased.

The region 526b and the region 526c may be formed by ion doping treatment such as an ion implantation method. In this case, at least part of the regions 526b and 526c in the metal oxide 506a or the metal oxide 506b preferably overlaps with the conductive film 514.

Examples of the dopant include hydrogen, helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, neon, argon, krypton, xenon, nitrogen, fluorine, phosphorus, chlorine, arsenic, and boron are preferable because these elements can be added relatively easily by an ion implantation method, an ion doping method, a plasma immersion ion implantation method, or the like.

A low-resistance region 507a and a low-resistance region 507b are preferably formed in the metal oxide 506a, the metal oxide 506b, and the metal oxide 506c in the vicinity of the interface with the insulating film 516 (indicated by dotted lines in FIG. 19B). The low-resistance region 507a and the low-resistance region 507b contain at least one of the elements contained in the insulating film 516. It is preferable that the low-resistance region 507a and the low-resistance region 507b be partly and substantially in contact with a region (channel formation region) of the metal oxide 506b overlapping with the conductive film 514 or partly overlap with the region.

Since a large region of the metal oxide 506c is in contact with the insulating film 516, the low-resistance region 507a and the low-resistance region 507b are likely to be formed in the metal oxide 506c. The concentration of the element contained in the insulating film 516 is higher in the low-resistance region 507a and the low-resistance region 507b included in the metal oxide 506c than in a region of the metal oxide 506c other than the low-resistance region 507a and the low-resistance region 507b (e.g., a region of the metal oxide 506c overlapping with the conductive film 514).

The low-resistance region 507a is formed in the region 526b, and the low-resistance region 507b is formed in the region 526c. In an ideal structure, the concentration of an added element is the highest in the low-resistance regions 507a and 507b, the second highest in regions in the regions 526b and 526c except the low-resistance regions 507a and 507b, and the lowest in the region 526a. Here, the added element includes the dopant for forming the region 526b and the region 526c and the element added from the insulating film 516 to the low-resistance region 507a and the low-resistance region 507b.

The formation of the region 526b, the region 526c, the low-resistance region 507a, and the low-resistance region 507b leads to a reduction in contact resistance between the plug 508a or the plug 508b and the metal oxide 506a, the metal oxide 506b, or the metal oxide 506c, whereby the transistor 500a can have higher on-state current.

Although the low-resistance regions 507a and 507b are formed in the transistor 500a in FIGS. 19A to 19D, the structure of the semiconductor device described in this embodiment is not necessarily limited thereto. For example, in the case where the regions 526b and 526c have sufficiently low resistance, the low-resistance regions 507a and 507b need not be formed.

The conductive film 514 serves as a gate electrode of the transistor 500a. The description of the conductive films 411 to 413 in FIGS. 14A to 14C can be referred to for the details of the conductive film 514.

The conductive film 502 serves as a second gate electrode of the transistor 500a. The description of the conductive film 414 in FIGS. 14A to 14C can be referred to for the details of the conductive film 502.

The plugs 508a and 508b and the conductive films 509a and 509b serve as source and drain electrodes of the transistor 500a. The description of the conductive films 421 and 423 in FIGS. 14A to 14C can be referred to for the details of the plugs 508a and 508b and the conductive films 509a and 509b.

The insulating film 512 serves as a gate insulating film of the transistor 500a. The description of the insulating film 406 in FIGS. 14A to 14C can be referred to for the details of the insulating film 512.

The description of the metal oxide 431 in FIGS. 14A to 14C can be referred to for the details of the metal oxide 506a. Similarly, the description of the metal oxide 432 in FIGS. 14A to 14C can be referred to for the details of the metal oxide 506b. Similarly, the description of the metal oxide 433 in FIGS. 14A to 14C can be referred to for the details of the metal oxide 506c.

Besides, the description of the substrate 450 in FIGS. 14A to 14C, the description of the insulating film 401 in FIGS. 14A to 14C, the description of the insulating film 402 in FIGS. 14A to 14C, the description of the insulating film 404 in FIGS. 14A to 14C, the description of the insulating film 407 in FIGS. 14A to 14C, and the description of the insulating film 408 in FIGS. 14A to 14C can be referred to for the substrate 530, the insulating film 501, the insulating film 503, the insulating film 504, the insulating film 516, and the insulating film 518, respectively.

<<Structural Example 5 of Transistor>>

Figure 20A:
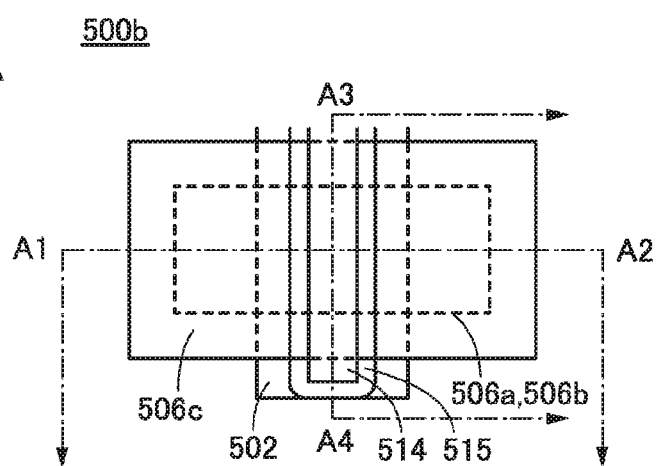
FIGS. 20A to 20D are a top view and cross-sectional views illustrating a structural example of a transistor.
Figure 20B:
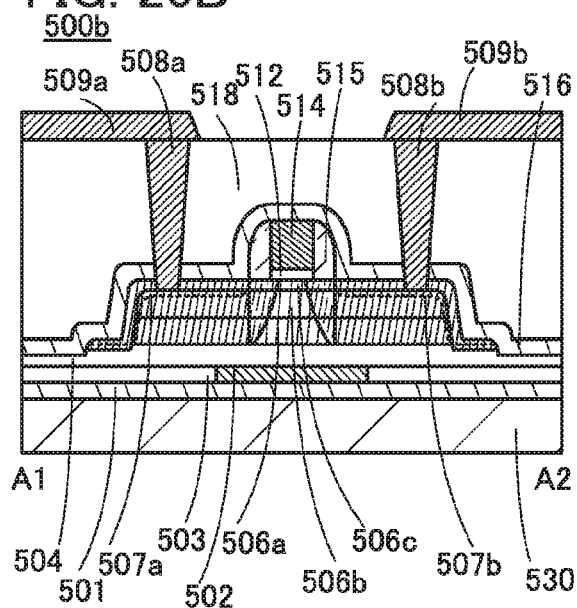
Figure 20C:
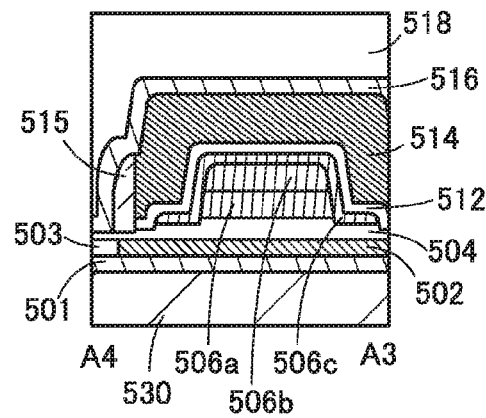

FIG. 20A is a top view of a transistor 500b. FIG. 20B is a cross-sectional view taken along dashed-dotted line A1-A2 in FIG. 20A. FIG. 20C is a cross-sectional view taken along dashed-dotted line A3-A4 in FIG. 20A. Note that a region along dashed-dotted line A1-A2 shows a structure of the transistor 500b in the channel length direction, and a region along dashed-dotted line A3-A4 shows a structure of the transistor 500b in the channel width direction. Note that in FIG. 20A, some components of the transistor 500b are not illustrated in order to avoid complexity.

Figure 20D:
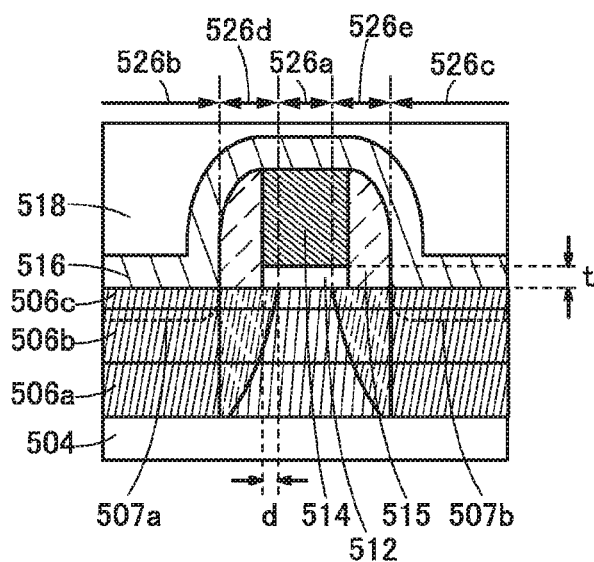

FIG. 20D shows an enlarged view of the conductive film 514 and the vicinity thereof in the transistor 500b in FIG. 20B. As illustrated in FIG. 20D, in the metal oxide 506a, the metal oxide 506b, and the metal oxide 506c of the transistor 500b described in this embodiment, the region 526a, the region 526b, the region 526c, a region 526d, and a region 526e are formed. The region 526b, the region 526c, the region 526d, and the region 526e have a higher dopant concentration and a lower resistance than the region 526a. Furthermore, the region 526b and the region 526c have a higher hydrogen concentration and a lower resistance than the region 526d and the region 526e. The dopant concentration in the region 526a is, for example, less than or equal to 5%, less than or equal to 2%, or less than or equal to 1%, of the maximum dopant concentration in the region 526b or the region 526c. Instead of the term "dopant," the term "donor," "acceptor," "impurity," or "element" may be used.

As illustrated in FIG. 20D, the region 526a is a region substantially overlapping with the conductive film 514, and the region 526b, the region 526c, the region 526d, and the region 526e are regions except the region 526a in the metal oxide 506a, the metal oxide 506b, and the metal oxide 506c. In the regions 526b and 526c, the top surface of the metal oxide 506c is in contact with the insulating film 516. In the regions 526d and 526e, the top surface of the metal oxide 506c is in contact with a sidewall insulating layer 515 or the insulating film 512. Thus, as illustrated in FIG. 20D, the boundary between the region 526b and the region 526d overlaps with the boundary between the insulating film 516 and an end portion of a side surface of the sidewall insulating layer 515. The same applies to the boundary between the regions 526c and 526e. It is preferable that the region 526d and the region 526e partly overlap with a region (channel formation region) in which the metal oxide 506b overlaps with the conductive film 514. For example, side surfaces of end portions of the region 526d and the region 526e in the channel length direction are preferably positioned inward from a side surface of an end portion of the conductive film 514 by a distance d. In this case, the distance d preferably satisfies $0.25t<d<t$, where t represents the thickness of the insulating film 512.

As described above, the region 526d and the region 526e are partly formed in a region in which the metal oxide 506a, the metal oxide 506b, and the metal oxide 506c overlap with the conductive film 514. Accordingly, the channel formation region of the transistor 500b is in contact with the regions 526d and 526e having low resistance, and thus, high-resistance offset regions are not formed between the region 526a and the regions 526d and 526e. As a result, the on-state current of the transistor 500b can be increased.

The region 526b, the region 526c, the region 526d, and the region 526e are formed by ion doping treatment such as an ion implantation method. In this case, at least part of the regions 526d and 526e in the metal oxide 506a or the metal oxide 506b preferably overlaps with the conductive film 514.

Examples of the dopant include hydrogen, helium, neon, argon, krypton, xenon, nitrogen, fluorine, phosphorus, chlorine, arsenic, boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. Among these elements, helium, neon, argon, krypton, xenon, nitrogen, fluorine, phosphorus, chlorine, arsenic, and boron are preferable because these elements can be added relatively easily by an ion implantation method, an ion doping method, a plasma immersion ion implantation method, or the like.

The low-resistance region 507a and the low-resistance region 507b are preferably formed in the metal oxide 506a, the metal oxide 506b, and the metal oxide 506c in the vicinity of the interface with the insulating film 516 (indicated by dotted lines in FIG. 20B). The low-resistance region 507a and the low-resistance region 507b contain at least one of the elements contained in the insulating film 516. It is preferable that the low-resistance region 507a and the low-resistance region 507b be partly and substantially in contact with a region (channel formation region) of the metal oxide 506b overlapping with the conductive film 514 or partly overlap with the region.

Since a large region of the metal oxide 506c is in contact with the insulating film 516, the low-resistance region 507a and the low-resistance region 507b are likely to be formed in the metal oxide 506c. The concentration of the element contained in the insulating film 516 is higher in the low-resistance region 507a and the low-resistance region 507b included in the metal oxide 506c than in a region of the metal oxide 506c other than the low-resistance region 507a and the low-resistance region 507b (e.g., a region of the metal oxide 506c overlapping with the conductive film 514).

The low-resistance region 507a is formed in the region 526b and the low-resistance region 507b is formed in the region 526c. In an ideal structure, the concentration of an added element is the highest in the low-resistance regions 507a and 507b, the second highest in regions in the regions 526b, 526c, 526d, and 526e except the low-resistance regions 507a and 507b, and the lowest in the region 526a. Here, the added element includes the dopant for forming the region 526b and the region 526c and the element added from the insulating film 516 to the low-resistance region 507a and the low-resistance region 507b.

The formation of the region 526b, the region 526c, the region 526d, the region 526e, the low-resistance region 507a, and the low-resistance region 507b leads to a reduction in contact resistance between the plug 508a or the plug 508b and the metal oxide 506a, the metal oxide 506b, or the metal oxide 506c, whereby the transistor 500b can have higher on-state current.

Although the low-resistance regions 507a and 507b are formed in the transistor 500b in FIGS. 20A to 20D, the structure of the semiconductor device described in this embodiment is not necessarily limited thereto. For example, in the case where the regions 526b and 526c have sufficiently low resistance, the low-resistance regions 507a and 507b need not be formed.

The sidewall insulating layer 515 may be formed using, for example, a material such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The description of the transistor 500a can be referred to for the details of the other components of the transistor 500b.

<<Structural Example 6 of Transistor>>

Figure 21A:
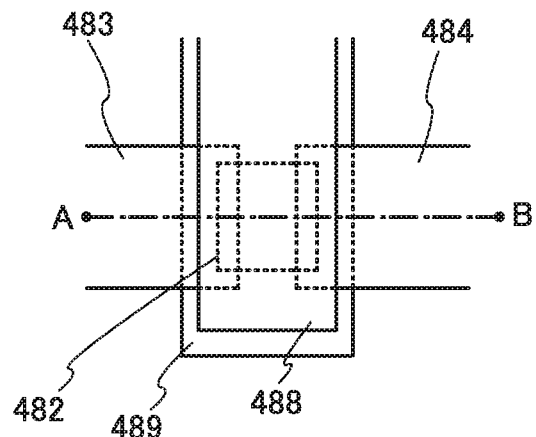
FIGS. 21A and 21B are a top view and a cross-sectional view illustrating a structural example of a transistor.
Figure 21B:
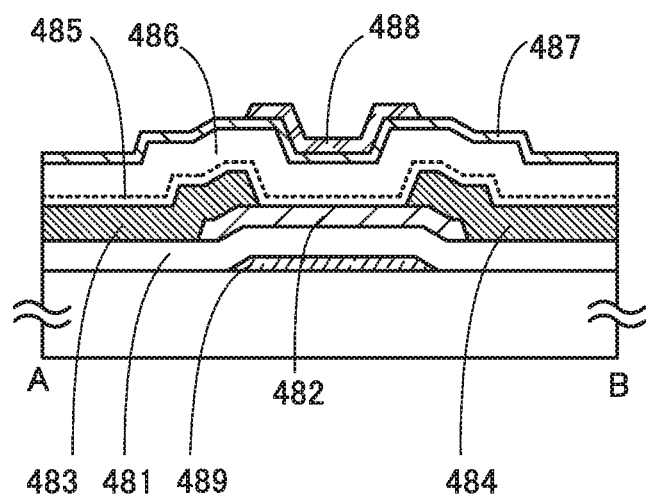

FIGS. 21A and 21B are a top view and a cross-sectional view of a transistor 480. FIG. 21A is a top view, and FIG. 21B is a cross-sectional view taken along dashed-dotted line A-B in FIG. 21A. Note that for simplification of the drawings, some components are increased or reduced in size, or omitted in FIGS. 21A and 21B. Note that the direction of the dashed-dotted line A-B is sometimes referred to as a channel length direction.

The transistor 480 illustrated in FIG. 21B includes a conductive film 489 serving as a first gate, a conductive film 488 serving as a second gate, a semiconductor 482, a conductive film 483 and a conductive film 484 serving as a source and a drain, an insulating film 481, an insulating film 485, an insulating film 486, and an insulating film 487.

The conductive film 489 is on an insulating surface. The conductive film 489 overlaps with the semiconductor 482 with the insulating film 481 provided therebetween. The conductive film 488 overlaps with the semiconductor 482 with the insulating films 485, 486, and 487 provided therebetween. The conductive films 483 and 484 are connected to the semiconductor 482.

The description of the conductive films 411 to 414 in FIGS. 14A to 14C can be referred to for the details of the conductive films 489 and 488.

The conductive films 489 and 488 may be supplied with different potentials, or may be supplied with the same potential at the same time. The conductive film 488 serving as a second gate electrode in the transistor 480 leads to stabilization of threshold voltage. Note that the conductive film 488 is unnecessary in some cases.

The description of the metal oxide 432 in FIGS. 14A to 14C can be referred to for the details of the semiconductor 482. The semiconductor 482 may be a single layer or a stack including a plurality of semiconductor layers.

The description of the conductive films 421 to 424 in FIGS. 14A to 14C can be referred to for the details of the conductive films 483 and 484.

The description of the insulating film 406 in FIGS. 14A to 14C can be referred to for the details of the insulating film 481.

The insulating films 485 to 487 are sequentially stacked over the semiconductor 482 and the conductive films 483 and 484 in FIG. 21B; however, an insulating film provided over the semiconductor 482 and the conductive films 483 and 484 may be a single layer or a stack including a plurality of insulating films.

In the case of using an oxide semiconductor as the semiconductor 482, the insulating film 486 preferably contains oxygen at a proportion higher than or equal to that in the stoichiometric composition and has a function of supplying part of oxygen to the semiconductor 482 by heating. Note that in the case where the provision of the insulating film 486 directly on the semiconductor 482 causes damage to the semiconductor 482 at the time of formation of the insulating film 486, the insulating film 485 is preferably provided between the semiconductor 482 and the insulating film 486, as illustrated in FIG. 21B. The insulating film 485 preferably allows oxygen to pass therethrough, and causes little damage to the semiconductor 482 when the insulating film 485 is formed compared with the case of the insulating film 486. If damage to the semiconductor 482 can be reduced and the insulating film 486 can be formed directly on the semiconductor 482, the insulating film 485 is not necessarily provided.

For the insulating films 486 and 485, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 487 preferably has an effect of blocking diffusion of oxygen, hydrogen, and water. Alternatively, the insulating film 487 preferably has an effect of blocking diffusion of hydrogen and water.

As an insulating film has higher density and becomes denser or has a fewer dangling bonds and becomes more chemically stable, the insulating film has a more excellent blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 487 has an effect of blocking diffusion of water, hydrogen, and the like, impurities such as water and hydrogen that exist in a resin in a panel or exist outside the panel can be prevented from entering the semiconductor 482. In the case where an oxide semiconductor is used as the semiconductor 482, part of water or hydrogen that enters the oxide semiconductor serves as an electron donor (donor). Thus, the use of the insulating film 487 having the blocking effect can prevent a shift in the threshold voltage of the transistor 480 due to generation of donors.

In addition, in the case where an oxide semiconductor is used as the semiconductor 482, the insulating film 487 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 480 due to generation of donors can be prevented.

(Embodiment 3)

In this embodiment, configuration examples of a device that can be applied to the semiconductor device 100 described in Embodiment 1 will be described with reference to FIGS. 22A and 22B, FIGS. 23A and 23B, and FIGS. 24A and 24B.

<<Chip Configuration Example 1>>

FIGS. 22A and 22B are cross-sectional views showing an example in which the semiconductor device 100 is formed in one chip. FIG. 22A illustrates a cross section in a channel length direction of a transistor included in the semiconductor device 100. FIG. 22B illustrates a cross section in a channel width direction of the transistor included in the semiconductor device 100. Note that FIGS. 22A and 22B illustrate cross sections of components of the memory cell MC1 of the semiconductor device 100 (including the transistor M0, the switch S0, and the capacitor C0).

The semiconductor device 100 illustrated in FIGS. 22A and 22B includes layers 781 to 789 in order from the bottom.

The layer 781 includes a substrate 700, the transistor M0 formed using the substrate 700, an element isolation layer 701, and a plurality of plugs such as a plug 710 and a plug 711.

The layer 782 includes a plurality of wirings such as a wiring 730 and a wiring 731.

The layer 783 includes a plurality of plugs such as a plug 712 and a plug 713 and a plurality of wirings (not illustrated).

The layer 784 includes an insulating film 702, an insulating film 703, an insulating film 704, the switch S0, an insulating film 705, and a plurality of plugs such as a plug 714 and a plug 715.

The layer 785 includes a plurality of wirings such as a wiring 732 and a wiring 733.

The layer 786 includes a plurality of plugs such as a plug 716 and a plurality of wirings (not illustrated).

The layer 787 includes a plurality of wirings such as a wiring 734.

The layer 788 includes the capacitor C0 and a plurality of plugs such as a plug 717. The capacitor C0 includes a first electrode 751, a second electrode 752, and an insulating film 753.

The layer 789 includes a plurality of wirings such as a wiring 735.

The OS transistor described in Embodiment 2 is preferably used as the switch S0. In FIGS. 22A and 22B, the transistor 400c illustrated in FIGS. 18A to 18C is used as the switch S0.

The transistor M0 is preferably formed using a semiconductor material different from that for the switch S0. In FIGS. 22A and 22B, a Si transistor is used as the transistor M0.

As the substrate 700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, or a base film may be used as the substrate 700. Alternatively, a semiconductor element may be formed using one substrate, and then transferred to another substrate. In FIGS. 22A and 22B, as an example, a single crystal silicon wafer is used as the substrate 700.

Figure 23A:
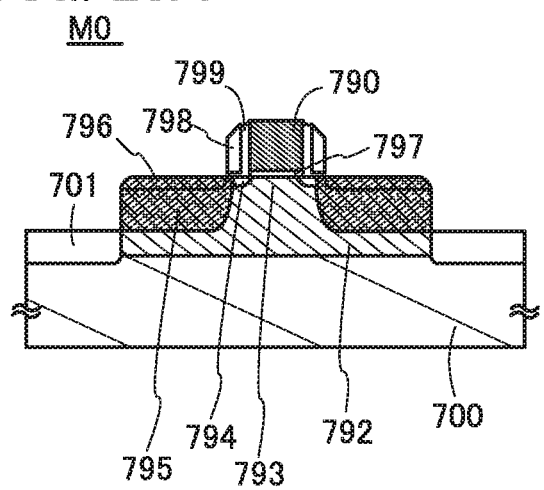
FIGS. 23A and 23B are cross-sectional views illustrating a structural example of a transistor.
Figure 23B:
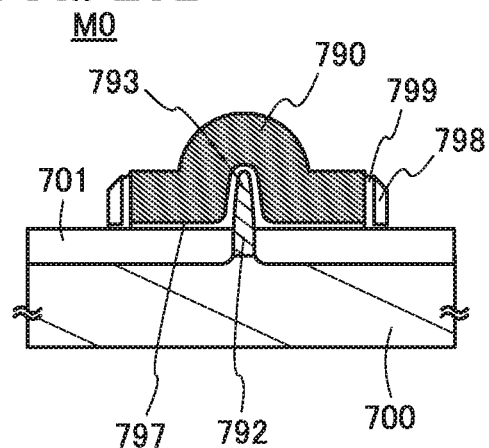

The transistor M0 is described in detail with reference to FIGS. 23A and 23B. FIG. 23A is a cross-sectional view of the transistor M0 in the channel length direction, and FIG. 23B is a cross-sectional view of the transistor M0 in the channel width direction. The transistor M0 includes a channel formation region 793 formed in a well 792, low-concentration impurity regions 794 and high-concentration impurity regions 795 (also collectively referred to as an impurity region simply), conductive regions 796 provided in contact with the impurity region, a gate insulating film 797 provided over the channel formation region 793, a gate electrode 790 provided over the gate insulating film 797, and sidewall insulating layers 798 and 799 provided on side surfaces of the gate electrode 790. Note that the conductive regions 796 can be formed using metal silicide or the like.

In the transistor M0 in FIG. 23B, the channel formation region 793 has a projecting portion, and the gate insulating film 797 and the gate electrode 790 are provided along side and top surfaces of the channel formation region 793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 24A:
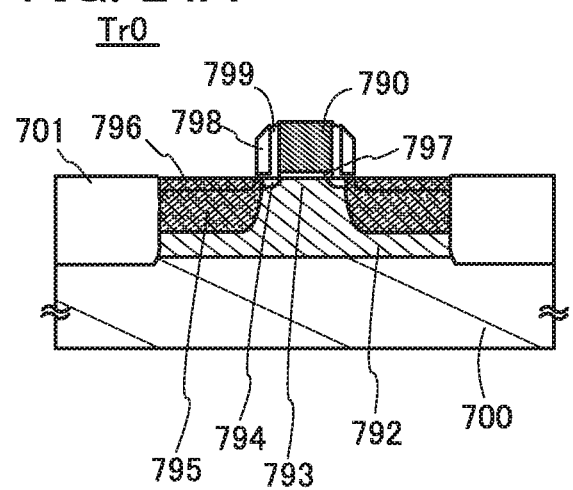
FIGS. 24A and 24B are cross-sectional views illustrating a structural example of a transistor.
Figure 24B:
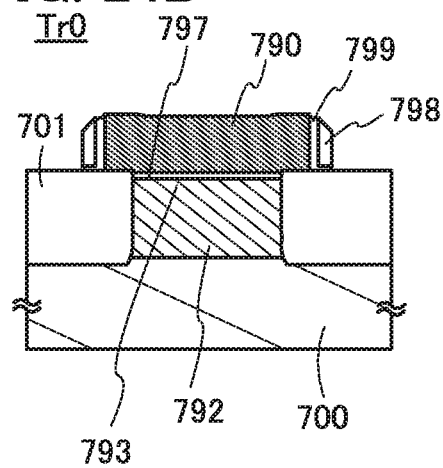

Note that the transistor M0 is not limited to the FIN-type transistor, and may be a planar-type transistor illustrated in FIGS. 24A and 24B. FIG. 24A is a cross-sectional view of the transistor M0 in the channel length direction, and FIG. 24B is a cross-sectional view of the transistor M0 in the channel width direction. Components in FIGS. 24A and 24B are denoted by the same reference numerals as the components in FIGS. 23A and 23B.

The description of FIGS. 22A and 22B will be continued below. The description of the insulating film 401 in Embodiment 2 can be referred to for the insulating film 702. The description of the insulating film 402 in Embodiment 2 can be referred to for the insulating film 703.

In FIGS. 22A and 22B, the insulating films 704 and 705 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistor M0. Examples of insulators having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 730 to 735 and the plugs 710 to 717 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the conductive film is preferably formed using a low-resistance conductive material such as aluminum or copper. The conductive film is more preferably formed using a Cu—Mn alloy, in which case manganese oxide formed at the interface with an insulator containing oxygen has a function of preventing Cu diffusion.

In FIGS. 22A and 22B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

With the structure illustrated in FIGS. 22A and 22B, the area occupied by the semiconductor device 100 can be reduced, leading to a higher level of integration of the memory cells.

(Embodiment 4)
<<Imaging Element>>

Described in this embodiment is an imaging element which can be used in the broadcast system described in Embodiment 1.

<Configuration Example of Imaging Element>

Figure 25A:
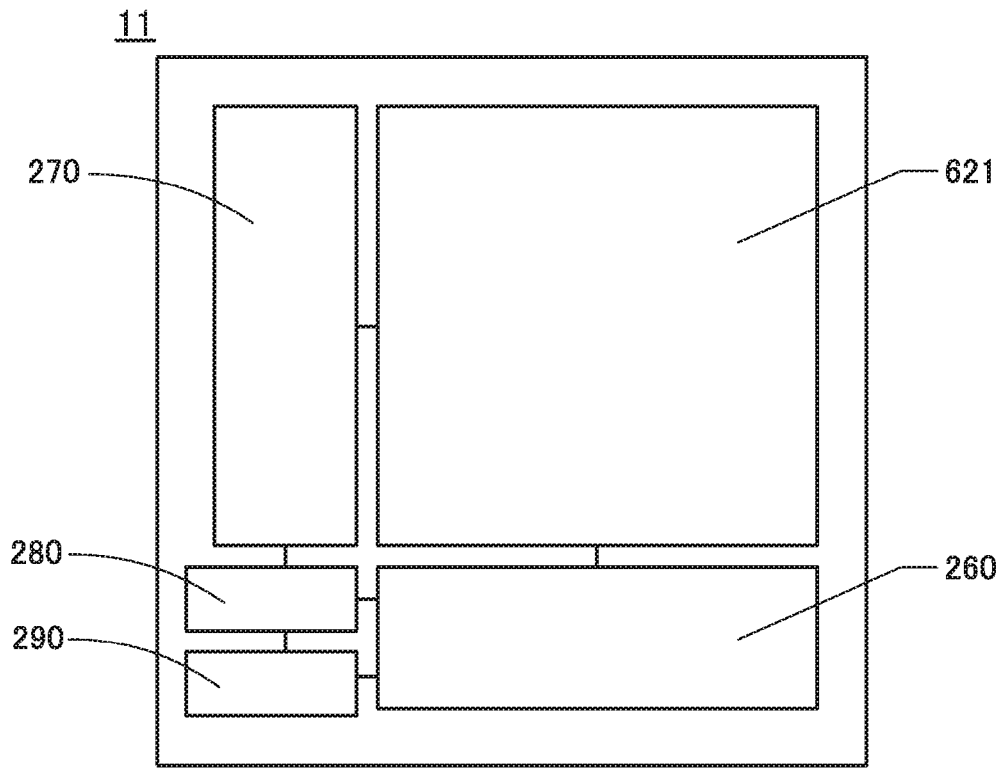
FIGS. 25A and 25B illustrate an example of an imaging device.

FIG. 25A is a plan view illustrating a configuration example of an imaging element 11. The imaging element 11 includes a pixel portion 621, a first circuit 260, a second circuit 270, a third circuit 280, and a fourth circuit 290. In this specification and the like, the first to fourth circuits 260 to 290 and the like may be referred to as "peripheral circuit" or "driver circuit." For example, the first circuit 260 can be regarded as part of the peripheral circuit.

Figure 25B:
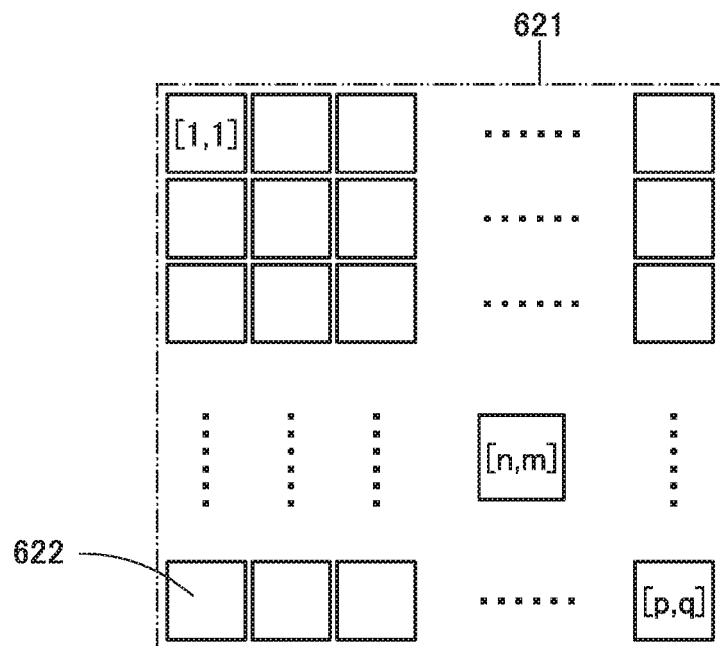

FIG. 25B illustrates a configuration example of the pixel portion 621. The pixel portion 621 includes a plurality of pixels 622 (imaging elements) arranged in a matrix with p rows and q columns (p and q are each a natural number of greater than or equal to 2). Note that in FIG. 25B, n is a natural number of greater than or equal to 1 and smaller than or equal to p, and m is a natural number of greater than or equal to 1 and smaller than or equal to q.

For example, using the pixels 622 arranged in a 1920× 1080 matrix, the imaging element 11 can take an image with "full high definition" (also referred to as "2K resolution," "2K1K," "2K," and the like). Using the pixels 622 arranged in a 3840×2160 (or 4096×2160) matrix, the imaging element 11 can take an image with "ultra high definition" (also referred to as "4K resolution," "4K2K," "4K," and the like). Using the pixels 622 arranged in a 7680×4320 (or 8192× 4320) matrix, the imaging element 11 can take an image with "super high definition" (also referred to as "8K resolution," "8K4K," "8K," and the like). Using a larger number of pixels 622, the imaging element 11 can take an image with 16K or 32K resolution.

The first circuit 260 and the second circuit 270 are connected to the plurality of pixels 622 and have a function of supplying signals for driving the plurality of pixels 622. The first circuit 260 may have a function of processing an analog signal output from the pixels 622. The third circuit 280 may have a function of controlling the operation timing of the peripheral circuit. For example, the third circuit 280 may have a function of generating a clock signal. Furthermore, the third circuit 280 may have a function of converting the frequency of a clock signal supplied from the outside. Moreover, the third circuit 280 may have a function of supplying a reference potential signal (e.g., a ramp wave signal).

The peripheral circuit includes at least one of a logic circuit, a switch, a buffer, an amplifier circuit, and a converter circuit. Transistors or the like included in the peripheral circuit may be formed using part of a semiconductor that is formed to fabricate a pixel driver circuit 610 described later. A semiconductor device such as an IC chip may be used as part or the whole of the peripheral circuit.

Note that in the peripheral circuit, at least one of the first to fourth circuits 260 to 290 may be omitted. For example, when one of the first circuit 260 and the fourth circuit 290 additionally has a function of the other of the first circuit 260 and the fourth circuit 290, the other of the first circuit 260 and the fourth circuit 290 may be omitted. As another example, when one of the second circuit 270 and the third circuit 280 additionally has a function of the other of the second circuit 270 and the third circuit 280, the other of the second circuit 270 and the third circuit 280 may be omitted. As another example, a function of another peripheral circuit may be added to one of the first to fourth circuits 260 to 290 to omit that peripheral circuit.

Figure 26:
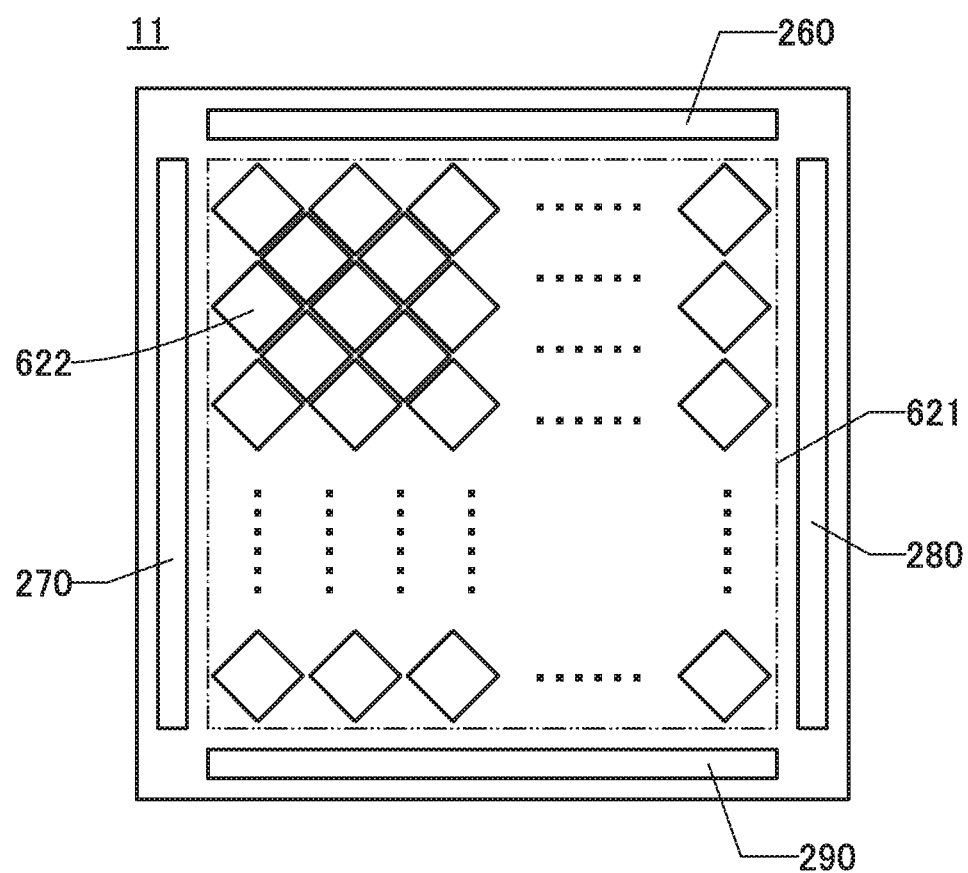
FIG. 26 illustrates an example of an imaging device.

As illustrated in FIG. 26, the first to fourth circuits 260 to 290 may be provided along the periphery of the pixel portion 621. In the pixel portion 621 included in the imaging element 11, the pixels 622 may be obliquely arranged. When the pixels 622 are obliquely arranged, the distance between pixels (pitch) can be shortened in the row direction and the column direction. Accordingly, the quality of an image taken with the imaging element 11 can be improved.

The pixel portion 621 may be provided over the first to fourth circuits 260 to 290 to overlap with the first to fourth circuits 260 to 290. The provision of the pixel portion 621 over the first to fourth circuits 260 to 290 to overlap with the first to fourth circuits 260 to 290 can increase the area occupied by the pixel portion 621 in the imaging element 11. Accordingly, the light sensitivity, the dynamic range, the resolution, the reproducibility of a taken image, or the integration degree of the imaging element 11 can be increased.

<Color Filter and the Like>

The pixels 622 included in the imaging element 11 are used as subpixels, and the plurality of pixels 622 are provided with filters (color filters) that transmit light in respective different wavelength ranges, whereby data for color image display can be obtained.

Figure 27A:
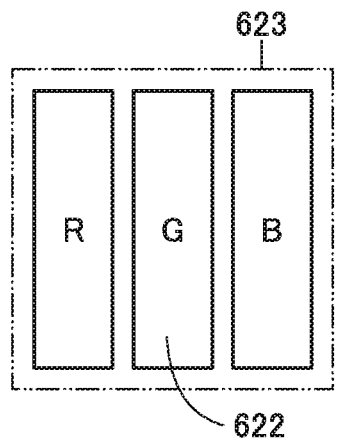
FIGS. 27A to 27D each illustrate a configuration example of a pixel.

FIG. 27A is a plan view illustrating an example of a pixel 623 with which a color image is obtained. FIG. 27A illustrates the pixel 622 provided with a color filter that transmits light in a red (R) wavelength range (hereinafter also referred to as a pixel 622R), the pixel 622 provided with a color filter that transmits light in a green (G) wavelength range (hereinafter also referred to as a pixel 622G), and the pixel 622 provided with a color filter that transmits light in a blue (B) wavelength range (also referred to as a pixel 622B). The pixel 622R, the pixel 622G, and the pixel 622B collectively function as one pixel 623.

The color filters used for the pixel 623 are not limited to those for red (R), green (G), and blue (B), and color filters that transmit cyan (C), yellow (Y), and magenta (M) light may also be used. The pixels 622 that sense light in at least three different wavelength ranges are provided in one pixel 623, whereby a full-color image can be obtained.

Figure 27B:
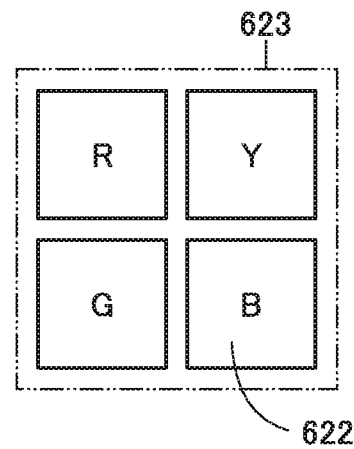
Figure 27C:
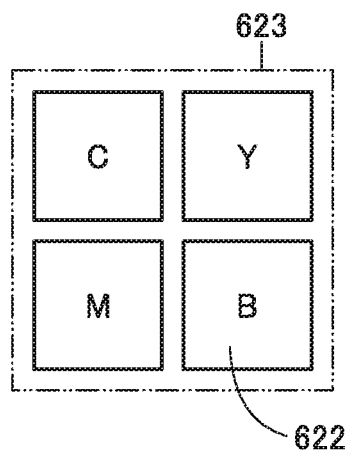

FIG. 27B illustrates the pixel 623 including the pixel 622 provided with a color filter that transmits yellow (Y) light, in addition to the pixels 622 provided with the color filters that transmit red (R), green (G), and blue (B) light. FIG. 27C illustrates the pixel 623 including the pixel 622 provided with the color filter that transmits blue (B) light, in addition to the pixels 622 provided with the color filters that transmit cyan (C), yellow (Y), and magenta (M) light. When the pixels 622 that sense light in four or more different wavelength ranges are provided in one pixel 623, the color reproducibility of an obtained image can be further increased.

Figure 27D:
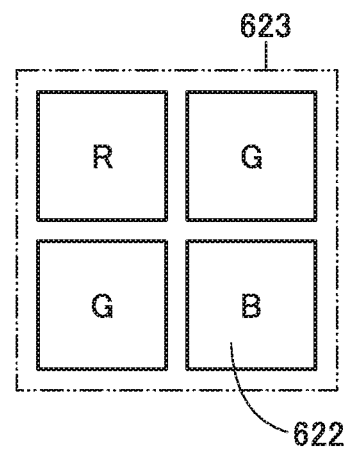

The pixel number ratio (or the ratio of light-receiving area) of the pixel 622R to the pixel 622G and the pixel 622B need not necessarily be 1:1:1. The pixel number ratio (the ratio of light-receiving area) of red to green and blue may be 1:2:1 (Bayer arrangement), as illustrated in FIG. 27D. Alternatively, the pixel number ratio (the ratio of light-receiving area) of red to green and blue may be 1:6:1.

Although the number of pixels 622 used in the pixel 623 may be one, two or more is preferable. For example, when the number of pixels 622 that sense light in the same wavelength range is two or more, the redundancy can be increased, and the reliability of the imaging element 11 can be increased.

When an infrared (IR) filter that transmits infrared light and absorbs or reflects light with a wavelength shorter than or equal to that of visible light is used as the filter, the imaging element 11 can sense infrared light. When an ultraviolet (UV) filter that transmits ultraviolet light and absorbs or reflects light with a wavelength longer than or equal to that of visible light is used as the filter, the imaging element 11 can sense ultraviolet light. When a scintillator that converts a radiant ray into ultraviolet light or visible light is used as the filter, the imaging element 11 can also function as a radiation detector that senses an X-ray or a γ-ray.

When a neutral density (ND) filter (dark filter) is used as the filter, output saturation, which occurs when a large amount of light is incident on a photoelectric conversion element (light-receiving element), can be prevented. With a combination of ND filters with different dimming capabilities, the dynamic range of the imaging element can be increased.

Figure 28A:
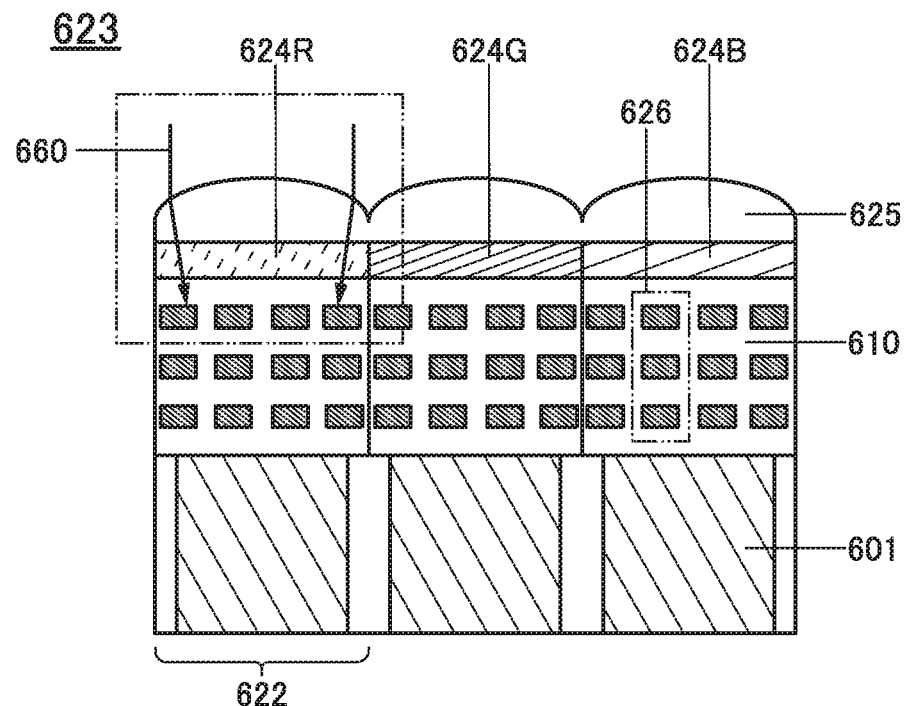
FIGS. 28A and 28B are cross-sectional views each illustrating a structural example of a pixel.

Besides the above-described filter, the pixel 622 may be provided with a lens. An arrangement example of the pixel 622, a filter 624, and a lens 625 is described with reference to cross-sectional views in FIGS. 28A and 28B. With the lens 625, incident light can be efficiently received by a photoelectric conversion element. Specifically, as illustrated in FIG. 28A, light 660 can enter a photoelectric conversion element 601 through the lens 625, the filter 624 (a filter 624R, a filter 624G, and a filter 624B), a pixel driver circuit 610, and the like which are formed in the pixel 622.

Figure 28B:
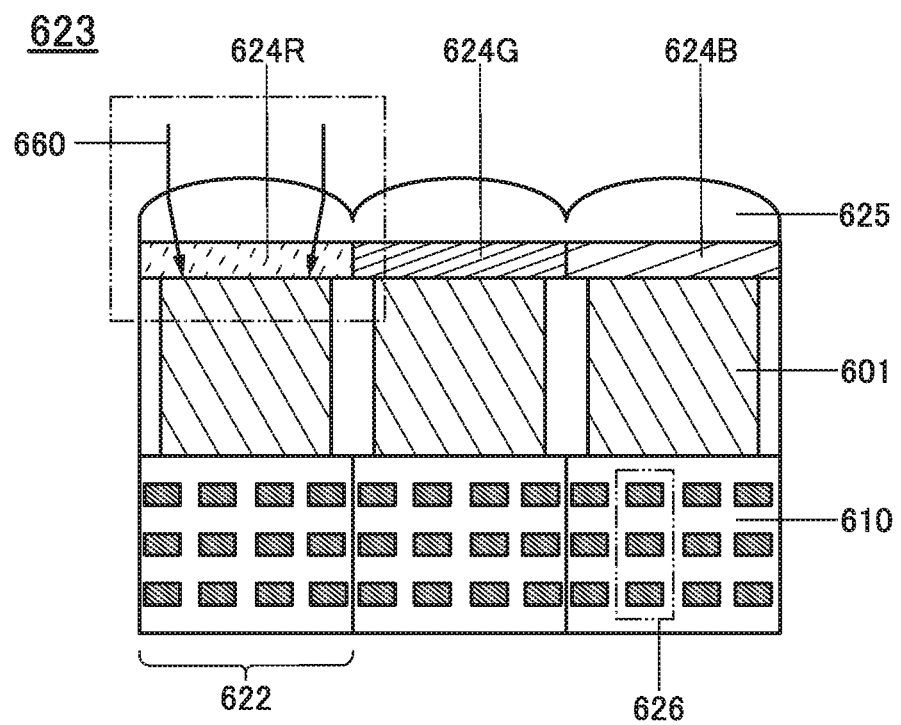

However, as illustrated in a region surrounded by a two-dot chain line, part of the light 660 indicated by arrows may be blocked by part of a wiring group 626, a transistor, a capacitor, and/or the like. Therefore, as illustrated in FIG. 28B, the lens 625 and the filter 624 may be formed on the photoelectric conversion element 601 side, so that the incident light can be efficiently received by the photoelectric conversion element 601. When the light 660 is incident from the photoelectric conversion element 601 side, the imaging element 11 can have high light sensitivity.

Figure 29A:
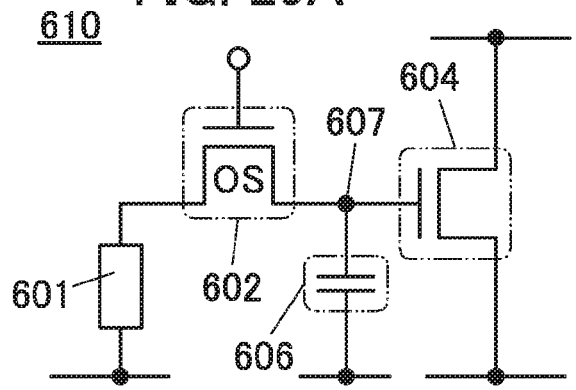
FIGS. 29A to 29C are circuit diagrams each illustrating an example of an imaging device.
Figure 29B:
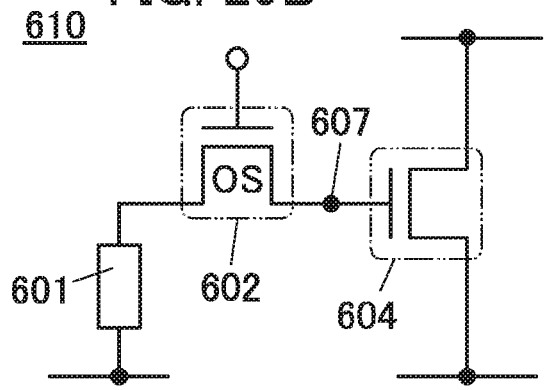
Figure 29C:
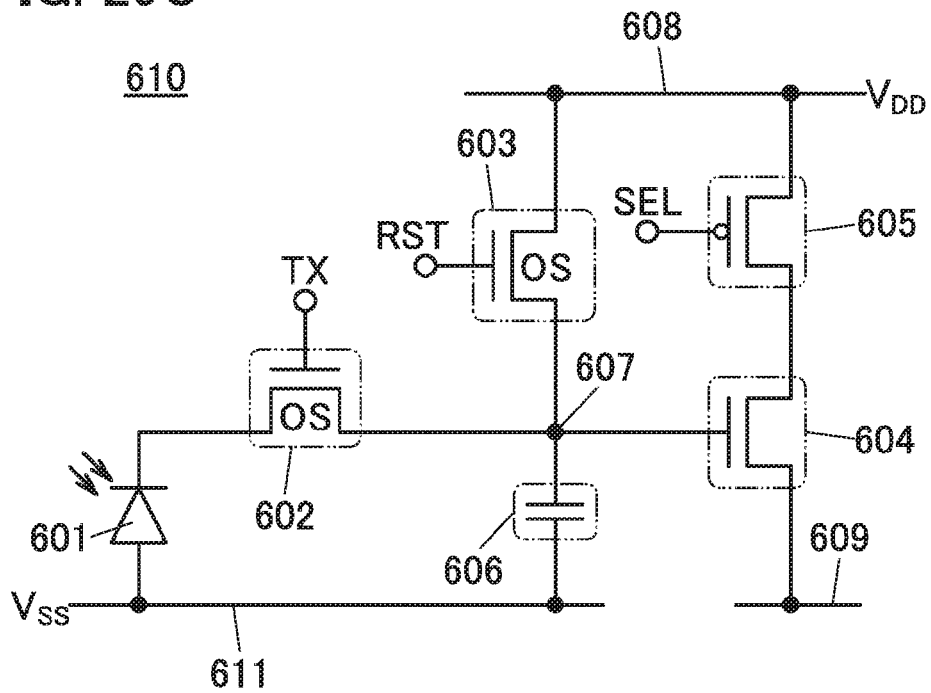

FIGS. 29A to 29C illustrate examples of the pixel driver circuit 610 that can be used for the pixel portion 621. The pixel driver circuit 610 in FIG. 29A includes a transistor 602, a transistor 604, and a capacitor 606 and is connected to the photoelectric conversion element 601. One of a source and a drain of the transistor 602 is electrically connected to the photoelectric conversion element 601, and the other of the source and the drain of the transistor 602 is electrically connected to a gate of the transistor 604 through a node 607 (a charge accumulation portion).

An OS transistor is preferably used as the transistor 602. Since the off-state current of the OS transistor can be extremely low, the capacitor 606 can be small. Alternatively, the capacitor 606 can be omitted as illustrated in FIG. 29B. Furthermore, when the transistor 602 is an OS transistor, the potential of the node 607 is less likely to change. Thus, an imaging element which is less likely to be affected by noise can be provided. Note that the transistor 604 may be an OS transistor.

A diode element formed using a silicon substrate with a PN junction or a PIN junction can be used as the photoelectric conversion element 601. Alternatively, a PIN diode element formed using an amorphous silicon film, a microcrystalline silicon film, or the like may be used. Alternatively, a diode-connected transistor may be used. Alternatively, a variable resistor or the like utilizing a photoelectric effect may be formed using silicon, germanium, selenium, or the like.

The photoelectric conversion element may be formed using a material capable of generating charge by absorbing radiation. Examples of the material capable of generating charge by absorbing radiation include lead iodide, mercury iodide, gallium arsenide, CdTe, and CdZn.

The pixel driver circuit 610 in FIG. 29C includes the transistor 602, a transistor 603, the transistor 604, a transistor 605, and the capacitor 606 and is connected to the photoelectric conversion element 601. In the pixel driver circuit 610 in FIG. 29C, a photodiode is used as the photoelectric conversion element 601. One of a source and a drain of the transistor 602 is electrically connected to a cathode of the photoelectric conversion element 601, and the other of the source and the drain of the transistor 602 is electrically connected to the node 607. An anode of the photoelectric conversion element 601 is electrically connected to a wiring 611. One of a source and a drain of the transistor 603 is electrically connected to the node 607, and the other of the source and the drain of the transistor 603 is electrically connected to a wiring 608. A gate of the transistor 604 is electrically connected to the node 607, one of a source and a drain of the transistor 604 is electrically connected to a wiring 609, and the other of the source and the drain of the transistor 604 is electrically connected to one of a source and a drain of the transistor 605. The other of the source and the drain of the transistor 605 is electrically connected to the wiring 608. One electrode of the capacitor 606 is electrically connected to the node 607, and the other electrode of the capacitor 606 is electrically connected to the wiring 611.

The transistor 602 can function as a transfer transistor. A gate of the transistor 602 is supplied with a transfer signal TX. The transistor 603 can function as a reset transistor. A gate of the transistor 603 is supplied with a reset signal RST. The transistor 604 can function as an amplifier transistor. The transistor 605 can function as a selection transistor. A gate of the transistor 605 is supplied with a selection signal SEL. Moreover, $V_{DD}$ is supplied to the wiring 608, and $V_{SS}$ is supplied to the wiring 611.

Next, the operation of the pixel driver circuit 610 in FIG. 29C will be described. First, the transistor 603 is turned on, so that VDD is supplied to the node 607 (reset operation). Then, the transistor 603 is turned off, so that VDD is held in the node 607. Next, the transistor 602 is turned on, so that the potential of the node 607 is changed in accordance with the amount of light received by the photoelectric conversion element 601 (accumulation operation). After that, the transistor 602 is turned off, so that the potential of the node 607 is held. Then, the transistor 605 is turned on, so that a potential corresponding to the potential of the node 607 is output to the wiring 609 (selection operation). By measuring the potential of the wiring 609, the amount of light received by the photoelectric conversion element 601 can be determined.

An OS transistor is preferably used as each of the transistors 602 and 603. Since the off-state current of the OS transistor can be extremely low as described above, the capacitor 606 can be small or omitted. Furthermore, when the transistors 602 and 603 are OS transistors, the potential of the node 607 is less likely to change. Thus, an imaging element which is less likely to be affected by noise can be provided.

A high-resolution imaging element can be obtained when the pixels 622 including the pixel driver circuits 610 in any of FIGS. 29A to 29C are arranged in a matrix.

For example, using the image driver circuits 610 arranged in a 1920×1080 matrix, an imaging element can take an image with "full high definition." Using the image driver circuits 610 arranged in a 3840×2160 (or 4096×2160) matrix, an imaging element can take an image with "ultra high definition.". Using the pixel driver circuits 610 arranged in a 7680×4320 (or 8192×4320) matrix, an imaging element can take an image with "super high definition.". Using a larger number of pixel driver circuits 610, an imaging element can take an image with 16K or 32K resolution.

(Embodiment 5)
<<Display Device>>

Described in this embodiment is a display device which can be used in the broadcast system described in Embodiment 1.

The display device includes at least one of, for example, an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), a quantum dot, and the like.

Other than above, the display device may include a display medium whose contrast, luminance, reflectance, transmittance, or the like is changed by an electric or magnetic effect. For example, the display device may be a plasma display panel (PDP).

Examples of display devices including an EL element include an EL display. Examples of display devices including an electron emitter include a field emission display (FED) and an SED-type flat panel display (SED: surface-conduction electron-emitter display).

Examples of display devices containing quantum dots in each pixel include a quantum dot display. Note that quantum dots may be provided not as display elements but as part of a backlight used for a liquid crystal display device or the like. The use of quantum dots enables display with high color purity.

Examples of display devices including a liquid crystal element include a liquid crystal display device (e.g., a transmissive liquid crystal display, a transflective liquid crystal display, a reflective liquid crystal display, a direct-view liquid crystal display, or a projection liquid crystal display).

In the case of a transflective liquid crystal display or a reflective liquid crystal display, some of or all of pixel electrodes may serve as reflective electrodes. For example, some or all of pixel electrodes may contain aluminum, silver, or the like. In such a case, a memory circuit such as an SRAM can be provided under the reflective electrodes, leading to lower power consumption.

Examples of display devices including electronic ink, Electronic Liquid Powder (registered trademark), or an electrophoretic element include electronic paper.

Note that in the case of using an LED chip for a display element or the like, graphene or graphite may be provided under an electrode or a nitride semiconductor of the LED chip. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method.

In the case of a display element including MEMS, a drying agent may be provided in a space where the display element is sealed (or between an element substrate over which the display element is placed and a counter substrate opposed to the element substrate, for example). Providing a drying agent can prevent MEMS and the like from becoming difficult to move or deteriorating easily because of moisture or the like.

<Example of Pixel Circuit Configuration>

Figure 30A:
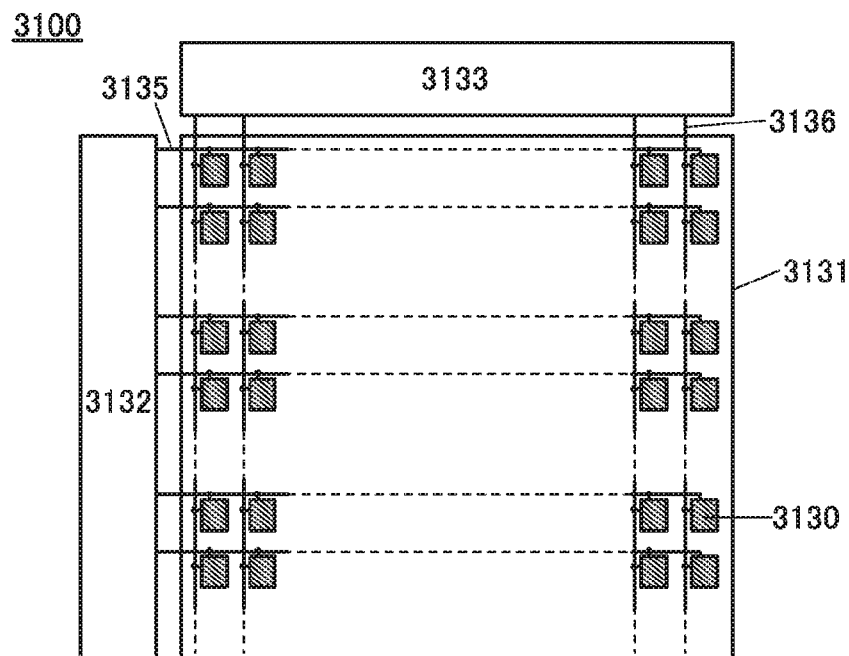
FIGS. 30A to 30C are a block diagram and circuit diagrams illustrating examples of display devices.

Next, an example of a specific configuration of the display device is described with reference to FIGS. 30A to 30C. FIG. 30A is a block diagram illustrating the configuration of a display device 3100. The display device 3100 includes a display area 3131, a circuit 3132, and a circuit 3133. The circuit 3132 functions as a scan line driver circuit, for example, and the circuit 3133 functions as a signal line driver circuit, for example.

The display device 3100 includes m scan lines 3135 which are arranged parallel or substantially parallel to each other and whose potentials are controlled by the circuit 3132, and n signal lines 3136 which are arranged parallel or substantially parallel to each other and whose potentials are controlled by the circuit 3133. The display area 3131 includes a plurality of pixels 3130 arranged in a matrix of m rows by n columns. Note that m and n are each an integer of 2 or more.

Each of the scan lines 3135 is electrically connected to the n pixels 3130 in the corresponding row among the pixels 3130 in the display area 3131. Each of the signal lines 3136 is electrically connected to the m pixels 3130 in the corresponding column among the pixels 3130.

Figure 31A:
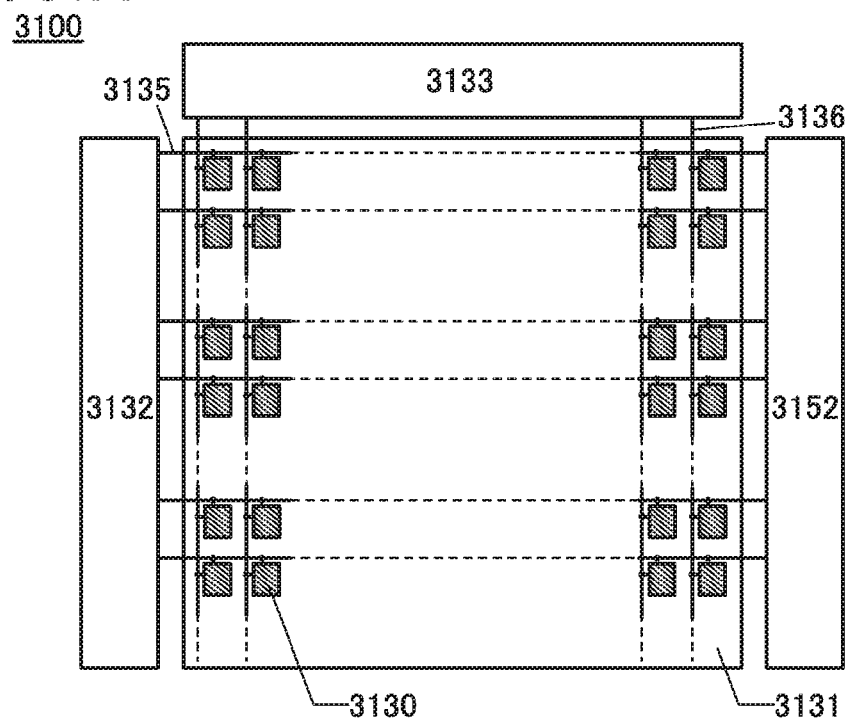
FIGS. 31A and 31B are block diagrams each illustrating an example of a display device.
Figure 31B:
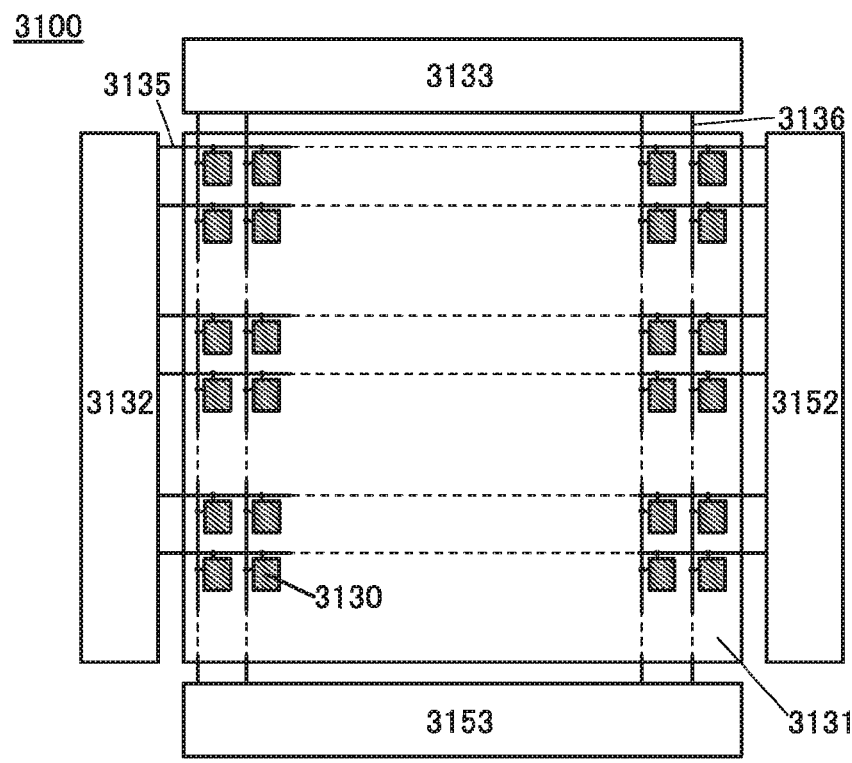

As illustrated in FIG. 31A, a circuit 3152 may be provided on the opposite side of the display area 3131 from the circuit 3132. Furthermore, as illustrated in FIG. 31B, a circuit 3153 may be provided on the opposite side of the display area 3131 from the circuit 3133. In each example of FIGS. 31A and 31B, like the circuit 3132, the circuit 3152 is connected to the scan lines 3135. Note that the present invention is not limited to these configurations. For example, the scan lines 3135 may be connected alternately to the circuit 3132 and the circuit 3152 every several rows. In the example of FIG. 31B, like the circuit 3133, the circuit 3153 is connected to the signal lines 3136. Note that the present invention is not limited to this configuration. For example, the signal lines 3136 may be connected alternately to the circuit 3133 and the circuit 3153 every several rows. The circuits 3132, 3133, 3152, and 3153 may have a function other than the function of driving the pixels 3130.

In some cases, the circuits 3132, 3133, 3152, and 3153 may be collectively called a driver circuit portion. The pixel 3130 includes a pixel circuit 3137 and a display element. The pixel circuit 3137 is a circuit that drives the display element. A transistor included in the driver circuit portion and a transistor included in the pixel circuit 3137 can be formed at the same time. Part of the driver circuit portion or the entire driver circuit portion may be formed over another substrate and electrically connected to the display device 3100. For example, part of the driver circuit portion or the entire driver circuit portion may be formed using a single crystal substrate and electrically connected to the display device 3100.

Figure 30B:
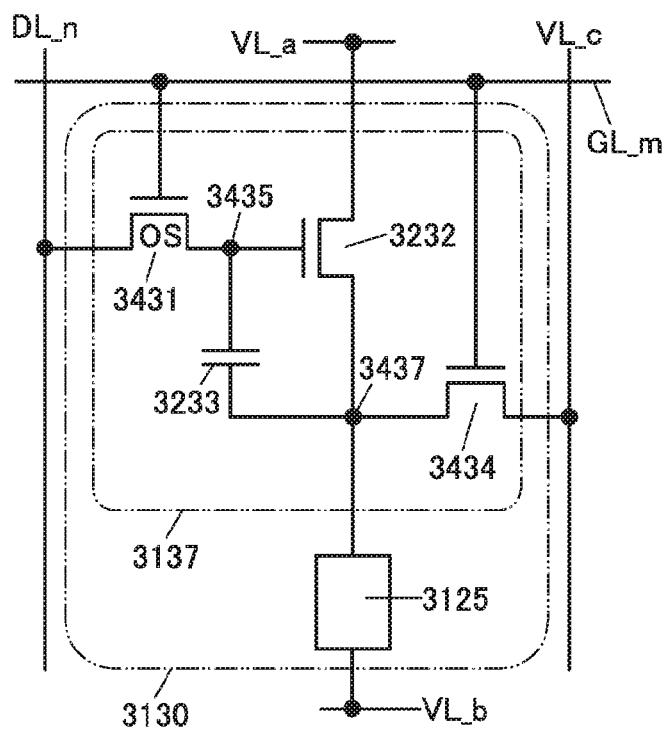
Figure 30C:
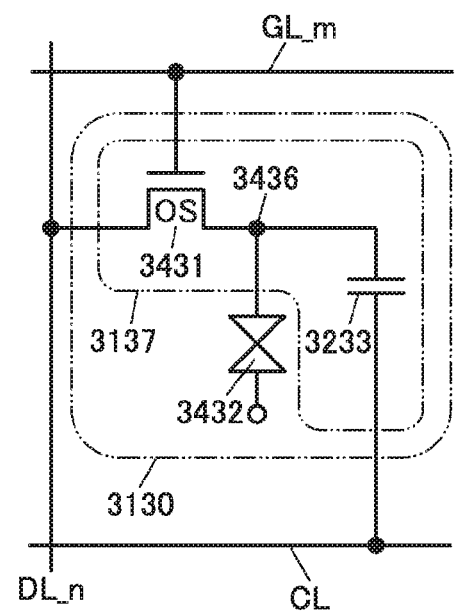

FIGS. 30B and 30C illustrate circuit configurations that can be used for the pixels 3130 in the display device 3100.

<Example of Pixel Circuit for Light-Emitting Display Device>

FIG. 30B illustrates an example of a pixel circuit that can be used for a light-emitting display device. The pixel circuit 3137 illustrated in FIG. 30B includes a transistor 3431, a capacitor 3233, a transistor 3232, and a transistor 3434. The pixel circuit 3137 is electrically connected to a light-emitting element 3125 that can function as a display element.

One of a source electrode and a drain electrode of the transistor 3431 is electrically connected to the signal line 3136 in the n-th column to which a data signal is supplied (hereinafter referred to as a signal line DL_n). A gate electrode of the transistor 3431 is electrically connected to the scan line 3135 in the m-th row to which a gate signal is supplied (hereinafter referred to as a scan line GL_m).

The transistor 3431 has a function of controlling whether to write a data signal to a node 3435.

One of a pair of electrodes of the capacitor 3233 is electrically connected to the node 3435, and the other is electrically connected to a node 3437. The other of the source electrode and the drain electrode of the transistor 3431 is electrically connected to the node 3435.

The capacitor 3233 functions as a storage capacitor for storing data written to the node 3435.

One of a source electrode and a drain electrode of the transistor 3232 is electrically connected to a potential supply line VL_a, and the other is electrically connected to the node 3437. A gate electrode of the transistor 3232 is electrically connected to the node 3435.

One of a source electrode and a drain electrode of the transistor 3434 is electrically connected to a potential supply line VL_c, and the other is electrically connected to the node 3437. A gate electrode of the transistor 3434 is electrically connected to the scan line GL_m.

One of an anode and a cathode of the light-emitting element 3125 is electrically connected to a potential supply line VL_b, and the other is electrically connected to the node 3437.

As the light-emitting element 3125, an organic electroluminescent element (also referred to as an organic EL element) or the like can be used, for example. Note that the light-emitting element 3125 is not limited to organic EL elements; an inorganic EL element including an inorganic material can be used.

For example, the potential supply line VL_a has a function of supplying $V_{DD}$. The potential supply line VL_b has a function of supplying $V_{SS}$. The potential supply line VL_c has a function of supplying $V_{SS}$.

An operation example of a display device including the pixel circuit 3137 illustrated in FIG. 30B is described here. First, the circuit 3132 sequentially selects the pixel circuits 3137 row by row. In each of the pixel circuits 3137, the transistor 3431 is turned on so that a data signal (potential) is written to the node 3435. Next, the transistor 3434 is turned on, and the potential of the node 3437 is set to $V_{SS}$.

Then, the transistor 3431 is turned off and the data signal written to the node 3435 is retained. Next, the transistor 3434 is turned off. The amount of current flowing between the source and the drain of the transistor 3232 is determined by the data signal written to the node 3435. Thus, the light-emitting element 3125 emits light with a luminance corresponding to the amount of flowing current. This operation is sequentially performed row by row; thus, an image can be displayed.

A plurality of pixels 3130 may each be used as a subpixel, and the subpixels may emit light in different wavelength ranges, so that a color image can be displayed. For example, the pixel 3130 that emits light in a red wavelength range, the pixel 3130 that emits light in a green wavelength range, and the pixel 3130 that emits light in a blue wavelength range are used as one pixel.

The combination of the wavelength ranges of light is not limited to red, green, and blue and may be cyan, yellow, and magenta. When subpixels that emit light in at least three different wavelength ranges are provided in one pixel, a color image can be displayed.

Alternatively, one or more colors of yellow, cyan, magenta, white, and the like may be added to red, green, and blue. For example, a subpixel that emits light in a yellow wavelength range may be used, in addition to red, green, and blue. Alternatively, one or more colors of red, green, blue, white, and the like may be added to cyan, yellow, and magenta. For example, a subpixel that emits light in a blue wavelength range may be used, in addition to cyan, yellow, and magenta. When subpixels that emit light in four or more different wavelength ranges are provided in one pixel, the reproducibility of colors of a displayed image can be further increased.

The pixel number ratio (or the ratio of light-emitting area) of red to green and blue used for one pixel need not necessarily be 1:1:1. For example, the pixel number ratio (the ratio of light-emitting area) of red to green and blue may be 1:1:2. Alternatively, the pixel number ratio (the ratio of light-emitting area) of red to green and blue may be 1:2:3.

A subpixel that emits white light may be combined with red, green, and blue color filters or the like to enable color display. Alternatively, a subpixel that emits light in a red wavelength range, a subpixel that emits light in a green wavelength range, and a subpixel that emits light in a blue wavelength range may be combined with a color filter that transmits light in a red wavelength range, a color filter that transmits light in a green wavelength range, and a color filter that transmits light in a blue wavelength range, respectively.

Embodiments of the present invention are not limited to a display device for color display; the present invention can also be applied to a display device for monochrome display.

<Example of Pixel Circuit for Liquid Crystal Display Device>

FIG. 30C illustrates an example of a pixel circuit that can be used for a liquid crystal display device. The pixel circuit 3137 in FIG. 30C includes the transistor 3431 and the capacitor 3233. The pixel circuit 3137 is electrically connected to a liquid crystal element 3432 that can function as a display element.

The potential of one of a pair of electrodes of the liquid crystal element 3432 is set in accordance with the specifications of the pixel circuit 3137 as appropriate. The alignment state of a liquid crystal in the liquid crystal element 3432 depends on data written to a node 3436. A common potential may be applied to one of the pair of electrodes of the liquid crystal element 3432 included in each of the plurality of pixel circuits 3137.

As examples of a mode of the liquid crystal element 3432, the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples include an electrically controlled birefringence (ECB) mode, a polymer dispersed liquid crystal (PDLC) mode, a polymer network liquid crystal (PNLC) mode, and a guest-host mode. Note that the present invention is not limited to these modes, and various modes can be used.

In the pixel circuit 3137 in the m-th row and the n-th column, one of the source electrode and the drain electrode of the transistor 3431 is electrically connected to the signal line DL_n, and the other is electrically connected to the node 3436. The gate electrode of the transistor 3431 is electrically connected to the scan line GL_m. The transistor 3431 has a function of controlling whether to write a data signal to the node 3436.

One of the pair of electrodes of the capacitor 3233 is electrically connected to a wiring to which a particular potential is supplied (hereinafter also referred to as a "capacitor line CL"), and the other is electrically connected to the node 3436. The other of the pair of electrodes of the liquid crystal element 3432 is electrically connected to the node 3436. The potential of the capacitor line CL is set in accordance with the specifications of the pixel circuit 3137 as appropriate. The capacitor 3233 functions as a storage capacitor for storing data written to the node 3436.

An operation example of a display device including the pixel circuit 3137 illustrated in FIG. 30C is described here. First, the circuit 3132 sequentially selects the pixel circuits 3137 row by row. In each of the pixel circuits 3137, the transistor 3431 is turned on so that a data signal is written to the node 3436.

Then, the transistor 3431 is turned off and the data signal written to the node 3436 is retained. The amount of light transmitted through the liquid crystal element 3432 is determined in accordance with the data signal written to the node 3436. This operation is sequentially performed row by row; thus, an image can be displayed on the display area 3131.

<Structure Example of Display Device>

Some or all of driver circuits that include the transistor described in the above embodiment can be formed over a substrate where a pixel portion is formed, whereby a system-on-panel can be obtained. Structure examples of a display device to which the transistor described in the above embodiment can be used are described with reference to FIGS. 32A to 32C and FIGS. 33A and 33B.

<Liquid Crystal Display Device and Light-Emitting Display Device>

Figure 32A:
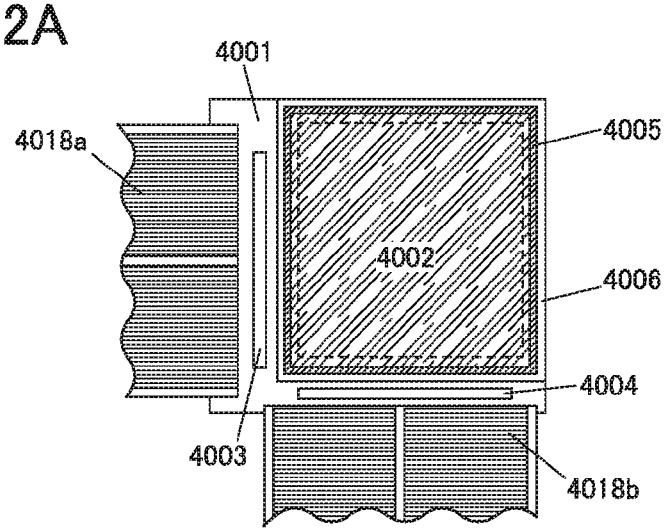
FIGS. 32A to 32C are top views each illustrating an example of a display device.

A display device including a liquid crystal element and a display device including a light-emitting element are described as examples of the display device. In FIG. 32A, a sealant 4005 is provided so as to surround a pixel portion 4002 provided over a first substrate 4001, and the pixel portion 4002 is sealed with a second substrate 4006. In FIG. 32A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

Figure 32B:
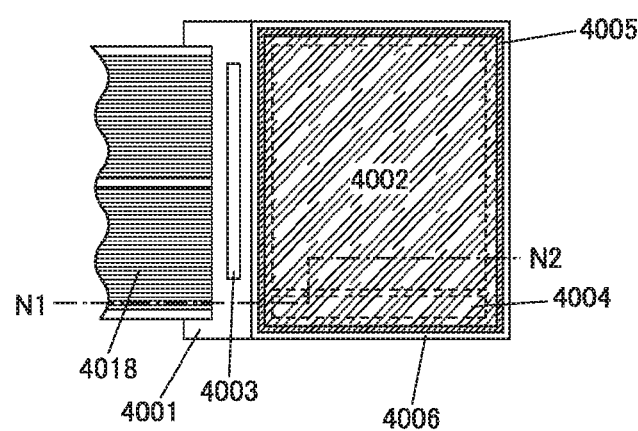
Figure 32C:
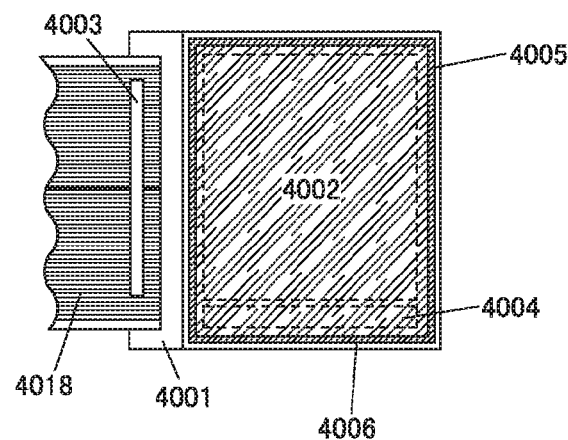

In FIGS. 32B and 32C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Hence, the pixel portion 4002 and the scan line driver circuit 4004 are sealed together with the display element, by the first substrate 4001, the sealant 4005, and the second substrate 4006. Furthermore, in FIGS. 32B and 32C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 32B and 32C, various signals and potentials are supplied to the signal line driver circuit 4003, the scan line driver circuit 4004, and the pixel portion 4002 through an FPC4018.

Although FIGS. 32B and 32C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or only part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 32A illustrates an example in which the signal line driver circuit 4003 and the scan line driver circuit 4004 are mounted by a COG. FIG. 32B illustrates an example in which the signal line driver circuit 4003 is mounted by a COG. FIG. 32C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors to which the transistor that is described in the above embodiment can be applied.

Figure 33A:
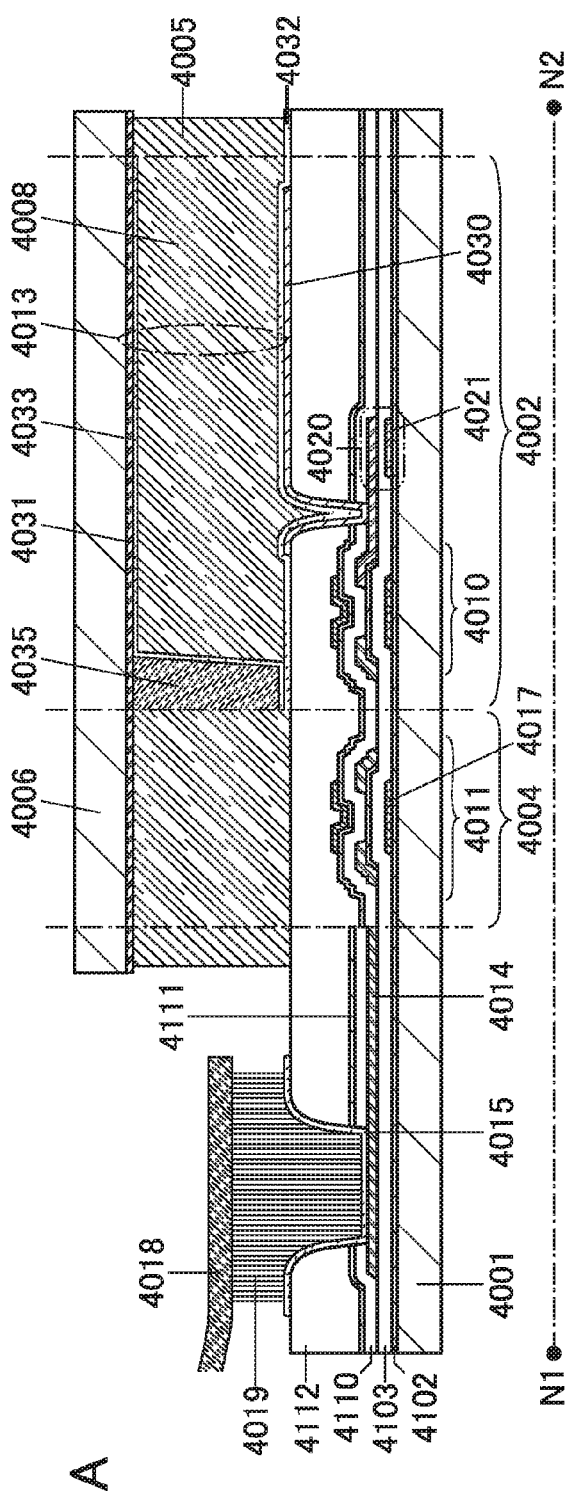
FIGS. 33A and 33B are cross-sectional views each illustrating an example of a display device.
Figure 33B:
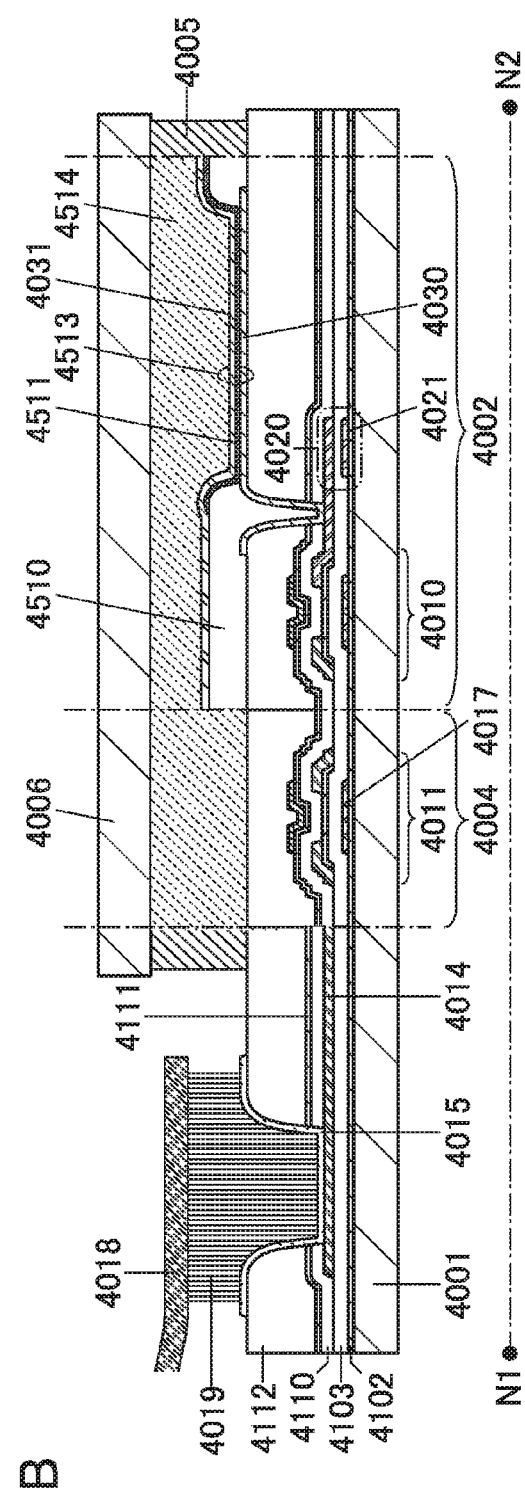

FIGS. 33A and 33B correspond to cross-sectional views taken along chain line N1-N2 in FIG. 32B. As shown in FIGS. 33A and 33B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed using the same conductive layer as a first electrode layer 4030, and the wiring 4014 is formed using the same conductive layer as source and drain electrodes of transistors 4010 and 4011.

The pixel portion 4002 and the scan line driver circuit 4004 provided over the first substrate 4001 include a plurality of transistors. In FIGS. 33A and 33B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 33A, and a bank 4510 is further provided over the insulating layer 4112 in FIG. 33B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

The transistor described in the above embodiment can be applied to the transistors 4010 and 4011. A change in the electrical characteristics of the transistor described in the above embodiment is suppressed, and thus the transistor is electrically stable. Accordingly, the display devices of this embodiment illustrated in FIGS. 33A and 33B can be highly reliable display devices.

FIGS. 33A and 33B illustrate the case where a transistor having a structure similar to that of the transistor 480 illustrated in FIGS. 21A and 21B is used as each of the transistors 4010 and 4011. Note that a transistor which can be used as each of the transistors 4010 and 4011 is not limited thereto. For example, a single crystal silicon transistor, a polycrystalline silicon transistor, an amorphous silicon transistor, an organic semiconductor transistor, or the like may be used as each of the transistors 4010 and 4011.

The display devices illustrated in FIGS. 33A and 33B each include a capacitor 4020. The capacitor 4020 includes a region where part of the source electrode or part of the drain electrode of the transistor 4010 overlaps with an electrode 4021 with the insulating layer 4103 interposed therebetween. The electrode 4021 is formed using the same conductive layer as the electrode 4017.

In general, the capacitance of a capacitor provided in a display device is set in consideration of leakage current or the like of transistors provided in a pixel portion so that charge can be held for a predetermined period. The capacitance of the capacitor may be set considering off-state current of the transistor or the like.

For example, when an OS transistor is used in a pixel portion of a liquid crystal display device, the capacitance of the capacitor can be one-third or less, or one-fifth or less, of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 33A. In FIG. 33A, a liquid crystal element 4013 that is the display element includes the first electrode layer 4030, a second electrode layer 4031, and a liquid crystal layer 4008. Insulating layers

4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes the liquid crystal exhibiting a blue phase and the chiral material has a short response time of 1 msec or less and is optically isotropic; therefore, alignment treatment is not necessary and viewing angle dependence is small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be increased.

Moreover, it is possible to use a method called domain multiplication or multi-domain design, in which a pixel is divided into some regions (subpixels) and molecules are aligned in different directions in their respective regions.

The specific resistance of the liquid crystal material is higher than or equal to $1 \times 10^9$ $\Omega \cdot cm$, preferably higher than or equal to $1 \times 10^{11}$ $\Omega \cdot cm$, further preferably higher than or equal to $1 \times 10^{12}$ $\Omega \cdot cm$. Note that the specific resistance in this specification is measured at 20° C.

In the OS transistor used in this embodiment, the current in an off state (the off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption.

In the OS transistor, relatively high field-effect mobility can be obtained, whereby high-speed operation is possible. Consequently, when the above transistor is used in a pixel portion of a display device, high-quality images can be obtained. Since a driver circuit portion and the pixel portion can be formed over one substrate with the use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be applied with a polarizing substrate and a retardation substrate. In addition, a backlight, a side light, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (i.e., electrons and holes) are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 33B illustrates an example of a light-emitting display device (also referred to as an "EL display device") using a light-emitting element as a display element. A light-emitting element 4513 that is the display element is electrically connected to the transistor 4010 in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The bank 4510 can be formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 consists of either a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space that is sealed by the first substrate 4001, the second substrate 4006, and the sealant 4005, a filler 4514 is provided. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission side of the light-emitting element. Furthermore, the polarizing plate or the circularly polarizing plate may be provided with an anti-reflection film. For example, anti-glare treatment by which reflected light can be diffused by unevenness of the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof and a nitride thereof A conductive composition containing a conductive high molecule (also called a conductive polymer) can also be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

FIG. 34A illustrates a cross-sectional view in which top-gate transistors are provided as the transistors 4011 and 4010 illustrated in FIG. 33A. Similarly, FIG. 34B illustrates a cross-sectional view in which top-gate transistors are provided as the transistors 4011 and 4010 illustrated in FIG. 33B.

In each of the transistors 4010 and 4011 in FIGS. 34A and 34B, the electrode 4017 functions as a gate electrode. The wiring 4014 functions as a source electrode or a drain electrode. The insulating layer 4103 functions as a gate insulating film.

In FIGS. 34A and 34B, each of the transistors 4010 and 4011 includes a semiconductor layer 4012. Single crystal silicon, polycrystalline silicon, amorphous silicon, an oxide semiconductor, an organic semiconductor, or the like may be used for the semiconductor layer 4012. If necessary, an impurity may be introduced into the semiconductor layer 4012 in order to increase the conductivity of the semiconductor layer 4012 or control the threshold voltage of the transistor.

With the use of the transistor described in the above embodiment, a highly reliable display device can be provided. With the use of the transistor described in the above embodiment, a display device that has a high resolution, a large size, and high display quality can be provided. Furthermore, a display device with low power consumption can be provided.

<Display Module>

In a display module 6000 in FIG. 35, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be included in, for example, an integrated circuit mounted on the printed circuit board 6010, and the like. The above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source. If necessary, the printed circuit board 6010 may be provided with the receiver device of one embodiment of the present invention.

The display module 6000 can be additionally provided with a member such as a polarizing plate, a retardation plate, or a prism sheet.

<Electronic Device>

Examples of electronic devices which include the above-described display device in a display portion are television devices (also referred to as TV or television receivers), monitors for computers and the like, cameras such as digital cameras and digital video cameras, digital photo frames, cellular phones (also referred to as cell phones or portable telephone devices), portable game machines, portable information terminals, audio playback devices, large game machines such as pin-ball machines, and the like. When having flexibility, the above-described electronic device can be incorporated along a curved inside/outside wall surface of a house or a building or a curved interior/exterior surface of a car. FIGS. 36A to 36F illustrate structural examples of the electronic devices.

Figure 36A:
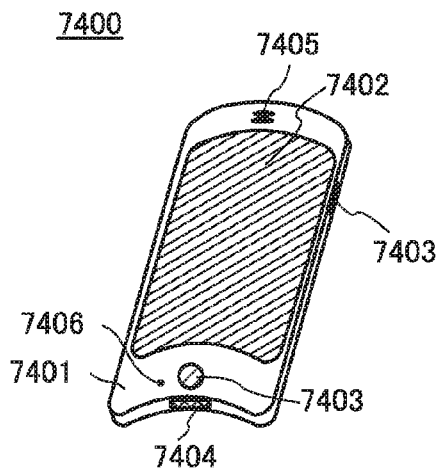
FIGS. 36A to 36F illustrate examples of electronic devices.

A cellular phone 7400 illustrated in FIG. 36A is provided with a display portion 7402 incorporated in a housing 7401, operation buttons 7403, an external connection port 7404, a speaker 7405, a microphone 7406, and the like. When the display portion 7402 of the cellular phone 7400 is touched with a finger or the like, data can be input to the cellular phone 7400. Further, operations such as making a call and inputting a character can be performed by touch on the display portion 7402 with a finger or the like. The power can be turned on or off with the operation button 7403. In addition, types of images displayed on the display portion 7402 can be switched; for example, switching images from a mail creation screen to a main menu screen is performed with the operation button 7403.

Figure 36B:
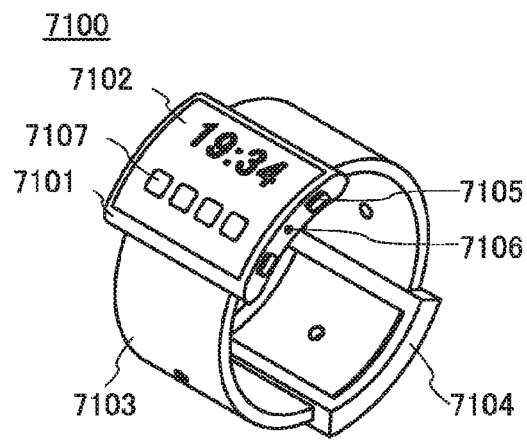

FIG. 36B illustrates an example of a watch-type portable information terminal. A portable information terminal 7100 illustrated in FIG. 36B includes a housing 7101, a display portion 7102, a band 7103, a buckle 7104, an operation button 7105, an input/output terminal 7106, and the like. The portable information terminal 7100 is capable of executing a variety of applications such as mobile phone calls, e-mailing, text viewing and editing, music reproduction, Internet communication, and computer games. The display surface of the display portion 7102 is bent, and images can be displayed on the bent display surface. Furthermore, the display portion 7102 includes a touch sensor, and operation can be performed by touching the screen with a finger, a stylus, or the like. For example, an application can be started by touching an icon 7107 displayed on the display portion 7102.

With the operation button 7105, a variety of functions such as time setting, ON/OFF of the power, ON/OFF of wireless communication, setting and cancellation of a silent mode, and setting and cancellation of a power saving mode can be performed. For example, the functions of the operation button 7105 can be set by setting the operating system incorporated in the portable information terminal 7100. The portable information terminal 7100 can employ near field communication that is a communication method based on an existing communication standard. In that case, for example, mutual communication between the portable information terminal 7100 and a headset capable of wireless communication can be performed, and thus hands-free calling is possible. Moreover, the portable information terminal 7100 includes the input/output terminal 7106, and data can be directly transmitted to and received from another information terminal via a connector. Power charging through the input/output terminal 7106 is possible. Note that the charging operation may be performed by wireless power feeding without using the input/output terminal 7106.

Figure 36C:
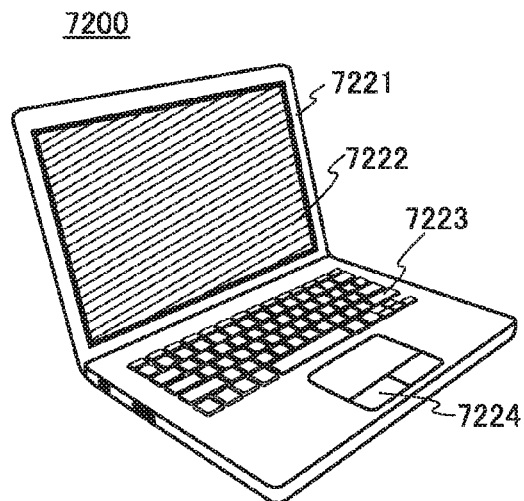

FIG. 36C illustrates a notebook personal computer (PC). A PC 7200 illustrated in FIG. 36C includes a housing 7221, a display portion 7222, a keyboard 7223, a pointing device 7224, and the like.

Figure 36D:
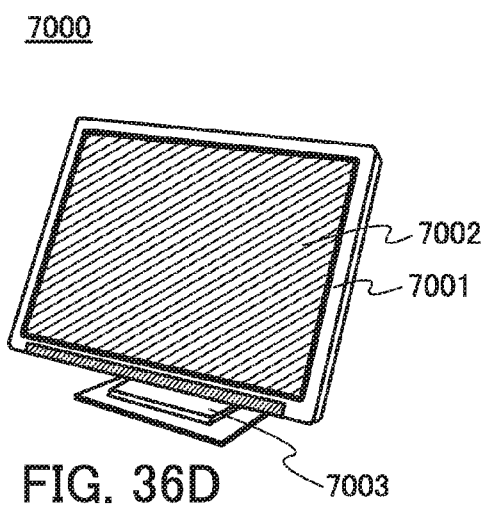

FIG. 36D illustrates a stationary display device. A display device 7000 illustrated in FIG. 36D includes a housing 7001, a display portion 7002, a supporting base 7003, and the like.

Figure 36E:
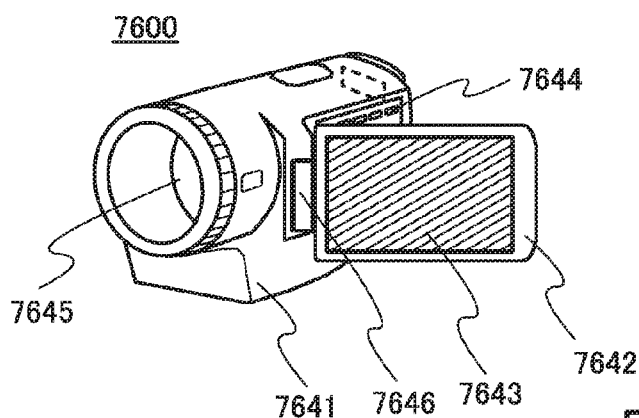

FIG. 36E illustrates a video camera 7600, which includes a first housing 7641, a second housing 7642, a display portion 7643, operation keys 7644, a lens 7645, a joint 7646, and the like.

Figure 36F:
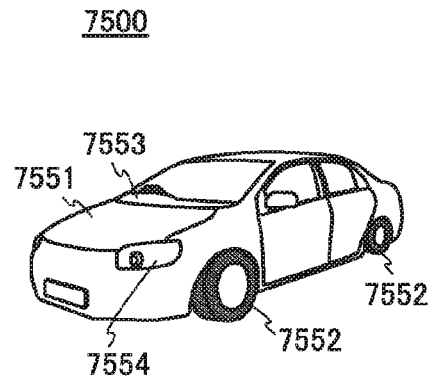

FIG. 36F illustrates a passenger car 7500, which includes a car body 7551, wheels 7552, a dashboard 7553, lights 7554, and the like.

In the case where the display portion of the above-described electronic device includes a large number of pixels represented by 4K or 8K, for example, the electronic device preferably includes the receiver device which is one embodiment of the present invention. The electronic device including the receiver device which is one embodiment of the present invention can receive and display an image at high speed with low power consumption.

(Embodiment 6)

In this embodiment, the structure of an oxide semiconductor film that can be used for the oxide semiconductor transistor described in Embodiment 3 will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified roughly into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is assigned to the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

Note that in this specification and the like, the carrier density of a substantially intrinsic oxide semiconductor film is lower than $8 \times 10^{11}/cm^3$, preferably lower than $1 \times 10^{11}/cm^3$, and further preferably lower than $1 \times 10^{10} /cm^3$ and higher than or equal to $1 \times 10^{-9}/cm^3$. With a highly purified intrinsic oxide semiconductor film, the transistor can have stable electrical characteristics.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a diffraction pattern like a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

In this specification and the like, terms for describing arrangement, such as "over" and "under," are used for convenience for describing the positional relation between components with reference to drawings. The positional relation between components is changed as appropriate in accordance with a direction in which each component is described. Thus, terms for describing arrangement are not limited to those used in this specification and can be changed to other terms as appropriate depending on the situation.

Furthermore, in a block diagram in this specification and the like, components are functionally classified and shown by blocks that are independent of each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram are not limited to those described in this specification, and can be changed to other terms as appropriate depending on the situation.

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit;

or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the order of connection in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-076627 filed with Japan Patent Office on Apr. 3, 2015, the entire contents of which are hereby incorporated by reference.

What is claimed is:

1. A transmitter device comprising:
    first to m-th memory cells (m is an integer of 2 or more);
    first to m-th word lines;
    a first bit line;
    an analog circuit; and
    a second bit line;
    wherein the i-th word line (i is an integer greater than or equal to 1 and less than or equal to m) is electrically connected to the i-th memory cell,
    wherein the first to m-th memory cells are electrically connected to the analog circuit through the first bit line,
    wherein the first to m-th memory cells are capable of retaining a potential corresponding to first data,
    wherein the first to m-th word lines are supplied with a potential corresponding to second data,
    wherein the analog circuit is capable of performing a multiply-accumulate operation on the first data and the second data,
    wherein the first data or the second data includes image data, wherein the i-th memory cell comprises:
    a capacitor;
    a first transistor; and
    a second transistor, wherein a first terminal of the capacitor is electrically connected to a gate of the first transistor, wherein a second terminal of the capacitor is electrically connected to the i-th word line, wherein the second bit line is electrically connected to the gate of the first transistor through the second transistor, wherein one of a source and a drain of the first transistor is electrically connected to the first bit line, and wherein the second transistor comprises a channel formation region comprising an oxide semiconductor.

2. The transmitter device according to claim 1, further comprising:

(m+1)-th to (m+m)-th memory cells; and a third bit line, wherein the analog circuit comprises a first circuit and a second circuit, wherein the (m+i)-th memory cell is electrically connected to the i-th word line, wherein the first circuit is electrically connected to the first bit line, wherein the second circuit is electrically connected to the (m+1)-th to (m+m)-th memory cells through the third bit line, and wherein the first circuit is electrically connected to the second circuit through a current mirror circuit.

3. A receiver device comprising:

first to m-th memory cells (m is an integer of 2 or more);

first to m-th word lines;

a first bit line;

an analog circuit; and a second bit line, wherein the i-th word line (i is an integer greater than or equal to 1 and less than or equal to m) is electrically connected to the i-th memory cell, wherein the first to m-th memory cells are electrically connected to the analog circuit through the first bit line, wherein the first to m-th memory cells are capable of retaining a potential corresponding to first data, wherein the first to m-th word lines are supplied with a potential corresponding to second data, wherein the analog circuit is capable of performing a multiply-accumulate operation on the first data and the second data, wherein the first data or the second data includes image data, wherein the i-th memory cell comprises:

a capacitor;

a first transistor; and a second transistor, wherein a first terminal of the capacitor is electrically connected to a gate of the first transistor, wherein a second terminal of the capacitor is electrically connected to the i-th word line, wherein the second bit line is electrically connected to the gate of the first transistor through the second transistor, wherein one of a source and a drain of the first transistor is electrically connected to the first bit line, and wherein the second transistor comprises a channel formation region comprising an oxide semiconductor.

4. The receiver device according to claim 3, further comprising:

(m+1)-th to (m+m)-th memory cells; and a third bit line, wherein the analog circuit comprises a first circuit and a second circuit, wherein the (m+i)-th memory cell is electrically connected to the i-th word line, wherein the first circuit is electrically connected to the first bit line, wherein the second circuit is electrically connected to the (m+1)-th to (m+m)-th memory cells through the third bit line, and wherein the first circuit is electrically connected to the second circuit through a current mirror circuit.

5. An electronic device comprising:

the receiver device according to claim 3; and a microphone, a speaker, a display portion, or an operation key.

6. A broadcast system comprising:

a camera;

the transmitter device according to claim 1;

a receiver device; and a display device, wherein the camera is capable of generating imaging data, wherein the transmitter device is capable of generating transmission data by compressing the imaging data, wherein the receiver device is capable of generating video data by decompressing the transmission data, wherein the display device is capable of displaying the video data after image processing.

7. A broadcast system comprising:

a camera;

the transmitter device;

a receiver device is the receiver device according to claim 3; and a display device, wherein the camera is capable of generating imaging data, wherein the transmitter device is capable of generating transmission data by compressing the imaging data, wherein the receiver device is capable of generating video data by decompressing the transmission data, wherein the display device is capable of displaying the video data after image processing.

* * * * *

UNITED STATES PATENT AND TRADEMARK OFFICE
CERTIFICATE OF CORRECTION

PATENT NO. : 9,716,852 B2
APPLICATION NO. : 15/083716
DATED : July 25, 2017
INVENTOR(S) : Yoshiyuki Kurokawa It is certified that error appears in the above-identified patent and that said Letters Patent is hereby corrected as shown below:

In the Specification

At Column 7, Line 8, "AID-converted" should be --A/D-converted--;

At Column 9, Line 2, "MC1[l, j]" should be --MC1[1, j]--;

At Column 12, Line 28, "$I_3[f]$" should be --$I_3[j]$--;

At Column 12, Line 40, "$I_l[i, j]$" should be --$I_1[i, j]$--;

At Column 13, Line 30, "$\Sigma(V_w[i] \times V_p[i, j])$" should be --$\Sigma_I(V_w[i] \times V_p[i, j])$--;

At Column 14, Line 22, "l represents" should be --I represents--;

At Column 14, Line 30, "WW[J+1]" should be --WW[I+1]--;

At Column 15, Line 5, "$V_{PR}$-$V_P$[I, J+1]" should be --$V_{PR}$-$V_P$[I, J+1],--;

At Column 15, Line 9, "FN1[I, J+1]" should be --FN1[I, J+1],--;

At Column 15, Line 28, "$\Sigma_t(V_w[I] \times V_P[I, J])$" should be --$\Sigma_I(V_w[I] \times V_P[I, J])$--;

At Column 19, Line 25, "element M The" should be --element M. The--;

At Column 29, Line 59, "A30-A4" should be --A3-A4--;

At Column 47, Line 42, "FPC4018." should be --FPC 4018.--;

At Column 47, Line 56, "C0G." should be --COG.--;
At Column 47, Line 58, "C0G." should be --COG.--;

Signed and Sealed this
Twenty-fourth Day of October, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,716,852 B2

At Column 52, Line 22, "thereof and" should be --thereof; and--;

At Column 52, Line 22, second occurrence, "thereof" should be --thereof.--;

In the Claims

In Claim 7, at Column 64, Line 40, "the transmitter" should be --a transmitter--;

In Claim 7, at Column 64, Line 41, "a receiver device is the receiver device according" should be --the receiver device according--.